(12) United States Patent
Tsujimoto et al.

(10) Patent No.: US 12,248,121 B2
(45) Date of Patent: Mar. 11, 2025

(54) OPTICAL FILM, AND POLARIZING PLATE, SURFACE PLATE, IMAGE DISPLAY PANEL AND IMAGE DISPLAY DEVICE USING THE OPTICAL FILM, AND METHOD FOR PRODUCING THE OPTICAL FILM, AND METHOD FOR SELECTING OPTICAL FILM, AND EVALUATION METHOD OF FINGER PRINT WIPING PROPERTY

(71) Applicant: DAI NIPPON PRINTING CO., LTD., Tokyo (JP)

(72) Inventors: Jun Tsujimoto, Bizen (JP); Yukimitsu Iwata, Okayama (JP); Michiaki Takei, Okayama (JP); Masafumi Tanaka, Misato (JP); Keisuke Ikeda, Okayama (JP); Gen Furui, Okayama (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 18/686,673

(22) PCT Filed: Sep. 25, 2023

(86) PCT No.: PCT/JP2023/034628
§ 371 (c)(1),
(2) Date: Feb. 26, 2024

(87) PCT Pub. No.: WO2024/070996
PCT Pub. Date: Apr. 4, 2024

(65) Prior Publication Data
US 2024/0272331 A1   Aug. 15, 2024

(30) Foreign Application Priority Data

Sep. 30, 2022 (JP) .................................. 2022-158197
Sep. 30, 2022 (JP) .................................. 2022-158209

(51) Int. Cl.
G02B 5/30 (2006.01)
G02B 1/11 (2015.01)
(Continued)

(52) U.S. Cl.
CPC ................ *G02B 1/11* (2013.01); *G02B 1/111* (2013.01); *G02B 1/18* (2015.01); *G02B 5/0247* (2013.01); *G02B 5/30* (2013.01); *G02B 5/3025* (2013.01)

(58) Field of Classification Search
CPC ................ G02B 1/11–118; G02B 1/18; G02B 5/30–3058; G02B 5/02–0231; G02B 5/0236–0247
See application file for complete search history.

(56) References Cited

U.S. PATENT DOCUMENTS

2011/0244218 A1* 10/2011 Suzuki ..................... C08F 2/48
522/182
2018/0162091 A1   6/2018 Takeda et al.
(Continued)

FOREIGN PATENT DOCUMENTS

JP   2003-226465   8/2003
JP   2010-122560   6/2010
(Continued)

OTHER PUBLICATIONS

Office Action in Japanese patent application No. 2022-158197, Nov. 29, 2022, 8 pages including machine translation.
(Continued)

*Primary Examiner* — Stephone B Allen
*Assistant Examiner* — Adam W Booher
(74) *Attorney, Agent, or Firm* — HSML P.C.

(57) ABSTRACT

An optical film having high anti-glare properties and favorable fingerprints wiping off properties is provided. The optical film has a first surface, and a second surface which
(Continued)

is a surface opposite to the first surface, wherein the optical film comprises an anti-reflection layer and an anti-glare layer in this order from the first surface to the second surface, the first surface has a profile of depressions and projections, the first surface has an arithmetic mean height Sa of 0.05 μm or more specified in ISO 25178-2:2012, and the first surface satisfies the relation represented by the following Expression 1: Sw×Vmp≤2.00 (Expression 1) wherein "Sw" represents a tilt angle (degrees) of 30 μl pure water droplet flowing down on the first surface; and "Vmp" represents a value of a peak material volume (ml/m$^2$) of the first surface specified in ISO 25178-2:2012.

17 Claims, 2 Drawing Sheets

(51) Int. Cl.
*G02B 1/111* (2015.01)
*G02B 1/18* (2015.01)
*G02B 5/02* (2006.01)

(56) References Cited

U.S. PATENT DOCUMENTS

| | | | |
|---|---|---|---|
| 2018/0229420 A1* | 8/2018 | Couderc | G02B 1/118 |
| 2018/0233633 A1 | 8/2018 | Yamanaka et al. | |
| 2018/0239066 A1 | 8/2018 | Tachibana et al. | |
| 2018/0364400 A1 | 12/2018 | Eguchi et al. | |
| 2020/0126512 A1* | 4/2020 | Amin | G09G 5/10 |
| 2020/0166677 A1 | 5/2020 | Sugawara | |
| 2020/0166678 A1 | 5/2020 | Sugawara et al. | |
| 2022/0365246 A1 | 11/2022 | Sugawara | |
| 2023/0086813 A1* | 3/2023 | Ying | G02B 1/111 |
| | | | 428/172 |
| 2023/0124385 A1 | 4/2023 | Kubota et al. | |
| 2023/0234140 A1* | 7/2023 | Ieda | B22F 12/90 |
| | | | 264/497 |

FOREIGN PATENT DOCUMENTS

| | | | |
|---|---|---|---|
| JP | 2015-206841 | 11/2015 | |
| JP | 2016-044192 | 4/2016 | |
| JP | 2016-126023 | 7/2016 | |
| JP | 2017-134094 | 8/2017 | |
| JP | 2018-002987 | 1/2018 | |
| JP | 2019-085473 | 6/2019 | |
| JP | 2020-173452 | 10/2020 | |
| WO | 2012/157682 | 11/2012 | |
| WO | WO-2014034720 A1 * | 3/2014 | B24C 1/06 |
| WO | 2017/057564 | 4/2017 | |
| WO | 2017/061493 | 4/2017 | |
| WO | 2017/068765 | 4/2017 | |
| WO | 2019/026466 | 2/2019 | |
| WO | 2019/026471 | 2/2019 | |
| WO | 2021/075082 | 4/2021 | |
| WO | 2021/182424 | 9/2021 | |

OTHER PUBLICATIONS

Office Action issued in Japanese patent application No. 2022-158197, Mar. 7, 2023, 9 pages including machine translation.
Office Action issued in Japanese patent application No. 2022-158209, Nov. 29, 2022, 8 pages including machine translation.
Office Action issued in Japanese patent application No. 2022-158209, Mar. 7, 2023, 9 pages including machine translation.
Notice of Allowance issued for U.S. Appl. No. 18/617,293, dated Aug. 21, 2024, 15 pages.
Yang, M-W. et al., "A method for correcting the contact angle from the θ/2 method," Colloids and Surfaces A: Physicochem Eng. Aspects 220 (2003) pp. 199-210.
Office Action issued for U.S. Appl. No. 18/617,293, dated Jun. 6, 2024, 21 pages.

* cited by examiner

[Fig. 1]
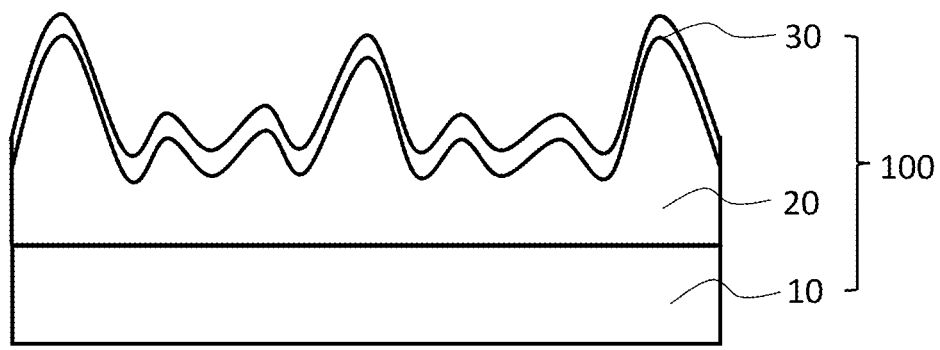
[Fig. 2]
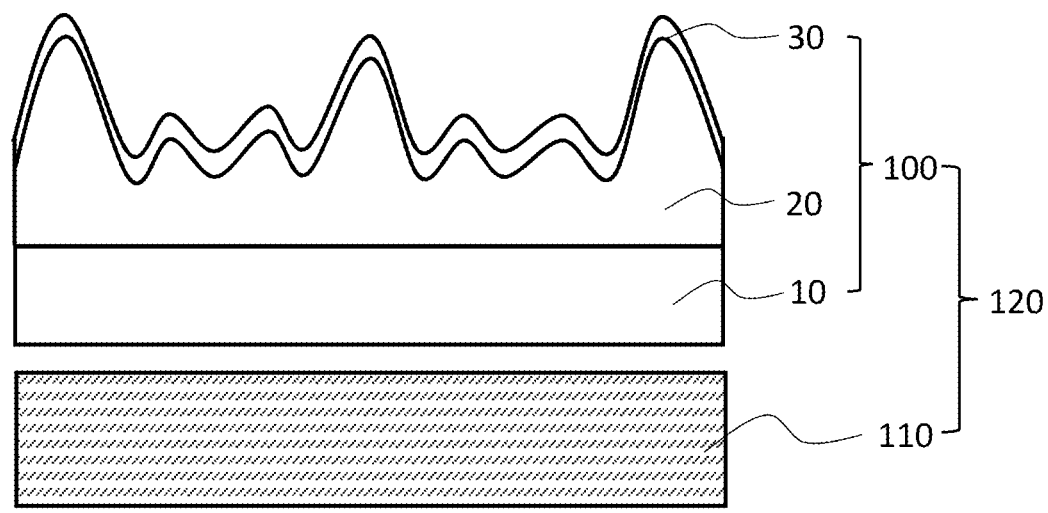

[Fig. 3]
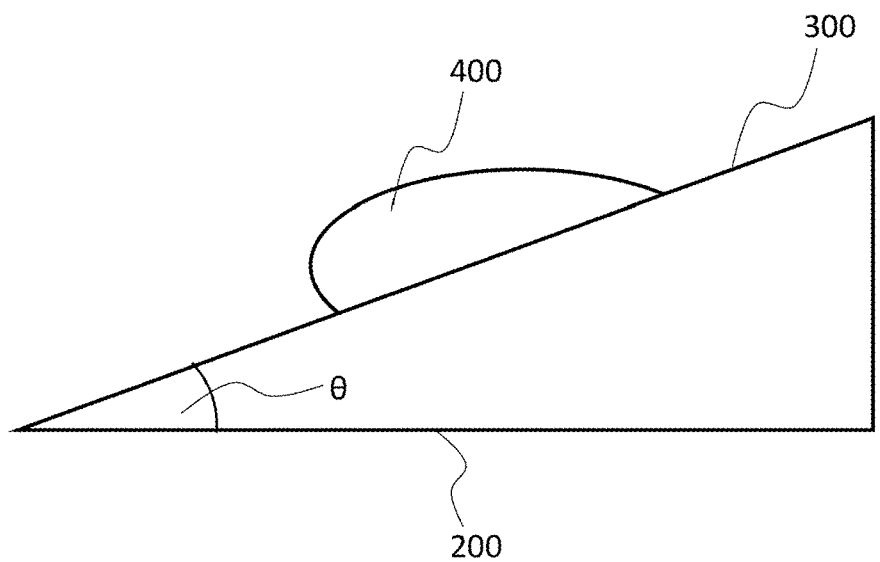
[Fig. 4]
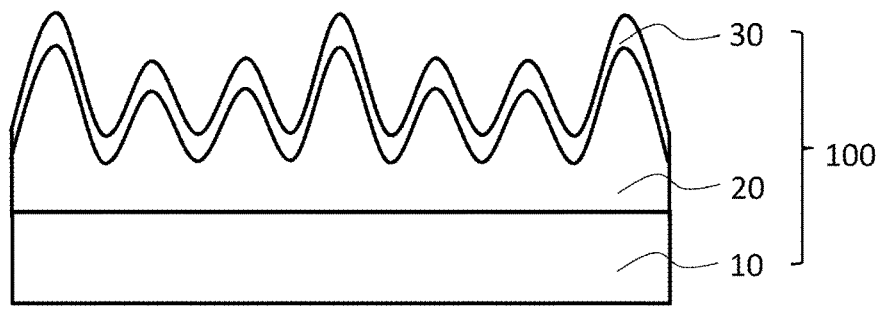
[Fig. 5]
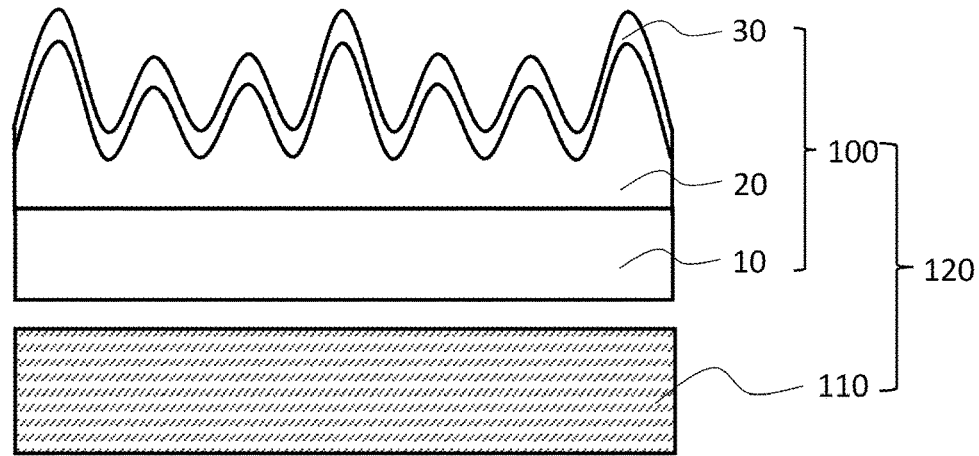

OPTICAL FILM, AND POLARIZING PLATE, SURFACE PLATE, IMAGE DISPLAY PANEL AND IMAGE DISPLAY DEVICE USING THE OPTICAL FILM, AND METHOD FOR PRODUCING THE OPTICAL FILM, AND METHOD FOR SELECTING OPTICAL FILM, AND EVALUATION METHOD OF FINGER PRINT WIPING PROPERTY

TECHNICAL FIELD

The present disclosure relates to an optical film, a polarization plate comprising the optical film, a surface plate, an image display panel, an image display device, a method of producing the optical film, a method of selecting an optical film, and a method of evaluating fingerprints wiping off properties.

BACKGROUND ART

In image display devices such as monitors for televisions, laptop computers, and desktop computers, an optical film may be disposed on their surfaces to suppress reflections of backgrounds such as lighting and people or suppress reflection from the surfaces.

Optical films according to PTL1 to PTL3 are proposed, for example.

CITATION LIST

Patent Literature

PTL1: WO 2019/026466
PTL2: WO 2019/026471
PTL3: JP 2019-85473 A

SUMMARY OF INVENTION

Technical Problem

The optical films according to PTL1 to PTL2 are anti-glare films each comprising an anti-glare layer having depressions and projections formed on the surface thereof. Such optical films having a profile of depressions and projections on the surfaces thereof tend to have fingerprints wiping off properties reduced by fingerprints which fill between depressions and projections. The fingerprints wiping off properties of the anti-glare film tend to be reduced as the anti-glare properties thereof are enhanced. In the optical films according to PTL1 to PTL2, no examination on dirt resistance is observed.

The optical film according to PTL3 is a coating film having a sliding angle of 32° or less to oleic acid. Although the coating film disclosed in PTL3 is aimed at facilitating wiping off of fingerprints, its fingerprints wiping off properties are not favorable.

If fingerprints adhering to the optical film are not sufficiently wiped off, the appearance of the optical film is reduced by a difference between optical properties of portions having fingerprint components and those of portions without fingerprint components. In particular, in the case of the optical film comprising an anti-reflection layer, the difference between the reflectance of the portions having fingerprint components and that of the portions without fingerprint components increases to significantly reduce the appearance of the optical film.

An object of the present disclosure is to provide an optical film having a surface with a profile of depressions and projections, and comprising an anti-reflection layer on the surface, and having high anti-glare properties and favorable fingerprints wiping off properties. Another object of the present disclosure is to provide a polarization plate, a surface plate, an image display panel, and an image display device which have high anti-glare properties and favorable fingerprints wiping off properties. Another object of the present disclosure is to provide a method of producing an optical film having high anti-glare properties and favorable fingerprints wiping off properties. Another object of the present disclosure is to provide a method of selecting an optical film having high anti-glare properties and favorable fingerprints wiping off properties. Another object of the present disclosure is to provide an evaluation method which can simply evaluate fingerprints wiping off properties.

Solution to Problem

The present disclosure provides the followings (1) to (15).

(1) An optical film having a first surface, and a second surface which is a surface opposite to the first surface,
  wherein the optical film comprises an anti-reflection layer and an anti-glare layer in this order from the first surface to the second surface,
  the first surface has a profile of depressions and projections,
  the first surface has an arithmetic mean height Sa of 0.05 µm or more specified in ISO 25178-2:2012, and
  the first surface satisfies the relation represented by the following Expression 1:

$$Sw \times Vmp \leq 2.00 \quad \text{(Expression 1)}$$

wherein "Sw" represents a tilt angle (degrees) of 30 µl pure water droplet flowing down on the first surface; and "Vmp" represents a value of a peak material volume (ml/m$^2$) of the first surface specified in ISO 25178-2:2012.

(2) A polarization plate comprising a polarizer, a first transparent protective plate disposed on one side of the polarizer, and a second transparent protective plate disposed on the other side of the polarizer,
  wherein at least one of the first transparent protective plate and the second transparent protective plate is the optical film according to (1), and the second surface of the optical film is disposed facing the polarizer.

(3) A surface plate for an image display device, comprising a protective film bonded onto a resin plate or a glass plate, wherein the protective film is the optical film according to (1), and the second surface of the optical film is disposed facing the resin plate or the glass plate.

(4) An image display panel comprising a display element, and an optical film disposed on a light-emitting surface side of the display element, wherein, as the optical film, the optical film according to (1) is included.

(5) An image display device comprising the image display panel according to (4).

(6) A method of producing the optical film according to (1), the method comprising:
  a first step of forming an anti-glare layer on a substrate; and a second step of forming an anti-reflection layer on the anti-glare layer.

(7) A method of selecting an optical film, the method comprising selecting an optical film satisfying the following selection conditions:

(Optical Film Selection Conditions)
  wherein the optical film has a first surface, and a second surface which is a surface opposite to the first surface,
  the optical film comprises an anti-reflection layer and an anti-glare layer in this order from the first surface to the second surface,
  the first surface has a profile of depressions and projections,
  the first surface has an arithmetic mean height Sa of 0.05 μm or more specified in ISO 25178-2:2012,
  the first surface satisfies the relation represented by the following Expression 1:

$$Sw \times Vmp \leq 2.00 \quad \text{(Expression 1)}$$

wherein "Sw" represents a tilt angle (degrees) of 30 μl pure water droplet flowing down on the first surface; and "Vmp" represents a value of a peak material volume (ml/m$^2$) of the first surface specified in ISO 25178-2:2012.

(8) An optical film having a first surface, and a second surface which is a surface opposite to the first surface,
  wherein the optical film comprises an anti-reflection layer and an anti-glare layer in this order from the first surface to the second surface,
  the first surface has a profile of depressions and projections,
  the first surface has a dale void volume Vvv of 0.005 ml/m$^2$ or more specified in ISO 25178-2:2012, and
  has a drop contact angle of 30.0 degrees or more measured by the following method.
<Measurement of Drop Contact Angle>
  dropping a droplet having a surface tension of 30 mN/m onto the first surface of the optical film from a height of 45 mm, where the droplet is dropped in a direction vertical to the first surface; and measuring a static contact angle by a θ/2 method after 10 seconds after the droplet has reached the first surface.

(9) A polarization plate comprising a polarizer, a first transparent protective plate disposed on one side of the polarizer, and a second transparent protective plate disposed on the other side of the polarizer,
  wherein at least one of the first transparent protective plate and the second transparent protective plate is the optical film according to (8), and the second surface of the optical film is disposed facing the polarizer.

(10) A surface plate for an image display device, comprising a protective film bonded to a resin plate or a glass plate, wherein the protective film is the optical film according to (8), and the second surface of the optical film is disposed facing the resin plate or the glass plate.

(11) An image display panel comprising a display element, and an optical film disposed on a light-emitting surface side of the display element, wherein, as the optical film, the optical film according to (8) is included.

(12) An image display device comprising the image display panel according to (11).

(13) A method of producing the optical film according to (8), the method comprising:
  a first step of forming an anti-glare layer on a substrate; and a second step of forming an anti-reflection layer on the anti-glare layer.

(14) A method of selecting an optical film, the method comprising selecting an optical film satisfying the following selection conditions:
(Optical Film Selection Conditions)
  wherein the optical film has a first surface, and a second surface which is a surface opposite to the first surface,
  the optical film comprises an anti-reflection layer and an anti-glare layer in this order from the first surface to the second surface,
  the first surface has a profile of depressions and projections,
  the first surface has a dale void volume Vvv of 0.005 ml/m$^2$ or more specified in ISO 25178-2:2012, and
  has a drop contact angle of 30.0 degrees or more measured by the following method.
<Measurement of Drop Contact Angle>
  dropping a droplet having a surface tension of 30 mN/m onto the first surface of the optical film from a height of 45 mm, where the droplet is dropped in a direction vertical to the first surface; and measuring a static contact angle by a θ/2 method after 10 seconds after the droplet has reached the first surface.

(15) A method of evaluating fingerprints wiping off properties, wherein a value of a drop contact angle measured by a measurement method below is used as an index for evaluation.
<Measurement of Drop Contact Angle>
  the measurement method comprising dropping a droplet having a surface tension of 30 mN/m onto a surface of a target object from a height of 45 mm, where the droplet is dropped in a direction vertical to the surface; and measuring a static contact angle by a θ/2 method after 10 seconds after the droplet has reached the surface.

Advantageous Effects of Invention

The optical film, the polarization plate, the surface plate, the image display panel, and the image display device according to the present disclosure have high anti-glare properties and favorable fingerprints wiping off properties. The method of producing an optical film according to the present disclosure can simply produce an optical film having high anti-glare properties and favorable fingerprints wiping off properties. The method of selecting an optical film according to the present disclosure can efficiently select an optical film having high anti-glare properties and favorable fingerprints wiping off properties. The method of evaluating fingerprints wiping off properties according to the present disclosure can simply evaluate the fingerprints wiping off properties of a target object.

BRIEF DESCRIPTION OF DRAWINGS

FIG. 1 is a cross-sectional schematic view illustrating one embodiment of an optical film according to the present disclosure.

FIG. 2 is a cross-sectional view illustrating one embodiment of an image display panel according to the present disclosure.

FIG. 3 is a diagram for illustrating a tilt angle (degrees) of pure water droplet flowing down.

FIG. 4 is a cross-sectional schematic view illustrating one embodiment of an optical film according to the present disclosure.

FIG. 5 is a cross-sectional view illustrating one embodiment of an image display panel according to the present disclosure.

DESCRIPTION OF EMBODIMENTS

Hereinafter, embodiments according to the present disclosure will be described.

Optical Film According to First Embodiment

The optical film according to a first embodiment of the present disclosure is:
- an optical film having a first surface, and a second surface which is a surface opposite to the first surface,
- wherein the optical film comprises an anti-reflection layer and an anti-glare layer in this order from the first surface to the second surface,
- the first surface has a profile of depressions and projections,
- the first surface has an arithmetic mean height Sa of 0.05 µm or more specified in ISO 25178-2:2012, and
- the first surface satisfies the relation represented by the following Expression 1:

$$Sw \times Vmp \leq 2.00 \quad \text{(Expression 1)}$$

wherein "Sw" represents a tilt angle (degrees) of 30 µl pure water droplet flowing down on the first surface; and "Vmp" represents a value of a peak material volume (ml/m$^2$) of the first surface specified in ISO 25178-2:2012.

FIG. 1 is a cross-sectional schematic view of a cross-sectional shape of an optical film 100 according to the first embodiment of the present disclosure.

The optical film 100 illustrated in FIG. 1 has a first surface having a profile of depressions and projections, and a second surface which is opposite to the first surface. In FIG. 1, the upper surface is the first surface, and the lower surface is the second surface.

The optical film 100 illustrated in FIG. 1 comprises an anti-reflection layer 30, an anti-glare layer 20, and a substrate 10 in this order from the first surface to the second surface.

FIG. 1 is a schematic sectional view. In other words, the scales of the layers forming the optical film 100 and that of the profile of depressions and projections are schematic for facilitating illustration, and are different from actual scales thereof. The same is also applied to FIGS. 2 and 3.

The optical film according to the first embodiment of the present disclosure can have any laminate configuration other than that illustrated in FIG. 1. For example, the optical film according to the first embodiment of the present disclosure may have a laminate configuration without a substrate. The optical film according to the first embodiment of the present disclosure may comprise a layer other than the substrate, the anti-glare layer and the anti-reflection layer.

<First Surface>

The optical film according to the first embodiment of the present disclosure has a first surface. In the optical film according to the first embodiment of the present disclosure, the surface of the anti-reflection layer is preferably the first surface.

The first surface of the optical film according to the first embodiment has a profile of depressions and projections, and has an arithmetic mean height Sa of 0.05 µm or more specified in ISO 25178-2:2012. When the first surface has no profile of depressions and projections, the optical film cannot have favorable anti-glare properties. The optical film can have favorable anti-glare properties by controlling the Sa to 0.05 µm or more in the first surface having a profile of depressions and projections.

The first surface according to the first embodiment has an Sa of preferably 0.10 µm or more, more preferably 0.20 µm or more, still more preferably 0.30 µm or more.

An excessively large Sa of the first surface may reduce the scratch resistance of the optical film in some cases. For this reason, the first surface has an Sa of preferably 0.80 µm or less, more preferably 0.60 µm or less, still more preferably 0.45 µm or less.

In an embodiment, the Sa of the first surface falls within the ranges of 0.05 µm or more and 0.80 µm or less, 0.05 µm or more and 0.60 µm or less, 0.05 µm or more and 0.45 µm or less, 0.10 µm or more and 0.80 µm or less, 0.10 µm or more and 0.60 µm or less, 0.10 µm or more and 0.45 µm or less, 0.20 µm or more and 0.80 µm or less, 0.20 µm or more and 0.60 µm or less, 0.20 µm or more and 0.45 µm or less, 0.30 µm or more and 0.80 µm or less, 0.30 µm or more and 0.60 µm or less, and 0.30 µm or more and 0.45 µm or less, for example.

The first surface of the optical film according to the first embodiment satisfies the relation represented by the following Expression 1:

$$Sw \times Vmp \leq 2.00 \quad \text{(Expression 1)}$$

wherein "Sw" represents a tilt angle (degrees) of 30 µl pure water droplet flowing down on the first surface; and "Vmp" represents a value of a peak material volume (ml/m$^2$) of the first surface specified in ISO 25178-2:2012.

In the first embodiment, it is more likely to obtain favorable fingerprints wiping off properties by controlling the value of Sw×Vmp of the first surface to 2.00 or more. The relation between Sw×Vmp and the fingerprints wiping off properties will be described below.

Sw represents a tilt angle (degrees) of 30 µl pure water droplet flowing down on the first surface. In this specification, the "tilt angle (degrees) of 30 µl pure water droplet flowing down" may be referred to as "pure water-flowing down tilt angle" in some cases. Fingerprints contain a large amount of water content. For this reason, as the first surface has a smaller Sw, it is more likely that the adhesiveness between the first surface and the fingerprints is reduced, facilitating removal of the fingerprints. However, in some cases, the fingerprints wiping off properties cannot be improved only by reducing the Sw of the first surface. In particular, when the optical film has favorable anti-glare properties, it is difficult to obtain favorable fingerprints wiping off properties only by reducing the Sw of the first surface.

Vmp represents a peak material volume (ml/m$^2$) specified in ISO 25178-2:2012. Vmp is a parameter indicating the volume of a projected portion having a height higher than that of the core portion. The core portion corresponds to a portion having the average height in the profile of depressions and projections. A greater Vmp indicates that the portion projected from the core portion has a larger volume. In this specification, the "portion projected from the core portion" may be referred to as "projected portion" in some cases. Although the Sa and the Vmp are not always correlated, it is likely that the Vmp becomes greater when the Sa is increased to obtain favorable anti-glare properties. When the Vmp becomes greater, fingerprints are more likely to enter spaces between projected portions, and thus reduce the fingerprints wiping off properties. When the Vmp of the first surface is reduced to suppress entering of fingerprints between projected portions, it is more difficult to obtain favorable anti-glare properties in the optical film. Moreover, it is difficult to obtain favorable fingerprints wiping off properties in the optical film only by reducing the Vmp of the first surface.

As described above, it is difficult to obtain favorable fingerprints wiping off properties in the optical film having high anti-glare properties by adjusting only the Sw and adjusting only the Vmp. Thus, the optical film according to the first embodiment of the present disclosure can have favorable fingerprints wiping off properties by controlling the value of Sw×Vmp to 2.00 or less. A value of Sw×Vmp of 2.00 or less means that the Sw and the Vmp are not extremely great and at least one of the Sw and the Vmp is small. For this reason, favorable fingerprints wiping off properties of the optical film can be obtained by controlling the value of Sw×Vmp to 2.00 or less.

In the first embodiment, the value of Sw×Vmp is preferably 1.60 or less, more preferably 1.40 or less, still more preferably 1.20 or less.

An excessively small value of Sw×Vmp means that at least one of the values of Sw and Vmp is too small. When the value of Sw is too small, it is more likely that the contents of a fluorine-based compound and a silicone-based compound in the anti-reflection layer are increased and the scratch resistance of the optical film is reduced. When the value of Vmp is too small, the value of Sa is reduced, and the anti-glare properties are more likely to be reduced. For this reason, the value of Sw×Vmp is preferably 0.15 or more, more preferably 0.25 or more, still more preferably 0.40 or more, further still more preferably 0.60 or more.

In the first embodiment, as one embodiment, the value of Sw×Vmp of the first surface falls within the ranges of 0.15 or more and 2.00 or less, 0.15 or more and 1.60 or less, 0.15 or more and 1.40 or less, 0.15 or more and 1.20 or less, 0.25 or more and 2.00 or less, 0.25 or more and 1.60 or less, 0.25 or more and 1.40 or less, 0.25 or more and 1.20 or less, 0.40 or more and 2.00 or less, 0.40 or more and 1.60 or less, 0.40 or more and 1.40 or less, 0.40 or more and 1.20 or less, 0.60 or more and 2.00 or less, 0.60 or more and 1.60 or less, 0.60 or more and 1.40 or less, and 0.60 or more and 1.20 or less, for example.

In the first embodiment, to facilitate control of the value of Sw×Vmp to 1.60 or less, the first surface has an Sw of preferably 65 (degrees) or less, more preferably 40 (degrees) or less, still more preferably 30 (degrees) or less.

In the first embodiment, to suppress a reduction in scratch resistance of the optical film, the first surface has an Sw of preferably 10 (degrees) or more, still more preferably 13 (degrees) or more, further still more preferably 17 (degrees) or more.

In the first embodiment, as one embodiment, the Sw of the first surface falls within the ranges of 10 degrees or more and 65 degrees or less, 10 degrees or more and 40 degrees or less, 10 degrees or more and 30 degrees or less, 13 degrees or more and 65 degrees or less, 13 degrees or more and 40 degrees or less, 13 degrees or more and 30 degrees or less, 17 degrees or more and 65 degrees or less, 17 degrees or more and 40 degrees or less, and 17 degrees or more and 30 degrees or less, for example.

In the optical film according to the first embodiment of the present disclosure, the pure water contact angle of the first surface is preferably 100 degrees or more and 120 degrees or less, more preferably 110 degrees or more and 115 degrees or less.

In this specification, the pure water contact angle is determined by dropping 1.0 µL of pure water onto the first surface, and measuring the static contact angle according to a θ/2 method after 10 seconds after the droplet has reached the surface.

In the first embodiment, to facilitate control of the value of Sw×Vmp to 1.60 or less, the first surface has a Vmp of preferably 0.100 (ml/m$^2$) or less, more preferably 0.080 (ml/m$^2$) or less, still more preferably 0.060 (ml/m$^2$) or less, further still more preferably 0.045 (ml/m$^2$) or less.

In the first embodiment, to facilitate obtaining of favorable anti-glare properties, the first surface has a Vmp of preferably 0.005 (ml/m$^2$) or more, more preferably 0.007 (ml/m$^2$) or more, still more preferably 0.010 (ml/m$^2$) or more, further still more preferably 0.020 (ml/m$^2$) or more.

In an embodiment, the Vmp of the first surface falls within the ranges of 0.005 ml/m$^2$ or more and 0.100 ml/m$^2$ or less, 0.005 ml/m$^2$ or more and 0.080 ml/m$^2$ or less, 0.005 ml/m$^2$ or more and 0.060 ml/m$^2$ or less, 0.005 ml/m$^2$ or more and 0.045 ml/m$^2$ or less, 0.007 ml/m$^2$ or more and 0.100 ml/m$^2$ or less, 0.007 ml/m$^2$ or more and 0.080 ml/m$^2$ or less, 0.007 ml/m$^2$ or more and 0.060 ml/m$^2$ or less, 0.007 ml/m$^2$ or more and 0.045 ml/m$^2$ or less, 0.010 ml/m$^2$ or more and 0.100 ml/m$^2$ or less, 0.010 ml/m$^2$ or more and 0.080 ml/m$^2$ or less, 0.010 ml/m$^2$ or more and 0.060 ml/m$^2$ or less, 0.010 ml/m$^2$ or more and 0.045 ml/m$^2$ or less, 0.020 ml/m$^2$ or more and 0.100 ml/m$^2$ or less, 0.020 ml/m$^2$ or more and 0.080 ml/m$^2$ or less, 0.020 ml/m$^2$ or more and 0.060 ml/m$^2$ or less, and 0.020 ml/m$^2$ or more and 0.045 ml/m$^2$ or less, for example.

The description in this paragraph is applied to both of the first embodiment and a second embodiment.

In this specification, the "pure water-flowing down tilt angle" of the optical film is measured by the procedures (1) to (3) below. In the procedures (1) to (3) below, measurement is performed, for example, using Product No. "DMo-701" of "DropMaster" series available from Kyowa Interface Science Co., Ltd. and "SA-301" as an attachment.

The pure water to be used can be general-purpose pure water. The pure water usually has a resistivity of 0.1 MΩ·cm or more and 15 MΩ·cm or less.

(1) A sample having a size of 2 cm×8 cm is cut out from the optical film. A double-sided adhesive tape is bonded to the second surface of the sample, and the sample is fixed to a horizontal stand at a tilt angle of 0 degrees with the double-sided adhesive tape interposed therebetween. The double-sided adhesive tape has a length of 8 cm or more and a width of 5 mm. The sample is fixed to the stand not to cause wrinkles of the sample and not to cause air bubbles to invade between the sample and the stand.

(2) 30 µl pure water is dropped onto the first surface of the sample.

(3) The stand on which the sample is disposed is gradually inclined at a rate of 2°/sec. It is determined that the droplet flows down when the distal end of the droplet moves 0.2835 mm or more. The angle of the stand when the droplet flows down is defined as "pure water-flowing down tilt angle". The "angle of the stand" means an angle formed by the horizontal plane and the flat surface of the stand.

FIG. 3 is a diagram for illustrating the tilt angle (degrees) of pure water droplet flowing down. In FIG. 3, "θ" corresponds to the angle of the stand. FIG. 3 illustrates a horizontal plane 200, a flat surface 300 of the stand, and a droplet 400. In FIG. 3, the optical film located between the flat surface 300 of the stand and the droplet 400 is not illustrated.

In this specification, the Vmp, the Vvc, and the Vvv are calculated where the areal material ratio that separates the core portion and the reduced peak (protruding peak) is 10% and the areal material ratio that separates the core portion and the reduced dale (protruding dale) is 80%.

In this specification, the Sxp described later indicates the difference between the height at an areal material ratio of 2.5% and a height at an areal material ratio of 50%.

Unless otherwise specified, the description "In this specification, xxx." means that this description is applied to both the first embodiment and the second embodiment. For example, the definitions of Vmp and the like above are applied to both the first embodiment and the second embodiment.

In this specification, surface profiles such as Sa, Vmp, Vvv, Vvc, Sxp, and Sal are measured using a confocal laser microscope. Examples of the confocal laser microscope include "VK-X" series available from Keyence Corporation. The Sa, Vmp, Vvv, Vvc, Sxp, and Sal can be simply calculated using "Multi-file analysis application" of "VK-X" series described above.

When the Sa, Vmp, Vvv, Vvc, Sxp, and Sal are measured using the "VK-X" series described above, the measurement is preferably performed according to the conditions described in Examples. For example, F-operation is preferably plane tilt correction (region specified). The region to be measured is preferably a rectangle having a side of 50 μm or more and 200 μm or less, and the measurement points per side are preferably 500 points or more and 2000 points or less.

In this specification, unless otherwise specified, the surface profiles (Sa, Vmp, Vvv, Vvc, Sxp, and Sal), the angles (pure water-flowing down tilt angle, pure water contact angle, and drop contact angles), the elemental ratios (such as F/inorganic Si, organic Si/inorganic Si, and F/organic Si), and the optical physical properties (such as $R_{SCI}$, haze, total light transmittance, and transmissive image clarity) each indicate the average of 14 measured values excluding the maximum value and the minimum value from the measured values at 16 points.

In this specification, for the 16 measured points, a region of 1 cm from the outer edge is removed as a margin from the sample to be measured, and the remaining region is divided equally into 5 in the longitudinal direction and the traverse direction. At this time, 16 points of intersection are used as measurement centers. For example, when the sample to be measured is a rectangle, a region of 0.5 cm from the outer edge of the rectangle is removed as a margin. The remaining region is divided equally into 5 in the longitudinal direction and the traverse direction with dotted lines, and using the resulting 16 points of intersection as centers, measurement is performed. The average of the 14 measured values excluding the maximum value and the minimum value from the 16 measured points is defined as the value of the parameter. When the sample to be measured has a shape other than the rectangle, such as a circular shape, an oval shape, a triangle, or a pentagon, an inscribed rectangle is drawn in these shapes, and 16 points in the inscribed rectangle are measured by the above method.

In this specification, unless otherwise specified, the surface profiles (Sa, Vmp, Vvv, Vvc, Sxp, and Sal), the angles (pure water-flowing down tilt angle, pure water contact angle, and drop contact angle), surface tension, the elemental ratios (such as F/inorganic Si, organic Si/inorganic Si, F/organic Si), optical physical properties (such as $R_{SCI}$, haze, total light transmittance, and transmissive image clarity) are measured at a temperature of 23±5° C. and a relative humidity of 40% or more and 65% or less. Before each of the measurements thereof is started, the target sample is exposed to the atmosphere for 30 minutes or more and 60 minutes or less to perform the measurement.

In the optical film according to the first embodiment of the present disclosure, the first surface preferably has a dale void volume Vvv of 0.005 ml/m² or more and 0.100 ml/m² or less specified in ISO 25178-2:2012. Vvv is a parameter indicating the volume of a projected portion located deeper than the core portion. By controlling the Vvv to 0.005 ml/m² or more, more favorable anti-glare properties can be readily obtained.

By controlling the Vvv to 0.100 ml/m² or less, more favorable fingerprints wiping off properties can be readily obtained.

The lower limit of Vvv is more preferably 0.007 ml/m² or more, still more preferably 0.010 ml/m² or more. The upper limit of Vvv is more preferably 0.080 ml/m² or less, still more preferably 0.060 ml/m² or less.

In an embodiment, the Vvv of the first surface falls within the ranges of 0.005 ml/m² or more and 0.100 ml/m² or less, 0.005 ml/m² or more and 0.080 ml/m² or less, 0.005 ml/m² or more and 0.060 ml/m² or less, 0.007 ml/m² or more and 0.100 ml/m² or less, 0.007 ml/m² or more and 0.080 ml/m² or less, 0.007 ml/m² or more and 0.060 ml/m² or less, 0.010 ml/m² or more and 0.100 ml/m² or less, 0.010 ml/m² or more and 0.080 ml/m² or less, and 0.010 ml/m² or more and 0.060 ml/m² or less, for example.

In the first embodiment, the first surface of the optical film according to the present disclosure preferably has a ratio of Vvv to Vvc (Vvv/Vvc) of 0.10 or less, the Vvc being the core void volume specified in ISO 25178-2:2012. By controlling the ratio Vvv/Vvc to 0.10 or less, more favorable fingerprints wiping off properties can be readily obtained. The ratio Vvv/Vvc is more preferably 0.09 or less, still more preferably 0.08 or less.

In the first embodiment, the first surface of the optical film according to the present disclosure preferably has a ratio of Vmp to Vvc (Vmp/Vvc) of 0.10 or less. By controlling the ratio Vmp/Vvc to 0.10 or less, more favorable fingerprints wiping off properties can be readily obtained. The ratio Vvv/Vvc is more preferably 0.09 or less, still more preferably 0.08 or less.

In the first embodiment, the first surface of the optical film according to the present disclosure preferably has a minimum autocorrelation length Sal of 4.0 μm or more and 12.0 μm or less specified in ISO 25178-2:2012.

Sal is a parameter focusing on the traverse direction. As the Sal is smaller, the first surface has a profile in which depressions and projections are more dense. As the Sal is greater, the first surface has a profile in which depressions and projections have wider intervals. The value of the "mean length of the roughness profile elements RSm" specified in JIS B0601 is hardly affected by fine depressions and projections, and is affected only by large depressions and projections. In contrast, unlike the RSm, the value of Sal is affected not only by large depressions and projections but also by fine depressions and projections. Moreover, in spite of wider intervals between depressions and projections, the Sal tends to reduce if projections are small or depressions and projections forms a complex profile. Moreover, the Sal tends to increase if projections have a monotonous profile.

The description in this paragraph is applied to both of the first embodiment and the second embodiment.

By controlling the Sal to 4.0 μm or more, more favorable fingerprints wiping off properties can be readily obtained. By controlling the Sal to 12.0 μm or less, more favorable anti-glare properties can be readily obtained.

The lower limit of Sal is more preferably 5.0 μm or more, still more preferably 6.0 μm or more. The upper limit of Sal is more preferably 11.0 μm or less, still more preferably 10.0 μm or less.

In an embodiment, the Sal of the first surface falls within the ranges of 4.0 μm or more and 12.0 μm or less, 4.0 μm or more and 11.0 μm or less, 4.0 μm or more and 10.0 μm or less, 5.0 μm or more and 12.0 μm or less, 5.0 μm or more and 11.0 μm or less, 5.0 μm or more and 10.0 μm or less, 6.0 μm or more and 12.0 μm or less, 6.0 μm or more and 11.0 μm or less, and 6.0 μm or more and 10.0 μm or less, for example.

The description in this paragraph is applied to both of the first embodiment and the second embodiment.

In the first embodiment, the optical film according to the present disclosure preferably has elemental ratios obtained by analysis of a surface region on the first surface side by X-ray photoelectron spectroscopy and satisfying the relations represented by the following Expressions 2 to 4:

$$3.5 \leq F/\text{inorganic } Si \leq 10.0 \quad \text{(Expression 2)}$$

$$0.08 \leq \text{organic } Si/\text{inorganic } Si \leq 1.00 \quad \text{(Expression 3)}$$

$$5.0 \leq F/\text{organic } Si \leq 50.0 \quad \text{(Expression 4)}$$

wherein "F" represents a ratio of a fluorine element, "inorganic Si" represents a ratio of a silicon element attributed to an inorganic silicon compound, and "organic Si" represents a ratio of a silicon element attributed to an organic silicon compound.

In this specification, the "surface region on the first surface side" indicates a region extending from the surface of the first surface to a depth of 10 nm. In this specification, the "X-ray photoelectron spectroscopy" is also referred to as "XPS" in some cases. In this specification, the elemental ratios in the surface region on the first surface side can be measured by the method described in Examples.

The inorganic Si in the surface region of the first surface of the optical film is mainly derived from silica particles. The organic Si and F in the surface region of the first surface of the optical film are mainly derived from a leveling agent.

From an X-ray light electron spectrum of the Si2p orbital, the inorganic Si can be distinguished from the organic Si by separating peaks of the inorganic components from those of the organic components.

The description in this paragraph is applied to both of the first embodiment and the second embodiment.

In the surface region of the first surface of the optical film, the inorganic Si tends to worsen the fingerprints wiping off properties while it can reduce the refractive index of the first surface. In the surface region of the first surface of the optical film, it is likely that favorable fingerprints wiping off properties are obtained if predetermined or larger amounts of organic Si and F are contained to those of the inorganic Si. Furthermore, in the surface region of the first surface of the optical film, it is likely that favorable fingerprints wiping off properties are obtained if the organic Si and F are contained in a good balance. Thus, by controlling the ratio F/inorganic Si to 3.5 or more, the ratio organic Si/inorganic Si to 0.08 or more, and the ratio F/organic Si to 5.0 or more and 50.0 or less, the Sw can be more readily reduced to satisfy the relation represented by Expression 1.

Moreover, by controlling the ratio F/inorganic Si to 10.0 or less and the ratio organic Si/inorganic Si to 1.00 or less, a reduction in applicability of the anti-reflection layer can be more readily suppressed.

The lower limit of the ratio F/inorganic Si is more preferably 4.0 or more, still more preferably 4.5 or more, and the upper limit is more preferably 9.0 or less, still more preferably 8.0 or less.

The lower limit of the ratio organic Si/inorganic Si is more preferably 0.10 or more, still more preferably 0.15 or more, and the upper limit is more preferably 0.80 or less, still more preferably 0.50 or less.

The lower limit of the ratio F/organic Si is more preferably 10.0 or more, still more preferably 15.0 or more, further still more preferably 22.0 or more, and the upper limit is more preferably 40.0 or less, still more preferably 35.0 or less.

The description in this paragraph is applied to both of the first embodiment and the second embodiment.

In an embodiment, the ratio F/inorganic Si falls within the ranges of 3.5 or more and 10.0 or less, 3.5 or more and 9.0 or less, 3.5 or more and 8.0 or less, 4.0 or more and 10.0 or less, 4.0 or more and 9.0 or less, 4.0 or more and 8.0 or less, 4.5 or more and 10.0 or less, 4.5 or more and 9.0 or less, and 4.5 or more and 8.0 or less, for example.

In an embodiment, the ratio organic Si/inorganic Si falls within the ranges of 0.08 or more and 1.00 or less, 0.08 or more and 0.80 or less, 0.08 or more and 0.50 or less, 0.10 or more and 1.00 or less, 0.10 or more and 0.80 or less, 0.10 or more and 0.50 or less, 0.15 or more and 1.00 or less, 0.15 or more and 0.80 or less, and 0.15 or more and 0.50 or less, for example.

In an embodiment, the ratio F/organic Si falls within the ranges of 5.0 or more and 50.0 or less, 5.0 or more and 40.0 or less, 5.0 or more and 35.0 or less, 10.0 or more and 50.0 or less, 10.0 or more and 40.0 or less, 10.0 or more and 35.0 or less, 15.0 or more and 50.0 or less, 15.0 or more and 40.0 or less, 15.0 or more and 35.0 or less, 22.0 or more and 50.0 or less, 22.0 or more and 40.0 or less, and 22.0 or more and 35.0 or less, for example.

The description in this paragraph is applied to both of the first embodiment and the second embodiment.

For the elemental ratios obtained by analysis of a surface region on the first surface side of the optical film according to the present disclosure, by X-ray photoelectron spectroscopy, the proportion of the inorganic Si relative to the total elements is preferably 2 atomic percent or more and 20 atomic percent or less. Since the refractive index of the first surface can be more readily reduced by controlling the proportion of the inorganic Si relative to the total elements to 2 atomic percent or more, more favorable anti-reflective properties of the optical film can be obtained. By controlling the proportion of the inorganic Si to 20 atomic percent or less, the ratio F/inorganic Si can be more readily controlled to 3.5 or more and the ratio organic Si/inorganic Si can be more readily controlled to 0.08 or more.

The lower limit of the proportion of the inorganic Si relative to the total elements is more preferably 3 atomic percent or more, still more preferably 4 atomic percent or more, and the upper limit is more preferably 15 atomic percent or less, still more preferably 12 atomic percent or less.

In an embodiment, the proportion of the inorganic Si relative to the total elements falls within the ranges of 2 atomic percent or more and 20 atomic percent or less, 2 atomic percent or more and 15 atomic percent or less, 2 atomic percent or more and 12 atomic percent or less, 3 atomic percent or more and 20 atomic percent or less, 3 atomic percent or more and 15 atomic percent or less, 3 atomic percent or more and 12 atomic percent or less, 4 atomic percent or more and 20 atomic percent or less, 4 atomic percent or more and 15 atomic percent or less, and 4 atomic percent or more and 12 atomic percent or less, for example.

The description in this paragraph is applied to both of the first embodiment and the second embodiment.

<Laminate Configuration>

The optical film according to the first embodiment of the present disclosure comprises an anti-reflection layer and an anti-glare layer in this order from the first surface to the second surface. Preferably, the outermost surface of the first surface side of the optical film according to the first embodiment is the anti-reflection layer.

The optical film according to the present disclosure may comprise a layer other than the anti-reflection layer and the anti-glare layer. Examples of the layer other than the anti-reflection layer and the anti-glare layer include substrates, antistatic layers, and adhesive layers.

The optical film according to the present disclosure preferably comprises an anti-reflection layer, an anti-glare layer, and a substrate in this order from the first surface to the second surface.

The description in this paragraph is applied to both of the first embodiment and the second embodiment.

<<Substrate>>

The optical film according to the first embodiment preferably comprises a substrate because of ease in production and handling properties.

Preferably, the substrate has light transmissivity, smoothness, and heat resistance, and further has high mechanical strength. Examples of such a substrate include plastic films of polyester, triacetylcellulose (TAC), cellulose diacetate, cellulose acetate butyrate, polyamide, polyimide, polyether sulfone, polysulfone, polypropylene, polymethylpentene, polyvinyl chloride, polyvinyl acetal, polyether ketone, polymethyl methacrylate, polycarbonate, polyurethane, and amorphous olefin (Cyclo-Olefin-Polymer: COP). The substrate may be two or more plastic films bonded to each other.

Among these plastic films, stretched polyester films are preferred, and biaxially stretched polyester films are more preferred for mechanical strength and dimensional stability. Examples of polyester films include polyethylene terephthalate films and polyethylene naphthalate films. TAC films and acrylic films are suitable because favorable light transmissivity and optical isotropy are readily obtained. COP films and polyester films are suitable for their high weatherability.

The description in this paragraph is applied to both of the first embodiment and the second embodiment.

The substrate has a thickness of preferably 5 μm or more and 300 μm or less, more preferably 20 μm or more and 200 μm or less, still more preferably 30 μm or more and 120 μm or less.

When the optical film is formed into a thin film, a preferred upper limit of the thickness of the substrate is 100 μm or less, and a more preferred upper limit is 80 μm or less. When the substrate is a low moisture-permeable substrate made of polyester, COP, acrylic resin, or the like, a preferred upper limit of the thickness of the substrate for formation of a thin film is 60 μm or less, and a more preferred upper limit is 40 μm or less. Even in the case of large screens, distortions are difficult to occur as long as the upper limit of the thickness of the substrate falls within the ranges specified above, which is also suitable.

In this specification, the thickness of the substrate is measured by a film thickness measurement apparatus. Examples of the film thickness measurement apparatus include Standard Digimatic Outside Micrometer (product No. MDC-25SX) available from Mitutoyo Corporation. As the thickness of the substrate, it is sufficient that the average of thicknesses measured at any 10 points is the above numeric value.

The description in this paragraph is applied to both of the first embodiment and the second embodiment.

The substrate has a total light transmittance specified in JIS K7361-1:1997 of preferably 70% or more, more preferably 80% or more, still more preferably 85% or more.

The substrate has a haze specified in JIS K7136:2000 of preferably 10% or less, more preferably 5% or less, still more preferably 3% or less.

To improve adhesiveness, the surface of the substrate may be subjected to a physical treatment such as a corona discharge treatment, or a chemical treatment. The substrate may comprise an easily adhesive layer on the surface thereof.

The description in this paragraph is applied to both of the first embodiment and the second embodiment.

<<Anti-Glare Layer>>

In the first embodiment, the anti-glare layer is a layer which plays a main role in contributing to anti-glare properties.

In the first embodiment, the anti-glare layer can be formed, for example, by (A) a method using an emboss roll, (B) an etching treatment, (C) molding using a mold, and (D) forming a coating by application. To readily obtain a stable surface profile, suitable is (C) molding using a mold. For productivity and handling of a variety of products, suitable is (D) forming a coating by application.

In the method (C), for example, the anti-glare layer can be formed by casting a resin into a mold, and removing the molded resin from the mold. The molded resin removed from the mold may be disposed on the substrate. The mold to be used is a mold having the inverted surface profile with respect to that of the anti-glare layer. Such a mold can be prepared, for example, by a method (c1-1) to (c1-2) or by a method (c2) below.

(c1-1) A profile where Sa, Vmp, or the like fall within predetermined ranges is created by simulation. Further, the simulated profile is inverted.

(c1-2) The surface of a metal is carved by laser light or processed by photolithography to reflect the inverted profile, thereby obtaining a mold.

(c2) A mold having the inverted profile with respect to that of the anti-glare layer prepared by (D) is obtained by an electroforming method widely used.

When the anti-glare layer is formed by (D), examples of the method include methods (d1) and (d2) below. The method (d1) is preferred to the method (d2) because it can readily adjust the ranges of surface profiles such as Sa and Vmp.

(d1) A method of applying a coating solution containing a binder resin and particles, followed by drying to form an anti-glare layer having depressions and projections based on the particles.

(d2) A method of applying a coating solution containing any resin and a resin less compatible with the resin to cause phase separation of the resins, thereby forming depressions and projections.

Thickness

For a balance among suppression of curling, mechanical strength, hardness, and toughness, the thickness T of the anti-glare layer is preferably 2.0 μm or more and 10.0 μm or less, more preferably 3.0 μm or more and 8.0 μm or less, still more preferably 4.0 μm or more and 6.0 μm or less.

In this specification, the thickness of the anti-glare layer can be determined, for example, by selecting any 20 points in a cross-sectional photograph of the optical film taken by a scanning transmissive electron microscope, and calculating the average thereof. Preferably, the STEM is set at an accelerating voltage of 10 kv or more and 30 kV or less and a magnification of 1000× or more and 7000× or less.

The description in this paragraph is applied to both of the first embodiment and the second embodiment.

Components

Preferably, the anti-glare layer mainly contains a resin component. Furthermore, the anti-glare layer may optionally contain particles such as organic particles and inorganic particles; nanometer-scale fine particles; additives such as a refractive index adjuster, an antistatic agent, a leveling agent, an ultraviolet absorbing agent, a light stabilizer, an antioxidant, a viscosity control agent, and a thermal polymerization initiator; and other components.

The description in this paragraph is applied to both of the first embodiment and the second embodiment.

The anti-glare layer preferably contains a binder resin and particles.

Examples of the particles include organic particles and inorganic particles. Preferred are inorganic particles. In other words, the anti-glare layer preferably contains a binder resin and inorganic particles. More preferably, the anti-glare layer contains a binder resin, inorganic particles, and organic particles.

The description in this paragraph is applied to both of the first embodiment and the second embodiment.

Particles

Examples of inorganic particles include silica, alumina, zirconia, and titania. Preferred is silica. Among these inorganic particles, preferred are amorphous inorganic particles, and more preferred is amorphous silica.

Examples of organic particles include particles containing one or more resins selected from the group consisting of polymethyl methacrylate, polyacrylic-styrene copolymers, melamine resins, polycarbonate, polystyrene, polyvinyl chloride, benzoguanamine-melamine-formaldehyde condensate, silicone, fluorine-based resins, and polyester-based resins.

The amorphous inorganic particles indicate inorganic particles without any specific shape which are obtained by grinding large-sized inorganic particles, followed by classification.

The particles preferably contain inorganic particles. The particles more preferably contain amorphous inorganic particles, and still more preferably contain amorphous inorganic particles and organic particles. As the amorphous inorganic particles, preferred is amorphous silica.

The description in this paragraph is applied to both of the first embodiment and the second embodiment.

Compared to spherical particles, amorphous inorganic particles tend to more readily increase the Sa and reduce the Sal. However, a significantly wide particle diameter distribution of the amorphous inorganic particles is likely to excessively increase the Vmp, which makes it difficult to satisfy the relation represented by Expression 1. In particular, aggregation of the amorphous inorganic particles is likely to further increase the Vmp, which makes it more difficult to satisfy the relation represented by Expression 1. In contrast, a significantly narrow particle diameter distribution of the amorphous inorganic particles is likely to lead to reduced coating suitability. For this reason, the amorphous inorganic particles preferably have a volume-based cumulative distribution of the particle diameter within the range described later. However, use of inorganic particles alone is likely to readily cause aggregation. Accordingly, in the first embodiment, to make it easy to satisfy the Sa and the relation represented by Expression 1, it is preferred that the amorphous particles having a particle diameter distribution controlled within the range described later be used in combination with the organic particles.

In the first embodiment, preferably, inorganic particles such as amorphous inorganic particles have a volume-based cumulative distribution d10 of the particle diameter, a volume-based cumulative distribution d50 of the particle diameter, and a volume-based cumulative distribution d90 of the particle diameter, these cumulative distributions satisfying the relations (1) and (2) below:

$$1.5 \leq d50/d10 \leq 4.0 \quad (1)$$

$$1.0 \leq d90/d50 \leq 3.0 \quad (2)$$

A value of d50/d10 of 1.5 or more indicates that the inorganic particles have a wide particle size distribution in a region where the particle diameter is the mean or smaller. By controlling the value of d50/d10 to 1.5 or more, fine depressions and projections are likely to be formed on the surface with depressions and projections, thus reducing the Sal. By controlling the value of d50/d10 to 4.0 or less, an increase in amount of inorganic particles buried in the anti-glare layer can be suppressed, enhancing the efficiency in addition of the inorganic particles.

A value of d90/d50 of 1.0 or more indicates that the inorganic particles has a wide particle size distribution in a region where the particle diameter is the mean or larger. By controlling the value of d90/d50 to 1.0 or more, the Vmp can be readily increased, and the Sal can be readily increased. By controlling the value of d90/d50 to 3.0 or less, an excessive increase in Vmp and an excessive increase in Sal can be readily suppressed.

The lower limit of the value of d50/d10 is more preferably 2.0 or more, still more preferably 2.3 or more, and the upper limit is more preferably 3.5 or less, still more preferably 3.2 or less.

The lower limit of the value of d90/d50 is more preferably 1.3 or more, still more preferably 1.5 or more, and the upper limit is more preferably 2.5 or less, still more preferably 2.0 or less.

In this specification, the d10, d50, and d90 of the inorganic particles such as amorphous inorganic particles are measured by a laser diffraction method.

In the first embodiment, inorganic particles such as amorphous inorganic particles have a volume-based cumulative distribution d50 of the particle diameter in the range of preferably 2.5 μm or more and 5.5 μm or less, more preferably 3.0 μm or more and 5.0 μm or less, still more preferably 3.3 μm or more and 4.7 μm or less.

By controlling the d50 to 2.5 μm or more, an excessive increase in the number of inorganic particles can be suppressed, which can facilitate suppression in excessive reduction of the Sal. By controlling the d50 to 5.5 μm or less, an excessive decrease in the number of inorganic particles can be suppressed, which can facilitate suppression in excessive increase of the Sal.

For the thickness T of the anti-glare layer and the d50 of the inorganic particles such as amorphous inorganic particles, the value of d50/T is preferably 0.55 or more and 1.00 or less, more preferably 0.60 or more and 0.95 or less, still more preferably 0.70 or more and 0.90 or less.

Control of the value of d50/T to 0.55 or more can facilitate a reduction in Sal. Control of the value of d50/T to 1.00 or less can facilitate an increase in Sal.

The description in this paragraph is applied to both of the first embodiment and the second embodiment.

For the thickness T of the anti-glare layer and the d90 of the inorganic particles such as amorphous inorganic particles, the value of d90/T is preferably 1.00 or more and 1.50 or less, more preferably 1.08 or more and 1.45 or less, still more preferably 1.20 or more and 1.40 or less.

Control of the value of d90/T to 1.00 or more can facilitate an increase in Vmp. Control of the value d90/T to 1.50 or less can facilitate a reduction in Vmp.

The description in this paragraph is applied to both of the first embodiment and the second embodiment.

The content of the inorganic particles such as amorphous inorganic particles is preferably 8 parts by mass or more and 40 parts by mass or less, more preferably 12 parts by mass or more and 30 parts by mass or less, still more preferably 15 parts by mass or more and 28 parts by mass or less relative to 100 parts by mass of the binder resin.

By controlling the content of the inorganic particles such as amorphous inorganic particles to 8 parts by mass or more, an excessive decrease in the number of inorganic particles can be suppressed. Thus, the inorganic particles are densely disposed, and voids are formed between the inorganic particles. For this reason, the Vvv becomes a predetermined value or greater, and further the Sal is not excessively increased; thus, more favorable anti-glare properties can be more readily obtained.

By controlling the content of the inorganic particles such as amorphous inorganic particles to 40 parts by mass or less, an excessive increase in the number of inorganic particles can be suppressed, and thus an excessive reduction in Sal can be more readily suppressed.

The description in this paragraph is applied to both of the first embodiment and the second embodiment.

In the first embodiment, the content of the organic particles is preferably 1 part by mass or more and 25 parts by mass or less, more preferably 3 parts by mass and 18 parts by mass or less, still more preferably 8 parts by mass or more and 14 parts by mass or less relative to 100 parts by mass of the binder resin.

By controlling the content of the organic particles to 1 part by mass or more, aggregation of the inorganic particles can be more readily suppressed. By controlling the content of the organic particles to 1 part by mass or more, an excessive decrease in the number of organic particles can be suppressed, and thus an excessive increase in Vmp can be readily suppressed.

Because the organic particles have a relatively uniform particle diameter distribution, an increase in content of the organic particles tends to reduce the Sal. For this reason, by controlling the content of the organic particles to 25 parts by mass or less, an excessive reduction in Sal can be suppressed, and favorable fingerprints wiping off properties can be readily obtained.

In the first embodiment, the organic particles have an average particle size of preferably 1.0 μm or more and 5.0 μm or less, more preferably 1.2 μm or more and 3.0 μm or less, still more preferably 1.3 μm or more and 2.5 μm or less.

By controlling the average particle size of the organic particles to 1.0 μm or more, an excessive increase in the number of organic particles can be suppressed, and thus an excessive reduction in Sal can be readily suppressed. For this reason, by controlling the average particle size of the organic particles to 1.0 μm or more, favorable fingerprints wiping off properties can be readily obtained. By controlling the average particle size of the organic particles to 5.0 μm or less, an excessive decrease in the number of organic particles can be suppressed, and thus an excessive increase in Vmp can be readily suppressed.

In this specification, the average particle size of the organic particles indicates the value determined by a laser diffraction method as a volume average d50.

In the first embodiment, the organic particles preferably have a narrow particle size distribution. Specifically, in the first embodiment, the proportion of organic particles having an average particle size in the range of ±0.5 μm is preferably 80% by volume or more, more preferably 85% by volume or more, still more preferably 90% or more in the total organic particles. The value of Vmp can be reduced and the relation represented by Expression 1 can be readily satisfied by widening the particle size distribution of the inorganic particles such as amorphous inorganic particles while narrowing the particle size distribution of the organic particles.

Examples of the shape of the organic particles include spherical shapes, disk-like shapes, rugby ball-like shapes, and amorphous shapes. Among these shapes, spherical organic particles are preferred because their particle size distribution can be readily controlled.

The description in this paragraph is applied to both of the first embodiment and the second embodiment.

In the first embodiment, the ratio of the average particle size of the organic particles to the thickness of the anti-glare layer (average particle size of organic particles/thickness of anti-glare layer) is preferably 0.20 or more and 0.70 or less, more preferably 0.23 or more and 0.50 or less, still more preferably 0.25 or more and 0.35 or less. By controlling the ratio of the average particle size of the organic particles to the thickness of the anti-glare layer within the range, the Vmp, the Sa, and the Sal can be readily controlled to fall within the ranges specified above.

Inorganic Fine Particles

The anti-glare layer may further contain inorganic fine particles in addition to the binder resin and the particles. In this specification, the inorganic fine particles can be distinguished from the above-mentioned particles according to the average particle size.

When the anti-glare layer contains inorganic fine particles, the difference between the refractive index of the particles and those of the compositions other than the particles in the anti-glare layer can be reduced, and the internal haze can be readily reduced.

The description in this paragraph is applied to both of the first embodiment and the second embodiment.

Examples of the inorganic fine particles include fine particles made of silica, alumina, zirconia, and titania. Among these, suitable is silica because it readily suppresses generation of the internal haze.

The inorganic fine particles have an average particle size of preferably 1 nm or more and 200 nm or less, more preferably 2 nm or more and 100 nm or less, still more preferably 5 nm or more and 50 nm or less.

The description in this paragraph is applied to both of the first embodiment and the second embodiment.

Binder Resin

To readily obtain favorable scratch resistance, the binder resin preferably contains a cured product of a curable resin composition, such as a cured product of a thermosetting resin composition or a cured product of an ionizing radiation curable-resin composition, and more preferably contains a cured product of an ionizing radiation curable-resin composition.

The binder resin may contain a thermoplastic resin in the range not inhibiting the effects of the present disclosure.

To readily obtain favorable scratch resistance, the proportion of the cured product of the curable resin composition is preferably 80% by mass or more, more preferably 90% by mass or more, still more preferably 100% by mass relative to the total amount of the binder resin.

The thermosetting resin composition is a composition containing at least a thermosetting resin, and is a resin composition curable by heating.

Examples of thermosetting resins include acrylic resins, urethane resins, phenol resins, urea melamine resins, epoxy resins, unsaturated polyester resins, and silicone resins. In thermosetting resin composition, a curing agent is added to these curable resins as needed.

The description in this paragraph is applied to both of the first embodiment and the second embodiment.

The ionizing radiation curable-resin composition is a composition containing a compound having an ionizing radiation-curable functional group (hereinafter, also referred to as "ionizing radiation-curable compound").

Examples of the ionizing radiation-curable functional group include ethylenically unsaturated bonding groups, such as an (meth)acryloyl group, a vinyl group, and an allyl group, an epoxy group, and an oxetanyl group. The ionizing radiation-curable compound is preferably a compound having an ethylenically unsaturated bonding group, more preferably a compound having two or more ethylenically unsaturated bonding groups. Among these, still more preferred are polyfunctional (meth)acrylate compounds having two or more ethylenically unsaturated bonding groups. Either of a monomer or an oligomer of a polyfunctional (meth)acrylate compound can be used.

In this specification, the ionizing radiation means that having an energy quantum which can polymerize or cross-link molecules, among electromagnetic waves or charged particle beams. As the ionizing radiation, usually ultraviolet light (UV) or an electron beam (EB) is used. Besides, electromagnetic waves, such as X-rays and γ-rays, and charged particle beams, such as x-rays and ionic lines, can also be used.

The description in this paragraph is applied to both of the first embodiment and the second embodiment.

Among polyfunctional (meth)acrylate compounds, examples of bifunctional (meth)acrylate monomers include ethylene glycol di(meth)acrylate, bisphenol A tetraethoxy diacrylate, bisphenol A tetrapropoxy diacrylate, and 1,6-hexanediol diacrylate.

Examples of tri- or higher functional (meth)acrylate monomers include trimethylolpropane tri(meth)acrylate, pentaerythritol tri(meth)acrylate, pentaerythritol tetra(meth)acrylate, dipentaerythritol hexa(meth)acrylate, dipentaerythritol tetra(meth)acrylate, and isocyanuric acid-modified tri(meth)acrylate.

These (meth)acrylate monomers above may have a molecule skeleton partially modified. For example, the (meth)acrylate monomers having a molecule skeleton partially modified with ethylene oxide, propylene oxide, caprolactone, isocyanuric acid, an alkyl, a cyclic alkyl, an aromatic, or bisphenol can also be used.

The description in this paragraph is applied to both of the first embodiment and the second embodiment.

Examples of polyfunctional (meth)acrylate oligomers include acrylate polymers such as urethane (meth)acrylate, epoxy (meth)acrylate, polyester (meth)acrylate, and polyether (meth)acrylate.

For example, urethane (meth)acrylate is prepared by a reaction of a polyhydric alcohol and an organic diisocyanate with hydroxy (meth)acrylate.

Preferred epoxy (meth)acrylates are (meth)acrylates prepared by reacting a tri- or higher functional aromatic epoxy resin, alicyclic epoxy resin, aliphatic epoxy resin, or the like with (meth)acrylic acid, (meth)acrylates prepared by reacting a bi- or higher functional aromatic epoxy resin, alicyclic epoxy resin, aliphatic epoxy resin, or the like with a polybasic acid and (meth)acrylic acid, and (meth)acrylates prepared by reacting a bi- or higher functional aromatic epoxy resin, alicyclic epoxy resin, aliphatic epoxy resin, or the like with phenols and (meth)acrylic acid.

The polyfunctional (meth)acrylate oligomer has a weight average molecular weight of preferably 500 or more and 3000 or less, more preferably 700 or more and 2500 or less.

In this specification, the weight average molecular weight is the average molecular weight determined with respect to standard polystyrenes in measurement by GPC analysis.

The description in this paragraph is applied to both of the first embodiment and the second embodiment.

In order to adjust the viscosity of the anti-glare layer coating solution, a monofunctional (meth)acrylate as an ionizing radiation-curable compound may be used in combination. Examples of the monofunctional (meth)acrylate include methyl (meth)acrylate, ethyl (meth)acrylate, propyl (meth)acrylate, butyl (meth)acrylate, pentyl (meth)acrylate, hexyl (meth)acrylate, cyclohexyl (meth)acrylate, 2-ethylhexyl (meth)acrylate, lauryl (meth)acrylate, stearyl (meth)acrylate, and isobornyl (meth)acrylate.

These ionizing radiation-curable compounds above can be used alone or in combination.

The description in this paragraph is applied to both of the first embodiment and the second embodiment.

When the ionizing radiation-curable compound is an ultraviolet light-curable compound, the ionizing radiation-curable composition preferably contains additives such as a photopolymerization initiator and a photopolymerization accelerator.

Examples of the photopolymerization initiator include one or more selected from the group consisting of acetophenone, benzophenone, α-hydroxyalkylphenones, Michler's ketone, benzoin, benzyl dimethyl ketal, benzoyl benzoate, α-acyloxime esters, and thioxanthones.

The photopolymerization accelerator can reduce inhibition of polymerization due to air during curing, and accelerate the curing rate. Examples of the accelerator include p-dimethylaminobenzoic acid isoamyl ester and p-dimethylaminobenzoic acid ethyl ester.

The description in this paragraph is applied to both of the first embodiment and the second embodiment.

In the first embodiment, when the binder resin contains a cured product of the ionizing radiation curable-resin composition, the ionizing radiation curable-resin composition preferably contains a polyfunctional (meth)acrylate monomer and a polyfunctional (meth)acrylate oligomer.

In the first embodiment, the mass ratio of the polyfunctional (meth)acrylate monomer to the polyfunctional (meth)acrylate oligomer is preferably 5:95 to 60:40, more preferably 20:80 to 60:40, still more preferably 40:60 to 60:40.

By using the polyfunctional (meth)acrylate monomer in a predetermined or higher proportion, favorable scratch resistance of the anti-glare layer can be readily obtained.

By using the polyfunctional (meth)acrylate oligomer in a predetermined or higher proportion, the viscosity of the coating solution for the anti-glare layer can be increased, readily suppressing sinking of the particles to a lower portion of the anti-glare layer and suppressing flowing down of the binder resin between projections based on the particles. For this reason, the Sa and the Vvv can be readily controlled to predetermined or greater values, and the Sal can be readily controlled to a predetermined or smaller value. In contrast, when the polyfunctional (meth)acrylate oligomer is used in an excessively high proportion, the strength of the anti-glare layer may be reduced in some cases. When the viscosity of the coating solution for the anti-glare layer is excessively high, the Vmp may be excessively increased or the Sal may be excessively reduced in some cases. For this reason, the ionizing radiation curable-resin composition preferably contains a predetermined amount of the polyfunctional (meth)acrylate oligomer and a predetermined amount of the polyfunctional (meth)acrylate monomer.

Solvent, Drying Conditions

To adjust the viscosity and enable dissolution or dispersion of the components, the anti-glare layer coating solution preferably contains a solvent. Because the surface profile of the anti-glare layer after application and drying is varied according to the type of the solvent, it is preferred that the solvent be selected considering the saturated vapor pressure of the solvent, the permeability of the solvent to the substrate, and the like.

Specifically, examples of the solvent include ketones (such as acetone, methyl ethyl ketone, methyl isobutyl ketone (MIBK), and cyclohexanone), ethers (dioxane and tetrahydrofuran), aliphatic hydrocarbons (such as hexane), alicyclic hydrocarbons (such as cyclohexane), aromatic hydrocarbons (such as toluene and xylene), halogenated carbons (such as dichloromethane and dichloroethane), esters (such as methyl acetate, ethyl acetate, and butyl acetate), alcohols (such as isopropanol, butanol, and cyclohexanol), cellosolves (such as methyl cellosolve and ethyl cellosolve), glycol ethers (such as propylene glycol monomethyl ether acetate), cellosolve acetates, sulfoxides (such as dimethyl sulfoxide), and amides (such as dimethylformamide and dimethylacetamide). Mixtures thereof may also be used.

The description in this paragraph is applied to both of the first embodiment and the second embodiment.

In the first embodiment, the solvent in the anti-glare layer coating solution preferably contains a solvent having a high evaporation rate, as the main component. A high evaporation rate of the solvent can suppress sinking of the particles to the lower portion of the anti-glare layer, and further can facilitate a suppression in flowing down of the binder resin between projections based on the particles. For this reason, the Sa and the Vvv can be readily controlled to predetermined or greater values, and the Sal can be readily controlled to a predetermined or smaller value.

The main component indicates that the content of the component is 50% by mass or more relative to the total amount of the solvent, and the content is preferably 70% by mass or more, more preferably 90% by mass or more, still more preferably 97% by mass or more.

In this specification, the solvent having a high evaporation rate indicates a solvent having an evaporation rate of 100 or more where the evaporation rate of butyl acetate is regarded as 100. The evaporation rate of the solvent having a high evaporation rate is more preferably 120 or more and 300 or less, still more preferably 150 or more and 220 or less.

Examples of the solvent having a high evaporation rate include methyl isobutyl ketone (evaporation rate: 160), toluene (evaporation rate: 200), and methyl ethyl ketone (evaporation rate: 370).

On the other hand, examples of a solvent having a low evaporation rate of less than 100 include cyclohexanone (evaporation rate: 32) and propylene glycol monomethyl ether acetate (evaporation rate: 44).

The description in this paragraph is applied to both of the first embodiment and the second embodiment.

In the first embodiment, the drying conditions are preferably controlled when the anti-glare layer is formed from the anti-glare layer coating solution.

The drying conditions can be controlled by the drying temperature and the air rate inside the dryer. The drying temperature is preferably 30° C. or more and 120° C. or less, and the air rate for drying is preferably 0.2 m/s or more and 50 m/s or less. To control the surface profile of the anti-glare layer by drying, irradiation with the ionizing radiation is suitably performed after the drying of the coating solution.

As the drying conditions, drying is preferably performed in two stages at a temperature and an air rate in the ranges specified above. Preferably, the drying in the second stage is performed at a higher drying temperature and a higher air rate than those in the drying in the first stage. Slow drying in the first stage can facilitate reflection of shapes of the amorphous inorganic particles on the surface of the binder resin when the surfaces of the amorphous inorganic particles are covered with the binder resin. By setting the drying temperature and the air rate in the second stage higher than those in the drying in the first stage, aggregation of the organic particles can be readily suppressed. Accordingly, by such two-stage drying, an excessive increase in Vmp can be readily suppressed, and the Sal can be readily controlled to a predetermined or smaller value.

In the drying in the first stage, preferably, the drying temperature is 30° C. or more and less than 60° C., and the air rate for drying is 0.2 m/s or more and less than 7 m/s. In the drying in the second stage, preferably, the drying temperature is 60° C. or more and 120° C. or less, and the air rate for drying is 7 m/s or more and 50 m/s or less.

<<Anti-Reflection Layer>>

In the first embodiment, the anti-reflection layer is preferably located on the outermost surface of the first surface side.

Examples of anti-reflection layers include those having a monolayer structure constituted with a low-refractive index layer; those having a two-layered structure constituted with a high-refractive index layer and a low-refractive index layer; and those having a multilayer structure such as a three- or more layered structure. The low-refractive index layer and the high-refractive index layer can be formed by a wet or dry process widely used. In the wet process, preferred are the monolayer structure or the two-layered structure. In the dry process, preferred is the multilayer structure.

The wet process is more excellent than the dry process with respect to production efficiency and resistance against chemicals.

In the optical film according to the present disclosure, to facilitate maintenance of the profile of depressions and projections of the anti-glare layer, the anti-reflection layer preferably has a monolayer structure constituted with a low-refractive index layer.

The description in this paragraph is applied to both of the first embodiment and the second embodiment.

Case of Monolayer Structure or Two-Layered Structure

The monolayer structure is constituted with a monolayer of a low-refractive index layer, and the two-layered structure is constituted with a high-refractive index layer and a low-refractive index layer. The monolayer structure or the two-layered structure is preferably formed by a wet process.

Examples of a method of forming the anti-reflection layer by a wet process include a method of forming the anti-reflection layer by a sol-gel method using a metal alkoxide or the like, a method of forming the anti-reflection layer by applying a low-refractive index resin such as a fluorinated resin, and a method of forming the anti-reflection layer by applying a coating solution containing low-refractive index particles or high-refractive index particles to a binder resin composition.

Among these wet processes, formation of the anti-reflection layer with a coating solution containing low-refractive index particles or high-refractive index particles to the binder resin composition is preferred for adhesion and scratch resistance. In other words, the low-refractive index layer preferably contains a binder resin and low-refractive index particles. The high-refractive index layer preferably contains a binder resin and high-refractive index particles.

The description in this paragraph is applied to both of the first embodiment and the second embodiment.

The lower limit of the refractive index of the low-refractive index layer is preferably 1.10 or more, more preferably 1.20 or more, still more preferably 1.26 or more, further still more preferably 1.28 or more, further still more preferably 1.30 or more, and the upper limit is preferably 1.48 or less, more preferably 1.45 or less, still more preferably 1.40 or less, further still more preferably 1.38 or less, further still more preferably 1.32 or less.

In this specification, the refractive index indicates the value at a wavelength of 550 nm.

The lower limit of the thickness of the low-refractive index layer is preferably 80 nm or more, more preferably 85 nm or more, still more preferably 90 nm or more, and the upper limit is preferably 150 nm or less, more preferably 110 nm or less, still more preferably 105 nm or less.

The description in this paragraph is applied to both of the first embodiment and the second embodiment.

To obtain more favorable scratch resistance, the binder resin for the low-refractive index layer preferably contains a cured product of a curable resin composition, such as a cured product of a thermosetting resin composition or a cured product of an ionizing radiation curable-resin composition, and more preferably contains a cured product of an ionizing radiation curable-resin composition.

The binder resin for the low-refractive index layer may contain a thermoplastic resin in the range not inhibiting the effects of the present disclosure.

Examples of the cured product of the curable resin composition for the low-refractive index layer include the same cured products of the curable resin compositions as those listed for the anti-glare layer.

The proportion of the cured product of the curable resin composition is preferably 80% by mass or more, more preferably 90% by mass or more, still more preferably 97% by mass or more relative to the total amount of the binder resin for the low-refractive index layer.

The description in this paragraph is applied to both of the first embodiment and the second embodiment.

In the first embodiment, the binder resin for the low-refractive index layer may contain a thermoplastic resin. The binder resin, when containing a thermoplastic resin, can increase the viscosity of the coating solution for a low-refractive index layer, obstructing flowing down of the coating solution for a low-refractive index layer between projections of the anti-glare layer. For this reason, by the binder resin containing a thermoplastic resin, the Sa and the Vvv can be readily controlled to predetermined or greater values, and the Sal can be controlled to a predetermined or smaller value. Furthermore, because organic Si and fluorine can be left near the surface of the first surface, the elemental ratios represented by Expressions 2 to 4 can be readily satisfied. In contrast, when the viscosity of the coating solution for a low-refractive index layer is excessively increased, defects may be caused on the surface of the anti-glare layer during application of the coating solution for the anti-reflection layer in some cases.

For the above-mentioned action and coating strength, the content of the thermoplastic resin is preferably 0.1% by mass or more and 3.0% by mass or less, more preferably 0.2% by mass or more and 1.5% by mass or less, still more preferably 0.3% by mass or more and 0.7% by mass or less relative to the total amount of the binder resin.

Examples of thermoplastic resins include polystyrene resins, polyolefin resins, ABS resins (including heat-resistant ABS resins), AS resins, AN resins, polyphenylene oxide resins, polycarbonate resins, polyacetal resins, acrylic resins, polyethylene terephthalate resins, polybutylene terephthalate resins, polysulfone resins, and polyphenylene sulfide resins. From the viewpoint of transparency, preferred are acrylic resins.

The thermoplastic resin has a weight average molecular weight preferably 20000 or more and 200000 or less, more preferably 30000 or more and 150000 or less, still more preferably 50000 or more and 100000 or less.

The description in this paragraph is applied to both of the first embodiment and the second embodiment.

Examples of low-refractive index particles include hollow particles and solid particles. Although the low-refractive index particles may contain only any one of hollow particles and solid particles, the low-refractive index particles preferably contain hollow particles to reduce the refractive index. To suppress a reduction in coating strength of the low-refractive index layer, the low-refractive index particles may further contain solid particles in addition to hollow particles. The effects of the present disclosure can be more readily demonstrated when solid particles are not contained and only hollow particles are contained.

Although a material for hollow particles and that for solid particles may be any one of inorganic compounds such as silica and magnesium fluoride and organic compounds, silica is preferred to reduce the refractive index and obtain strength. In other words, the low-refractive index layer preferably contains hollow silica particles. It is also preferable that the low-refractive index layer further contain solid silica particles in addition to hollow silica particles.

The description in this paragraph is applied to both of the first embodiment and the second embodiment.

The average primary particle diameter of the hollow particles is preferably smaller than the thickness of the low-refractive index layer, and is 1 nm or more and 150 nm or less, for example. The average primary particle diameter of the hollow particles is preferably 35 nm or more and 100 nm or less, more preferably 50 nm or more and 100 nm or less, still more preferably 60 nm or more and 80 nm or less.

The average primary particle diameter of the solid particles is preferably smaller than the thickness of the low-refractive index layer, and is 0.5 nm or more and 100 nm or less, for example. The average primary particle diameter of the solid particles is preferably 1 nm or more and 30 nm or less, more preferably 5 nm or more and 20 nm or less, still more preferably 10 nm or more and 15 nm or less.

The description in this paragraph is applied to both of the first embodiment and the second embodiment.

For the hollow particles, the solid particles described later, and the high-refractive index particles described later, the average primary particle diameter thereof is calculated by the steps (A1) to (A3).

(A1) A cross-section of an anti-reflective member is photographed with a TEM or an STEM. Preferably, the accelerating voltage of the TEM or STEM is set at 10 kv to 30 kV, and the magnification is set at 50000× to 300000×.

(A2) Any 10 particles are extracted from the image for observation, and the particle diameter of each of the particles is calculated. The particle diameter is measured as a distance between two straight lines which is the maximum distance, among combinations each formed of any two straight lines disposed parallel to each other to sandwich a cross-section of the particle.

(A3) The same operation is performed 5 times on an image for observation of the same sample on another screen, and the number average of 50 particle diameters in total is defined as the average primary particle diameter of the particles.

The description in this paragraph is applied to both of the first embodiment and the second embodiment.

A larger content of the hollow particles leads to an increase in filling rate of the hollow particles in the binder resin and a reduction in refractive index of the low-refractive index layer. For this reason, the content of the hollow particles is preferably 100 parts by mass or more, more preferably 150 parts by mass or more relative to 100 parts by mass of the binder resin.

On the other hand, when the content of the hollow particles is excessively large, the hollow particles are likely to be damaged or drop off, and the mechanical strength of the low-refractive index layer such as scratch resistance tends to be reduced. When the content of the hollow particles is excessively large, the relations represented by Expressions 2 and 3 above may be difficult to satisfy in some cases. For this reason, the content of the hollow particles is preferably 300 parts by mass or less, more preferably 250 parts by mass or less relative to 100 parts by mass of the binder resin.

To obtain favorable scratch resistance of the low-refractive index layer, the content of the solid particles is preferably 20 parts by mass or more, more preferably 40 parts by mass or more relative to 100 parts by mass of the binder resin.

On the other hand, when the content of the solid particles is excessively large, solid particles are likely to aggregate. When the content of the solid particles is excessively large, the relations represented by Expressions 2 and 3 above may be difficult to satisfy in some cases. For this reason, the content of the solid particles is preferably 100 parts by mass or less, more preferably 60 parts by mass or less relative to 100 parts by mass of the binder resin.

The description in this paragraph is applied to both of the first embodiment and the second embodiment.

In the first embodiment, for the first surface to readily satisfy the elemental ratios represented by Expressions 2 to 4 above, the low-refractive index layer preferably contains a leveling agent containing organic Si and fluorine.

The leveling agent containing organic Si and fluorine may be a compound containing organic Si and fluorine in the molecule. As the leveling agent containing organic Si and fluorine, a compound containing organic Si in the molecule may be used in combination with a compound containing fluorine in the molecule. To readily obtain favorable compatibility with the binder resin, the low-refractive index layer preferably contains a compound containing organic Si and fluorine in one molecule, as the leveling agent. The leveling agent preferably has a functional group reactive with the binder resin in the molecule.

The elemental ratios represented by Expressions 2 to 4 above can be adjusted mainly by the content of the leveling agent and the proportions of the organic Si and fluorine in the leveling agent. However, only by the content of the leveling agent and the proportions of the organic Si and fluorine in the leveling agent, it is difficult to control the amount of the coating solution for a low-refractive index layer that flows down between projections of the anti-glare layer. To readily satisfy the elemental ratios represented by Expressions 2 to 4 above, it is preferred that the amount of the coating solution for a low-refractive index layer that flows down between projections of the anti-glare layer be reduced by increasing the viscosity of the coating solution for a low-refractive index layer or controlling the drying conditions for the coating solution for a low-refractive index layer.

The description in this paragraph is applied to both of the first embodiment and the second embodiment.

A preferred content of the leveling agent is preferably adjusted according to the proportions of the organic Si and fluorine in the leveling agent to satisfy the elemental ratios represented by Expressions 2 to 4 above.

In an embodiment according to the present disclosure, the content of the leveling agent is preferably 10% by mass or more and 40% by mass or less, more preferably 15% by mass or more and 40% by mass or less, still more preferably 20% by mass or more and 40% by mass or less relative to the total solid content in the low-refractive index layer.

The description in this paragraph is applied to both of the first embodiment and the second embodiment.

The high-refractive index layer is preferably disposed closer to the anti-glare layer than the low-refractive index layer is.

The lower limit of the refractive index of the high-refractive index layer is preferably 1.53 or more, more preferably 1.54 or more, still more preferably 1.55 or more, further still more preferably 1.56 or more, and the upper limit is preferably 1.85 or less, more preferably 1.80 or less, still more preferably 1.75 or less, further still more preferably 1.70 or less.

The upper limit of the thickness of the high-refractive index layer is preferably 200 nm or less, more preferably 180 nm or less, still more preferably 150 nm or less, and the lower limit is preferably 50 nm or more, more preferably 70 nm or more.

Examples of binder resins for the high-refractive index layer include the same binder resins as those for the low-refractive index layer.

Examples of the high-refractive index particles include antimony pentoxide, zinc oxide, titanium oxide, cerium oxide, tin-doped indium oxide, antimony-doped tin oxide, yttrium oxide, and zirconium oxide.

The average primary particle diameter of the high-refractive index particles is preferably 2 nm or more, more preferably 5 nm or more, still more preferably 10 nm or more. From the viewpoint of suppression of whitening and transparency, the average primary particle diameter of the high-refractive index particles is preferably 200 nm or less, more preferably 100 nm or less, still more preferably 80 nm or less, further still more preferably 60 nm or less, further still more preferably 30 nm or less.

It is sufficient that the content of the high-refractive index particles is a content providing the above-mentioned range of the refractive index of the high-refractive index layer.

The description in this paragraph is applied to both of the first embodiment and the second embodiment.

When the anti-reflection layer such as the low-refractive index layer and the high-refractive index layer is formed by the wet process, preferably, the viscosity of the coating solution for the anti-reflection layer is increased. By increasing the viscosity of the coating solution for the anti-reflection layer, the coating solution for the anti-reflection layer is difficult to flow down between projections of the anti-glare layer. Thus, the surface profile of the anti-glare layer can be readily maintained even if the anti-reflection layer is formed on the anti-glare layer. For this reason, by appropriately increasing the viscosity of the coating solution for the anti-reflection layer, the Sa and the Vvv can be readily controlled to predetermined or greater values and the Sal can be controlled to a predetermined or smaller value. Furthermore, because organic Si and fluorine can be left near the surface of the first surface, the elemental ratios represented by Expressions 2 to 4 can be readily satisfied. The viscosity of the coating solution for the anti-reflection layer can be increased, for example, by adding a thermoplastic resin as a binder resin, by increasing the proportion of the oligomer as the ionizing radiation curable-resin composition, or by selecting a solvent having high viscosity as the solvent.

In contrast, when the viscosity of the coating solution for the anti-reflection layer is excessively increased, defects may be caused on the surface of the anti-glare layer during application of the coating solution for the anti-reflection layer in some cases.

For this reason, the viscosity at 23° C. of the coating solution for the anti-reflection layer is preferably 0.1 mPa·s or more and 5.0 mPa·s or less.

Examples of solvents for the coating solution for the anti-reflection layer include the same solvents as those listed in the embodiment of the coating solution for the anti-glare layer.

When the anti-glare layer is formed from the anti-reflection layer coating solution, the drying conditions are preferably controlled.

The drying conditions can be controlled by the drying temperature and the air rate inside the dryer. The drying temperature is preferably 30° C. or more and 70° C. or less, and the air rate for drying is preferably 10 m/s or more and 30 m/s or less. By setting the drying temperature at a low temperature, the viscosity of the coating solution for the anti-reflection layer can be readily increased. By increasing the air rate, the viscosity of the coating solution for the anti-reflection layer can be increased quickly. Accordingly, by drying the coating solution for the anti-reflection layer at a relatively low temperature and a high air rate, flowing down of the coating solution for the anti-reflection layer between projections of the anti-glare layer can be obstructed. In other words, by drying the coating solution for the anti-reflection layer at a relatively low temperature and a high air rate, the surface profile of the first surface such as the Sa can be readily controlled to fall within the ranges above, and the relations represented by Expression 1 to 4 can be readily satisfied.

The irradiation with the ionizing radiation is suitably performed after the coating solution for the anti-reflection layer is dried.

Case of Multilayer Structure Such as Three—or Higher Layered Structure

The multilayer structure preferably formed by the dry process has a laminate configuration of three or more layers in total in which the high-refractive index layer and the low-refractive index layer are alternately disposed. Even in the multilayer structure, the low-refractive index layer is preferably disposed on the outermost surface of the optical film.

The high-refractive index layer has a thickness of preferably 10 nm or more and 200 nm or less, and has a refractive index of preferably 2.10 or more and 2.40 or less. The high-refractive index layer more preferably has a thickness of 20 nm or more and 70 nm or less.

The low-refractive index layer has a thickness of preferably 5 nm or more and 200 nm or less, and a refractive index of preferably 1.33 or more and 1.53 or less. The low-refractive index layer more preferably has a thickness of 20 nm or more and 120 nm or less.

The description in this paragraph is applied to both of the first embodiment and the second embodiment.

<Optical Properties>

The optical film according to the first embodiment preferably has a total luminous reflectance $R_{SCI}$ of 3.0% or less measured by the following method.

[Measurement of Total Luminous Reflectance ($R_{SCI}$)]

The method comprises: bonding a black plate to the second surface of the optical film with a transparent adhesive to prepare a sample; and measuring the total luminous reflectance ($R_{SCI}$) of the optical film side of the sample as a light incident surface.

By controlling $R_{SCI}$ to 3.0% or less, blackness of the black display unit can be readily enhanced under an environment where light with strong illuminance does not enter the first surface, and thus favorable contrast can be readily obtained. The $R_{SCI}$ of the optical film is more preferably 2.5% or less, still more preferably 2.0% or less. The lower limit of the $R_{SCI}$ of the optical film, although not particularly limited, is usually 0.1% or more.

Usually, when the $R_{SCI}$ is 3.0% or less, the difference between reflectance of portions having fingerprint components and that of portions without fingerprint components is likely to increase to significantly reduce the appearance of the optical film. However, because the optical film according to the present disclosure satisfies the relation represented by Expression 1 and thus has favorable fingerprints wiping off properties, a reduction in appearance of the optical film can be readily suppressed even if the $R_{SCI}$ is 3.0% or less.

$R_{SCI}$ represents reflected light measured by radiating light from every direction to the surface of a sample using an integrating sphere, and closing a light trap corresponding to the regular reflection direction.

A representative $R_{SCI}$ measurement apparatus has a configuration in accordance with the geometric condition c in JIS Z8722:2009. More specifically, in the representative $R_{SCI}$ measurement apparatus, D65 is used as a light source for the integrating sphere spectrophotometer, the light receiver is located in a position forming +8 degrees with the normal line of the sample, the aperture angle of the light receiver is 10 degrees, the light trap is located in a position forming −8 degrees with the normal line of the sample, and the view angle is 2 degrees or 10 degrees. In this specification, the view angle is set at 2 degrees.

Examples of the measurement apparatus satisfying the conditions above include an integrating sphere spectrophotometer (trade name: CM-2002) available from KONICA MINOLTA, INC.

The description in this paragraph is applied to both of the first embodiment and the second embodiment.

The difference between the refractive index of the transparent adhesive in the sample and that of the layer on the second surface side of the optical film is preferably within 0.05, more preferably within 0.03, still more preferably within 0.01. The difference between the refractive index of the transparent adhesive in the sample and that of the binder resin in the black plate is preferably within 0.05, more preferably within 0.03, still more preferably within 0.01.

The description in this paragraph is applied to both of the first embodiment and the second embodiment.

The total light transmittance of the optical film specified in JIS K7361-1:1997 is preferably 80% or more, more preferably 85% or more, still more preferably 90% or more.

The light incident surface in measurement of the total light transmittance and the haze is the second surface of the optical film.

The description in this paragraph is applied to both of the first embodiment and the second embodiment.

In the optical film, preferably, the haze specified in JIS K7136:2000 is 20% or more and 75% or less. The lower limit of the haze is more preferably 30% or more, still more preferably 40% or more, further still more preferably 50% or more, and the upper limit is more preferably 70% or less, still more preferably 65% or less.

By controlling the haze to 20% or more, favorable anti-glare properties can be readily obtained. By controlling the haze to 75% or less, a reduction in resolution of images can be readily suppressed.

In an embodiment, the haze of the optical film falls within the ranges of 20% or more and 75% or less, 20% or more and 70% or less, 20% or more and 65% or less, 30% or more and 75% or less, 30% or more and 70% or less, 30% or more and 65% or less, 40% or more and 75% or less, 40% or more and 70% or less, 40% or more and 65% or less, 50% or more and 75% or less, 50% or more and 70% or less, and 50% or more and 65% or less.

The description in this paragraph is applied to both of the first embodiment and the second embodiment.

To obtain a high resolution of images and favorable contrast, the optical film has an internal haze of preferably 20% or less, more preferably 15% or less, still more preferably 10% or less.

The internal haze can be measured by a method widely used, for example, by filling the depressions and projections on the first surface by bonding a transparent sheet onto the first surface of the optical film with a transparent adhesive agent layer.

The description in this paragraph is applied to both of the first embodiment and the second embodiment.

For the transmissive image clarity of the optical film measured according to JIS K7374:2007, where the transmissive image clarity when the width of the optical comb is 0.125 mm is defined as $C_{0.125}$, that when the width of the optical comb is 0.25 mm is defined as $C_{0.25}$, that when the width of the optical comb is 0.5 mm is defined as $C_{0.5}$, that when the width of the optical comb is 1.0 mm is defined as $C_{1.0}$, and that when the width of the optical comb is 2.0 mm is defined as $C_{2.0}$, the values of $C_{0.125}$, $C_{0.25}$, $C_{0.5}$, $C_{1.0}$, and $C_{2.0}$ preferably fall within the ranges below.

To obtain favorable anti-glare properties, $C_{0.125}$ is preferably 50% or less, more preferably 40% or less, still more preferably 30% or less, further still more preferably 20% or less. To obtain a high resolution, $C_{0.125}$ is preferably 1.0% or more. The range of $C_{0.125}$ is, for example, 1.0% or more and 50% or less, 1.0% or more and 40% or less, 1.0% or more and 30% or less, or 1.0% or more and 20% or less.

To obtain favorable anti-glare properties, $C_{0.25}$ is preferably 50% or less, more preferably 40% or less, still more preferably 30% or less, further still more preferably 20% or less. To obtain a high resolution, $C_{0.25}$ is preferably 1.0% or more. The range of $C_{0.25}$ is, for example, 1.0% or more and 50% or less, 1.0% or more and 40% or less, 1.0% or more and 30% or less, or 1.0% or more and 20% or less.

To obtain favorable anti-glare properties, $C_{0.5}$ is preferably 50% or less, more preferably 40% or less, still more preferably 30% or less, further still more preferably 20% or less. To obtain a high resolution, $C_{0.5}$ is preferably 1.0% or more. The range of $C_{0.5}$ is, for example, 1.0% or more and 50% or less, 1.0% or more and 40% or less, 1.0% or more and 30% or less, or 1.0% or more and 20% or less.

To obtain favorable anti-glare properties, $C_{1.0}$ is preferably 50% or less, more preferably 40% or less, still more preferably 30% or less, further still more preferably 20% or less. To obtain a high resolution, $C_{1.0}$ is preferably 1.0% or more. The range of $C_{1.0}$ is, for example, 1.0% or more and 50% or less, 1.0% or more and 40% or less, 1.0% or more and 30% or less, or 1.0% or more and 20% or less.

To obtain favorable anti-glare properties, $C_{2.0}$ is preferably 50% or less, more preferably 40% or less, still more preferably 30% or less, further still more preferably 20% or less. To obtain a high resolution, $C_{2.0}$ is preferably 5.0% or more. The range of $C_{2.0}$ is, for example, 5.0% or more and 50% or less, 5.0% or more and 40% or less, 5.0% or more and 30% or less, or 5.0% or more and 20% or less.

The description in this paragraph is applied to both of the first embodiment and the second embodiment.

To obtain favorable anti-glare properties, in the optical film, the total of $C_{0.125}$, $C_{0.5}$, $C_{1.0}$, and $C_{2.0}$ is preferably 200% or less, more preferably 150% or less, still more preferably 100% or less, further still more preferably 80% or less. To obtain a high resolution, the total is preferably 10.0% or more. The range of the total is, for example, 10.0% or more and 200% or less, 10.0% or more and 150% or less, 10.0% or more and 100% or less, or 10.0% or more and 80% or less.

The description in this paragraph is applied to both of the first embodiment and the second embodiment.

<Size, Shape, and the Like>

The optical film may be in a sheet-like form cut into a predetermined size, or may be in a roll-like form of an elongated sheet wound into a roll. Although the sheet can have any size, the maximum diameter is about 2 inches or more and 500 inches or less. The "maximum diameter" indicates the maximum length between any two points in the optical film when they are connected. For example, when the optical film is in a rectangular shape, the diagonal line of the region corresponds to the maximum diameter. When the optical film is in a circular shape, the diameter of the circle corresponds to the maximum diameter.

Although the width and length of the roll-like form are not particularly limited, usually, the width is about 500 mm or more and 3000 mm or less, and the length is about 500 m or more and 5000 m or less. The optical film in the roll-like form, when used, can be cut into sheets according to the size of the image display device. When the optical film is cut, preferably, roll ends having unstable physical properties are removed.

The sheet can have any shape, and examples of the shape include polygonal shapes such as triangular, rectangular, and pentagonal shapes, circular shapes, and random amorphous shapes. More specifically, when the optical film is in a rectangular shape, the optical film can have any aspect ratio as long as it causes no problems as the display screen. Examples of the aspect ratio include width:length=1:1, 4:3, 16:10, 16:9, or 2:1, but not limited thereto in applications to in-vehicle display screens and digital signages having a variety of design.

Although the surface profile of the second surface of the optical film is not particularly limited, it is preferably substantially smooth. The term "substantially smooth" indicates that the arithmetic mean roughness Ra at a cutoff value of 0.8 mm specified in JIS B0601:1994 is less than 0.03 μm, and preferably the arithmetic mean roughness is 0.02 μm or less.

The description in this paragraph is applied to both of the first embodiment and the second embodiment.

[Method of Producing Optical Film According to First Embodiment]

The method of producing an optical film according to the first embodiment of the present disclosure is a method of producing the optical film in the present disclosure described above, the method comprising: a first step of forming an anti-glare layer on a substrate; and a second step of forming an anti-reflection layer on the anti-glare layer.

Examples of the method of forming the anti-glare layer on a substrate include (A) a method using an emboss roll, (B) an etching treatment, (C) molding using a mold, and (D) forming a coating by application, which are described above.

In the case of the method (A), for example, the anti-glare layer can be formed on the substrate by forming a resin layer on the substrate, followed by shaping from the resin layer side using an emboss roll.

In the case of the method (B), for example, the anti-glare layer can be formed on the substrate by forming a layer of a light curable resin on the substrate, followed by photo-etching.

In the case of the method (C), for example, the anti-glare layer can be formed on the substrate by casting a resin into a mold, extracting the molded resin from the mold, and placing the resin on the substrate.

In the case of the method (D), for example, the anti-glare layer can be formed on the substrate by forming a coating on the substrate by the above-mentioned method (d1) or (d2).

Examples of the method of forming the anti-reflection layer on the anti-glare layer include the above-mentioned wet or dry processes.

[Polarization Plate According to First Embodiment]

The polarization plate according to the first embodiment of the present disclosure is a polarization plate comprising a polarizer, a first transparent protective plate disposed on one side of the polarizer, and a second transparent protective plate disposed on the other side of the polarizer, wherein at least one of the first transparent protective plate and the second transparent protective plate is the above-mentioned optical film according to the first embodiment of the present disclosure, and the second surface of the optical film is disposed facing the polarizer.

<Polarizer>

Examples of polarizers include sheet type polarizers such as polyvinyl alcohol films, polyvinyl formal films, polyvinyl acetal films, and ethylene-vinyl acetate copolymer saponified films which are dyed with iodine or the like, and stretched; wire grid-type polarizers formed of a large number of metal wires arranged in parallel; coating type polarizers to which lyotropic liquid crystals or a dichroic guest-host material is applied; and multilayered thin film polarizers. These polarizers may be reflective polarizers having a function to reflect non-transmissive polarization components.

The description in this paragraph is applied to both of the first embodiment and the second embodiment.

<Transparent Protective Plates>

A first transparent protective plate is disposed on one side of the polarizer, and a second transparent protective plate is disposed on the other side thereof. At least one of the first transparent protective plate and the second transparent protective plate is the above-mentioned optical film according to the first embodiment of the present disclosure.

In the polarization plate according to the present disclosure, one of the first transparent protective plate and the second transparent protective plate may be the above-mentioned optical film according to the first embodiment of the present disclosure, or both of the first transparent protective plate and the second transparent protective plate may be the above-mentioned optical film according to the first embodiment of the present disclosure.

A general-purpose plastic film, glass or the like can be used as a transparent protective plate which is not the optical film according to the first embodiment of the present disclosure among the first transparent protective plate and the second transparent protective plate.

The polarizer is preferably bonded to the transparent protective plates with an adhesive. The adhesive to be used can be a general-purpose adhesive, and a PVA adhesive is preferred.

[Surface Plate for Image Display Device According to First Embodiment]

The surface plate for an image display device according to the first embodiment of the present disclosure is a surface plate for an image display device, comprising a protective film bonded onto a resin plate or a glass plate, wherein the protective film is the above-mentioned optical film according to the first embodiment of the present disclosure, and the second surface of the optical film is disposed facing the resin plate or the glass plate.

The resin plate or glass plate to be used can be a resin plate or glass plate widely used as a surface plate for the image display device.

To obtain high strength, the thickness of the resin plate or the glass plate is preferably 10 µm or more. The upper limit of the thickness of the resin plate or the glass plate is usually 5000 µm or less. To reduce the thickness, the upper limit of the thickness of the resin plate or the glass plate is preferably 1000 µm or less, more preferably 500 µm or less, still more preferably 100 µm or less.

In an embodiment, the range of the thickness of the resin plate or the glass plate falls within the ranges of 10 µm or more and 5000 µm or less, 10 µm or more and 1000 µm or less, 10 µm or more and 500 µm or less, and 10 µm or more and 100 µm or less, for example.

The description in this paragraph is applied to both of the first embodiment and the second embodiment.

[Image Display Panel of First Embodiment]

The image display panel according to the first embodiment of the present disclosure is an image display panel comprising a display element, and an optical film disposed on a light-emitting surface side of the display element, wherein, as the optical film, the above-mentioned optical film according to the first embodiment of the present disclosure is included (see FIG. 2).

In the image display panel, the optical film according to the first embodiment of the present disclosure is preferably disposed such that the second surface thereof faces the display element side.

In the image display panel, the optical film according to the first embodiment of the present disclosure is preferably disposed on the outermost surface of the display element on the light-emitting surface side.

Examples of the display element include liquid crystal display elements, EL display elements (organic EL display elements, inorganic EL display elements), and plasma display elements. Furthermore, examples thereof include LED display elements such as micro LED display elements. These display elements may have a touch panel function inside thereof.

Examples of liquid crystal display methods for liquid crystal display elements include an IPS method, a VA method, a multi-domain method, an OCB method, an STN method, and a TSTN method.

The image display panel according to the present disclosure may be an image display panel with a touch panel, comprising a touch panel between the display element and the optical film.

Although the image display panel can have any size, the maximum diameter is about 2 inches or more and 500 inches or less. The maximum diameter indicates the maximum length between any two points in a plane of the image display panel when they are connected.

The description in this paragraph is applied to both of the first embodiment and the second embodiment.

[Image Display Device According to First Embodiment]

The image display device according to the first embodiment of the present disclosure comprises the image display panel according to the first embodiment of the present disclosure.

The image display device according to the first embodiment of the present disclosure is not particularly limited as long as it comprises the image display panel according to the first embodiment of the present disclosure. Preferably, the image display device according to the first embodiment of the present disclosure includes the image display panel according to the first embodiment of the present disclosure, a drive controller electrically connected to the image display panel, and a housing which accommodates these.

When the display element is a liquid crystal display element, the image display device according to the present disclosure needs a backlight. The backlight is disposed on the side opposite to the light-emitting surface side of the liquid crystal display element.

Although the image display device can have any size, the maximum diameter of the effective display region is about 2 inches or more and 500 inches or less.

The effective display region of the image display device is a region which can display an image. For example, when the image display device comprises a housing surrounding the display element, the region inside the housing corresponds to the effective image region.

The maximum diameter of the effective image region indicates the maximum length between any two points inside the effective image region when they are connected. For example, when the effective image region is in a rectangular shape, the diagonal line of the region corresponds to the maximum diameter. When the effective image region is in a circular shape, the diameter of the region corresponds to the maximum diameter.

The description in this paragraph is applied to both of the first embodiment and the second embodiment.

[Method of Selecting Optical Film According to First Embodiment]

In the method of selecting an optical film according to the first embodiment of the present disclosure, the optical film satisfying the selection conditions below is selected.

(Optical Film Selection Conditions)

The optical film has a first surface, and a second surface which is a surface opposite to the first surface,
wherein the optical film comprises an anti-reflection layer and an anti-glare layer in this order from the first surface to the second surface,
the first surface has a profile of depressions and projections,
the first surface has an arithmetic mean height Sa of 0.05 μm or more specified in ISO 25178-2:2012, and
the first surface satisfies the relation represented by the following Expression 1:

$$Sw \times Vmp \leq 2.00 \quad \text{(Expression 1)}$$

wherein "Sw" represents a tilt angle (degrees) of 30 μl pure water droplet flowing down on the first surface; and "Vmp" represents a value of a peak material volume (ml/m$^2$) of the first surface specified in ISO 25178-2:2012.

The method of selecting an optical film according to the first embodiment of the present disclosure may have additional selection conditions. Examples of the additional selection conditions include those for the optical film according to the first embodiment as a suitable embodiment. Specifically, examples thereof include additional selection conditions A to D:

A: the Vmp is 0.005 ml/m$^2$ or more and 0.100 ml/m$^2$ or less;

B: the optical film comprises the anti-reflection layer, the anti-glare layer, and a substrate in this order from the first surface to the second surface;

C: the elemental ratios satisfy the relations represented by Expressions 2 to 4 below:

$$3.5 \leq F/\text{inorganic } Si \leq 10.0 \quad \text{(Expression 2)}$$

$$0.08 \leq \text{organic } Si/\text{inorganic } Si \leq 1.00 \quad \text{(Expression 3)}$$

$$5.0 \leq F/\text{organic } Si \leq 50.0 \quad \text{(Expression 4); and}$$

D: the total luminous reflectance $R_{SCI}$ measured by the following method is 3.0% or less.

[Measurement of Total Luminous Reflectance ($R_{SCI}$)]

the method comprising bonding a black plate to the second surface of the optical film with a transparent adhesive to prepare a sample; and measuring the total luminous reflectance ($R_{SCI}$) of the optical film side of the sample as a light incident surface.

The method of selecting an optical film according to the first embodiment of the present disclosure can efficiently select an optical film having high anti-glare properties and favorable fingerprints wiping off properties.

[Optical Film According to Second Embodiment]

The optical film according to a second embodiment of the present disclosure is:

an optical film having a first surface, and a second surface which is a surface opposite to the first surface,
wherein the optical film comprises an anti-reflection layer and an anti-glare layer in this order from the first surface to the second surface,
the first surface has a profile of depressions and projections,
the first surface has a dale void volume Vvv of 0.005 ml/m$^2$ or more specified in ISO 25178-2:2012, and
has a drop contact angle of 30.0 degrees or more measured by the following method.

<Measurement of Drop Contact Angle> dropping a droplet having a surface tension of 30 mN/m onto the first surface of the optical film from a height of 45 mm, where the droplet is dropped in a direction vertical to the first surface; and measuring a static contact angle by a θ/2 method after 10 seconds after the droplet has reached the first surface.

FIG. 4 is a cross-sectional schematic view of a cross-sectional shape of an optical film 100 according to the second embodiment of the present disclosure.

The optical film 100 illustrated in FIG. 4 has a first surface having a profile of depressions and projections, and a second surface which is opposite to the first surface. In FIG. 4, the upper surface is the first surface, and the lower surface is the second surface.

The optical film illustrated in FIG. 4 comprises an anti-reflection layer 30, an anti-glare layer 20, and a substrate 10 in this order from the first surface to the second surface.

FIG. 4 is a schematic sectional view. In other words, the scales of the layers forming the optical film 100 and that of the profile of depressions and projections are schematic for facilitating illustration, and are different from actual scales thereof. The same is also applied to FIG. 5.

The optical film according to the second embodiment of the present disclosure can have any laminate configuration other than that illustrated in FIG. 1. For example, the optical film according to the second embodiment of the present disclosure may have a laminate configuration without a substrate. The optical film according to the second embodiment of the present disclosure may comprise a layer other than the substrate, the anti-glare layer and the anti-reflection layer.

<First Surface>

The optical film according to the second embodiment of the present disclosure has a first surface. In the optical film according to the second embodiment of the present disclosure, the surface of the anti-reflection layer is preferably the first surface.

The first surface of the optical film according to the second embodiment has a profile of depressions and projections, and has a dale void volume Vvv of 0.005 ml/m$^2$ or more specified in ISO 25178-2:2012. When the first surface has no profile of depressions and projections, the optical film cannot have favorable anti-glare properties. The optical film can readily have favorable anti-glare properties by controlling the Vvv to 0.005 ml/m$^2$ or more in the first surface having a profile of depressions and projections.

The Vvv is preferably 0.007 ml/m$^2$ or more, more preferably 0.010 ml/m$^2$ or more, still more preferably 0.020 ml/m$^2$ or more, further still more preferably 0.030 ml/m$^2$ or more.

An excessive large Vvv tends to make it difficult to control the drop contact angle to 30.0 degrees or more. For this reason, the Vvv is preferably 0.100 ml/m$^2$ or less, more preferably 0.080 ml/m$^2$ or less, still more preferably 0.060 ml/m$^2$ or less, further still more preferably 0.045 ml/m$^2$ or less.

In an embodiment, the Vvv of the first surface falls within the ranges of 0.005 ml/m$^2$ or more and 0.100 ml/m$^2$ or less, 0.005 ml/m$^2$ or more and 0.080 ml/m$^2$ or less, 0.005 ml/m$^2$ or more and 0.060 ml/m$^2$ or less, 0.005 ml/m$^2$ or more and 0.045 ml/m$^2$ or less, 0.007 ml/m$^2$ or more and 0.100 ml/m$^2$ or less, 0.007 ml/m$^2$ or more and 0.080 ml/m$^2$ or less, 0.007 ml/m$^2$ or more and 0.060 ml/m$^2$ or less, 0.007 ml/m$^2$ or more and 0.045 ml/m$^2$ or less, 0.010 ml/m$^2$ or more and 0.100 ml/m$^2$ or less, 0.010 ml/m$^2$ or more and 0.080 ml/m$^2$ or less, 0.010 ml/m$^2$ or more and 0.060 ml/m$^2$ or less, 0.010 ml/m$^2$ or more and 0.045 ml/m$^2$ or less, 0.020 ml/m$^2$ or more and 0.100 ml/m$^2$ or less, 0.020 ml/m$^2$ or more and 0.080 ml/m$^2$ or less, 0.020 ml/m$^2$ or more and 0.060 ml/m$^2$ or less, 0.020 ml/m$^2$ or more and 0.045 ml/m$^2$ or less, 0.030 ml/m$^2$ or more and 0.100 ml/m$^2$ or less, 0.030 ml/m$^2$ or more and 0.080 ml/m$^2$ or less, 0.030 ml/m$^2$ or more and 0.060 ml/m$^2$ or less, and 0.030 ml/m$^2$ or more and 0.045 ml/m$^2$ or less, for example.

The first surface of the optical film according to the second embodiment has a drop contact angle of 30.0 degrees or more measured by the following method.

<Measurement of Drop Contact Angle> dropping a droplet having a surface tension of 30 mN/m onto the first surface of the optical film from a height of 45 mm, where the droplet is dropped in a direction vertical to the first surface; and measuring a static contact angle by a θ/2 method after 10 seconds after the droplet has reached the first surface.

Favorable fingerprints wiping off properties can be readily obtained by controlling the drop contact angle of the first surface to 30.0 degrees or more. The relation between the drop contact angle and the fingerprints wiping off properties will be described below.

In measurement of the drop contact angle according to the present disclosure, a droplet is dropped onto the first surface of the optical film from a height of 45 mm. Because the droplet dropped onto the first surface is in a shape crushed due to the impact when dropping, the contact angle of the droplet immediately after the dropping is likely to become small. In particular, in the case of an optical film having a profile of depressions and projections where the Vvv is a predetermined or greater value, the droplet is likely to be wettable and spread, and therefore the contact angle of the droplet immediately after the dropping is more likely to become small.

It is difficult to wipe off the droplet in a crushed shape present on the first surface of the optical film. In the measurement of the drop contact angle according to the present disclosure, the static contact angle after 10 seconds after the droplet has reached the first surface is measured by the θ/2 method. The optical film according to the present disclosure has a drop contact angle of 30.0 degrees or more. In other words, the optical film according to the second embodiment of the present disclosure having a drop contact angle of 30.0 degrees or more indicates that the droplet crushed due to the impact when dropping reverts to a shape nearly spherical. For this reason, favorable fingerprints wiping off properties can be obtained in spite of the optical film according to the second embodiment of the present disclosure having a profile of depressions and projections where the Vvv is 0.005 ml/m$^2$ or more.

When the surface of the optical film is touched by fingers, fingerprint components penetrate into the profile of depressions and projections due to the pressure applied when touching. The droplet is dropped from a height of 45 mm in the measurement of the drop contact angle according to the present disclosure because the above-mentioned phenomenon (phenomenon that fingerprint components penetrate into the profile of depressions and projections due to the pressure) is considered.

In the measurement of the drop contact angle, the amount of the droplet to be dropped is 5.0 µl.

The fingerprints contain not only water but also sebum or the like. For this reason, in the measurement of the drop contact angle according to the present disclosure, a liquid having a surface tension of 30 mN/m is used, but not pure water. In this specification, a liquid having the following composition was used as the liquid having a surface tension of 30 mN/m. In this specification, the surface tension indicates the value measured by a Wilhelmy surface tension meter specified in JIS K2241:2017.

<Composition of Liquid Having Surface Tension of 30 mN/m>

A liquid comprising 100% by mass of ethylene glycol monoethyl ether.

The drop contact angle is preferably 40.0 degrees or more, more preferably 45.0 degrees or more, still more preferably 50.0 degrees or more.

When the drop contact angle is excessively large, it is likely that the contents of the fluorine-based compound and the silicone-based compound in the anti-reflection layer increase and the scratch resistance of the optical film reduces. For this reason, the drop contact angle is preferably 70.0 degrees or less, more preferably 60.0 degrees or less, still more preferably 55.0 degrees or less.

In an embodiment, the drop contact angle of the first surface falls within the ranges of 30.0 degrees or more and 70.0 degrees or less, 30.0 degrees or more and 60.0 degrees or less, 30.0 degrees or more and 55.0 degrees or less, 40.0 degrees or more and 70.0 degrees or less, 40.0 degrees or more and 60.0 degrees or less, 40.0 degrees or more and 55.0 degrees or less, 45.0 degrees or more and 70.0 degrees or less, 45.0 degrees or more and 60.0 degrees or less, 45.0 degrees or more and 55.0 degrees or less, 50.0 degrees or more and 70.0 degrees or less, 50.0 degrees or more and 60.0 degrees or less, and 50.0 degrees or more and 55.0 degrees or less, for example.

In the optical film according to the second embodiment of the present disclosure, the pure water contact angle of the first surface is preferably 100 degrees or more and 120 degrees or less, more preferably 110 degrees or more and 115 degrees or less.

In the second embodiment, the first surface of the optical film according to the present disclosure preferably has a ratio of the Vvv to the Vvc (Vvv/Vvc) of 0.10 or less, the Vvc being the core void volume specified in ISO 25178-2:2012. By controlling the ratio Vvv/Vvc to 0.10 or less, more favorable fingerprints wiping off properties can be readily obtained. The ratio Vvv/Vvc is more preferably 0.09 or less, still more preferably 0.08 or less.

In the second embodiment, in the first surface of the optical film according to the present disclosure, the peak material volume Vmp specified in ISO 25178-2:2012 is preferably 0.005 ml/m² or more and 0.100 ml/m² or less.

By controlling the Vmp of the first surface to 0.005 ml/m² or more, favorable anti-glare properties can be readily obtained. The Vmp is more preferably 0.007 ml/m² or more, still more preferably 0.010 ml/m² or more, further still more preferably 0.020 ml/m² or more.

By controlling the Vmp of the first surface to 0.100 ml/m² or less, favorable scratch resistance of the optical film can be readily obtained. The Vmp is more preferably 0.080 (ml/m²) or less, still more preferably 0.060 (ml/m²) or less, further still more preferably 0.045 (ml/m²) or less.

In the second embodiment, the first surface of the optical film according to the present disclosure preferably has a minimum autocorrelation length Sal of 4.0 µm or more and 12.0 µm or less specified in ISO 25178-2:2012.

By controlling the Sal to 4.0 µm or more, more favorable fingerprints wiping off properties can be readily obtained. By controlling the Sal to 12.0 µm or less, more favorable anti-glare properties can be readily obtained.

The lower limit of the Sal is more preferably 5.0 µm or more, still more preferably 6.0 µm or more. The upper limit of the Sal is more preferably 11.0 µm or less, still more preferably 10.0 µm or less.

In the second embodiment, the first surface of the optical film according to the present disclosure preferably has a peak extreme height Sxp of 0.15 µm or more and 2.00 µm or less specified in ISO 25178-2:2012.

The Sxp is a parameter indicating the difference between the average plane of the profile of depressions and projections and the projections after particularly high projections are removed from the profile of depressions and projections. By controlling the Sxp to 0.15 µm or more, favorable anti-glare properties can be readily obtained. By controlling the Sxp to 2.00 µm or less, more favorable fingerprints wiping off properties can be readily obtained.

The lower limit of the Sxp is more preferably 0.20 µm or more, still more preferably 0.25 µm or more, further still more preferably 0.50 µm or more, further still more preferably 0.70 µm or more. The upper limit of the Sxp is more preferably 1.80 µm or less, still more preferably 1.50 µm or less, further still more preferably 1.40 µm or less.

In an embodiment, the Sxp of the first surface falls within the ranges of 0.15 µm or more and 2.00 µm or less, 0.15 µm or more and 1.80 µm or less, 0.15 µm or more and 1.50 µm or less, 0.15 µm or more and 1.40 µm or less, 0.20 µm or more and 2.00 µm or less, 0.20 µm or more and 1.80 µm or less, 0.20 µm or more and 1.50 µm or less, 0.20 µm or more and 1.40 µm or less, 0.25 µm or more and 2.00 µm or less, 0.25 µm or more and 1.80 µm or less, 0.25 µm or more and 1.50 µm or less, 0.25 µm or more and 1.40 µm or less, 0.50 µm or more and 2.00 µm or less, 0.50 µm or more and 1.80 µm or less, 0.50 µm or more and 1.50 µm or less, 0.50 µm or more and 1.40 µm or less, 0.70 µm or more and 2.00 µm or less, 0.70 µm or more and 1.80 µm or less, 0.70 µm or more and 1.50 µm or less, and 0.70 µm or more and 1.40 µm or less, for example.

In the second embodiment, the optical film according to the present disclosure preferably has elemental ratios obtained by analysis of a surface region on the first surface side by X-ray photoelectron spectroscopy and satisfying the relations represented by the following Expressions 2 to 4:

$$3.5 \leq F/\text{inorganic } Si \leq 10.0 \quad \text{(Expression 2)}$$

$$0.08 \leq \text{organic } Si/\text{inorganic } Si \leq 1.00 \quad \text{(Expression 3)}$$

$$5.0 \leq F/\text{organic } Si \leq 50.0 \quad \text{(Expression 4)}$$

wherein "F" represents a ratio of a fluorine element, "inorganic Si" represents a ratio of a silicon element attributed to an inorganic silicon compound, and "organic Si" represents a ratio of a silicon element attributed to an organic silicon compound.

In the surface region of the first surface of the optical film, the inorganic Si tends to worsen the fingerprints wiping off properties while it can reduce the refractive index of the first surface. In the surface region of the first surface of the optical film, it is likely that favorable fingerprints wiping off properties are obtained if predetermined or larger amounts of organic Si and F are contained to those of the inorganic Si. Furthermore, in the surface region of the first surface of the optical film, it is likely that favorable fingerprints wiping off properties are obtained if the organic Si and F are contained in a good balance. Thus, by controlling the ratio F/inorganic Si to 3.5 or more, the ratio organic Si/inorganic Si to 0.08 or more, and the ratio F/organic Si to 5.0 or more and 50.0 or less, control of the drop contact angle to 30.0 degrees or more can be facilitated, and favorable fingerprints wiping off properties can be readily obtained.

By controlling the ratio F/inorganic Si to 10.0 or less and the ratio organic Si/inorganic Si to 1.00 or less, a reduction in applicability of the anti-reflection layer can be readily suppressed.

Preferred ranges of the ratios F/inorganic Si, organic Si/inorganic Si, and F/organic Si are as described in the embodiment above.

The range of the proportion of the inorganic Si relative to the total elements in the surface region of the first surface of the optical film as an embodiment is as described above.

<Laminate Configuration>

The optical film according to the second embodiment of the present disclosure comprises an anti-reflection layer and an anti-glare layer in this order from the first surface to the second surface. The outermost surface of the first surface side of the optical film according to the second embodiment is preferably an anti-reflection layer.

As described above, the optical film according to the present disclosure may comprise a layer other than the anti-reflection layer and the anti-glare layer. The layer other than the anti-reflection layer and the anti-glare layer as an embodiment is as described above.

<<Substrate>>

The optical film according to the second embodiment preferably comprises a substrate because of ease in production and handling properties.

The material for the substrate, the configuration of the substrate, the thickness of the substrate, the total light transmittance of the substrate, the haze of the substrate, and the surface treatment of the substrate as an embodiment are as described above.

<<Anti-Glare Layer>>

In the second embodiment, the anti-glare layer is a layer which plays a main role in contributing to anti-glare properties.

In the second embodiment, the anti-glare layer can be formed, for example, by (A) a method using an emboss roll, (B) an etching treatment, (C) molding using a mold, and (D) forming a coating by application. To readily obtain a stable surface profile, suitable is (C) molding using a mold. For productivity and handling of a variety of products, suitable is (D) forming a coating by application.

In the method (C), for example, the anti-glare layer can be formed by casting a resin into a mold, and removing the molded resin from the mold. The molded resin removed from the mold may be disposed on the substrate. The mold to be used is a mold having the inverted surface profile with respect to that of the anti-glare layer. Such a mold can be prepared, for example, by a method (c1-1) to (c1-2) or by a method (c2) below.

(c1-1) A profile where the Vvv or the like falls within a predetermined range is created by simulation. Further, the simulated profile is inverted.

(c1-2) The surface of a metal is carved by laser light or processed by photolithography to reflect the inverted profile, thereby obtaining a mold.

(c2) A mold having the inverted profile with respect to that of the anti-glare layer prepared by (D) is obtained by an electroforming method widely used.

When the anti-glare layer is formed by (D), examples of the method include methods (d1) and (d2) below. The method (d1) is preferred to the method (d2) because it can readily adjust the ranges of the surface profile such as the Vvv.

(d1) A method of applying a coating solution containing a binder resin and particles, followed by drying to form an anti-glare layer having depressions and projections based on the particles.

(d2) A method of applying a coating solution containing any resin and a resin less compatible with the resin to cause phase separation of the resins, thereby forming depressions and projections.

Thickness

The range of the thickness T of the anti-glare layer as an embodiment is as described above.

Components

As described above, preferably, the anti-glare layer mainly contains a resin component. Furthermore, the anti-glare layer may contain other components described above as needed.

As described above, the anti-glare layer preferably contains a binder resin and particles.

Examples of the particles include organic particles and inorganic particles. Preferred are inorganic particles. In other words, the anti-glare layer preferably contains a binder resin and inorganic particles. More preferably, the anti-glare layer contains a binder resin, inorganic particles, and organic particles.

Particles

In an embodiment, the materials for the inorganic particles and the organic particles and the shapes of the inorganic particles and the organic particles are as described above, unless otherwise specified.

Compared to spherical particles, amorphous inorganic particles tend to more readily increase the Vvv and reduce the Sal. However, a significantly wide particle diameter distribution of the amorphous inorganic particles is likely to excessively increase the Vvv, which makes it likely to reduce the fingerprints wiping off properties. In particular, aggregation of the amorphous inorganic particles is likely to further increase the Vvv, which makes it more likely to reduce the fingerprints wiping off properties. In contrast, a significantly narrow particle diameter distribution of the amorphous inorganic particles is likely to lead to reduced coating suitability. For this reason, the amorphous inorganic particles preferably have a volume-based cumulative distribution of the particle diameter within the range described later. However, use of inorganic particles alone is likely to readily cause aggregation. Accordingly, in the second embodiment, to control the Vvv within the range above and readily obtain favorable fingerprints wiping off properties, it is preferred that the amorphous particles having a particle diameter distribution controlled within the range described later be used in combination with the organic particles.

In the second embodiment, preferably, inorganic particles such as amorphous inorganic particles have a volume-based cumulative distribution d10 of the particle diameter, a volume-based cumulative distribution d50 of the particle diameter, and a volume-based cumulative distribution d90 of the particle diameter, these cumulative distributions satisfying the relations (1) and (2) below:

$$1.5 \leq d50/d10 \leq 4.0 \quad (1)$$

$$1.0 \leq d90/d50 \leq 3.0 \quad (2)$$

A value of d50/d10 of 1.5 or more indicates that the inorganic particles have a wide particle size distribution in a region where the particle diameter is the mean or smaller. By controlling the value of d50/d10 to 1.5 or more, fine depressions and projections are likely to be formed on the surface with depressions and projections, thus reducing the Sal. By controlling the value of d50/d10 to 4.0 or less, an increase in amount of inorganic particles buried in the anti-glare layer can be suppressed, enhancing the efficiency in addition of the inorganic particles.

A value of d90/d50 of 1.0 or more indicates that the inorganic particles has a wide particle size distribution in a region where the particle diameter is the mean or larger. By controlling the value of d90/d50 to 1.0 or more, the Vvv can be readily increased and the Sal can be readily increased. By controlling the value of d90/d50 to 3.0 or less, excessive increases in the Vvv and the Sal can be readily suppressed.

The lower limit of the value of d50/d10 is more preferably 1.8 or more, still more preferably 2.0 or more, and the upper limit is more preferably 3.5 or less, still more preferably 3.0 or less.

The lower limit of the value of d90/d50 is more preferably 1.3 or more, still more preferably 1.5 or more, and the upper limit is more preferably 2.5 or less, still more preferably 2.0 or less.

The d10, d50, and d90 of the inorganic particles such as amorphous inorganic particles can be measured by a laser diffraction method.

In the second embodiment, inorganic particles such as amorphous inorganic particles have a volume-based cumulative distribution d50 of the particle diameter in the range of preferably 2.5 µm or more and 5.5 µm or less, more preferably 3.0 µm or more and 5.0 µm or less, still more preferably 3.3 µm or more and 4.7 µm or less.

By controlling the d50 to 2.5 µm or more, an excessive increase in the number of inorganic particles can be suppressed, which can facilitate suppression in excessive reduction of the Sal. By controlling the d50 to 5.5 µm or less, an excessive decrease in the number of inorganic particles can be suppressed, which can facilitate suppression in excessive increase of the Sal. By suppressing an excessive decrease in the number of inorganic particles, voids can be readily formed between particles, which can facilitate an increase in Vvv.

In an embodiment, the range of the ratio of the thickness T of the anti-glare layer and the d50 of the inorganic particles such as amorphous inorganic particles (d50/T) is as described above.

In an embodiment, the range of the ratio of the thickness T of the anti-glare layer and the d90 of the inorganic particles such as amorphous inorganic particles (d90/T) is as described above.

In an embodiment, the range of the content of the inorganic particles such as amorphous inorganic particles is as described above.

In the second embodiment, the content of the organic particles is preferably 1 part by mass or more and 25 parts by mass or less, more preferably 3 parts by mass or more and 18 parts by mass or less, still more preferably 8 parts by mass or more and 14 parts by mass or less relative to 100 parts by mass of the binder resin.

By controlling the content of the organic particles to 1 part by mass or more, aggregation of the inorganic particles can be more readily suppressed. By controlling the content of the organic particles to 1 part by mass or more, an excessive decrease in the number of organic particles can be suppressed, which can facilitate formation of voids between particles. For this reason, the Vvv can be readily increased. A decrease in the number of particles tends to increase the Vmp.

Because the organic particles have a relatively uniform particle diameter distribution, an increase in content of the organic particles tends to reduce the Sal. For this reason, by controlling the content of the organic particles to 25 parts by mass or less, an excessive reduction in Sal can be suppressed, which can facilitate obtaining of favorable fingerprints wiping off properties.

In the second embodiment, the organic particles have an average particle size of preferably 1.0 µm or more and 5.0 µm or less, more preferably 1.2 µm or more and 3.0 µm or less, still more preferably 1.3 µm or more and 2.5 µm or less.

By controlling the average particle size of the organic particles to 1.0 µm or more, an excessive increase in the number of organic particles can be suppressed, and thus an excessive reduction in Sal can be readily suppressed. For this reason, by controlling the average particle size of the organic particles to 1.0 µm or more, favorable fingerprints wiping off properties can be readily obtained. By controlling the average particle size of the organic particles to 5.0 µm or less, an excessive decrease in the number of organic particles can be suppressed, which can facilitate formation of voids between particles. For this reason, the Vvv can be readily increased. A decrease in the number of particles tends to increase the Vmp.

In the second embodiment, the organic particles preferably have a narrow particle size distribution. Specifically, in the second embodiment, the proportion of organic particles having an average particle size in the range of ±0.5 µm is preferably 80% by volume or more, more preferably 85% by volume or more, still more preferably 90% or more in the total organic particles. By controlling the organic particles to have a narrow particle size distribution, the organic particles having a uniform particle size are densely disposed, which can facilitate a suppression in an excessive increase of the Vvv.

In an embodiment, the shape of the organic particles is as described above.

In the second embodiment, the ratio of the average particle size of the organic particles to the thickness of the anti-glare layer (average particle size of organic particles/thickness of anti-glare layer) is preferably 0.20 or more and 0.70 or less, more preferably 0.23 or more and 0.50 or less, still more preferably 0.25 or more and 0.35 or less. By controlling the ratio of the average particle size of the organic particles to the thickness of the anti-glare layer to the above-mentioned range, the Vvv and Sal can be readily controlled to fall within the ranges specified above.

Inorganic Fine Particles

As described above, the anti-glare layer may further contain inorganic fine particles in addition to the binder resin and the particles.

In an embodiment, the material for the inorganic fine particles and the average particle size thereof are as described above.

Binder Resin

As described above, to readily obtain favorable scratch resistance, the binder resin preferably contains a cured product of a curable resin composition, such as a cured product of a thermosetting resin composition or a cured product of an ionizing radiation curable-resin composition, and more preferably contains a cured product of an ionizing radiation curable-resin composition.

As described above, the binder resin may contain a thermoplastic resin in the range not inhibiting the effects of the present disclosure.

In an embodiment, the binder resin such as the cured product of the curable resin composition and a thermoplastic resin are as described above, unless otherwise specified.

In the second embodiment, when the binder resin contains a cured product of the ionizing radiation curable-resin composition, the ionizing radiation curable-resin composition preferably contains a polyfunctional (meth)acrylate monomer and a polyfunctional (meth)acrylate oligomer.

In the second embodiment, the mass ratio of the polyfunctional (meth)acrylate monomer to the polyfunctional (meth)acrylate oligomer is preferably 5:95 to 60:40, more preferably 20:80 to 60:40, still more preferably 40:60 to 60:40.

By using the polyfunctional (meth)acrylate monomer in a predetermined or higher proportion, favorable scratch resistance of the anti-glare layer can be readily obtained.

By using the polyfunctional (meth)acrylate oligomer in a predetermined or higher proportion, the viscosity of the coating solution for the anti-glare layer can be increased, readily suppressing sinking of the particles to a lower portion of the anti-glare layer and suppressing flowing down of the binder resin between projections based on the particles. For this reason, the Vvv can be readily controlled to a predetermined or greater value, and the Sal can be readily controlled to a predetermined or smaller value. In contrast, when the polyfunctional (meth)acrylate oligomer is used in an excessively high proportion, the strength of the anti-glare layer may be reduced in some cases. When the viscosity of the coating solution for the anti-glare layer is excessively high, the Vmp may be excessively increased or the Sal may be excessively reduced in some cases. For this reason, the ionizing radiation curable-resin composition preferably contains a predetermined amount of the polyfunctional (meth) acrylate oligomer and a predetermined amount of the polyfunctional (meth)acrylate monomer.

Solvent, Drying Conditions

As described above, to adjust the viscosity and enable dissolution or dispersion of the components, the anti-glare layer coating solution preferably contains a solvent.

In an embodiment, the type of the solvent and the blending amount thereof are as described above, unless otherwise specified.

In the second embodiment, the solvent in the anti-glare layer coating solution preferably contains a solvent having a high evaporation rate, as the main component. A high evaporation rate of the solvent can suppress sinking of the particles to the lower portion of the anti-glare layer, and further can facilitate a suppression in flowing down of the binder resin between projections based on the particles. For this reason, the Vvv can be readily controlled to a predetermined or greater value, and the Sal can be readily controlled to a predetermined or smaller value.

In the second embodiment, the drying conditions are preferably controlled when an anti-glare layer is formed from the anti-glare layer coating solution.

The drying conditions can be controlled by the drying temperature and the air rate inside the dryer. The drying temperature is preferably 30° C. or more and 120° C. or less, and the air rate for drying is preferably 0.2 m/s or more and 50 m/s or less. To control the surface profile of the anti-glare layer by drying, irradiation with the ionizing radiation is suitably performed after the drying of the coating solution.

As the drying conditions, drying is preferably performed in two stages at a temperature and an air rate in the ranges specified above. Preferably, the drying in the second stage is performed at a higher drying temperature and a higher air rate than those in the drying in the first stage. Slow drying in the first stage can facilitate reflection of shapes of the amorphous inorganic particles on the surface of the binder resin when the surfaces of the amorphous inorganic particles are covered with the binder resin. By setting the drying temperature and the air rate in the second stage higher than those in the drying in the first stage, aggregation of the organic particles can be readily suppressed, and thus, the organic particles can be densely disposed. Accordingly, by such two-stage drying, the Vvv can be readily controlled to a predetermined or greater value, and the Sal can be readily controlled to a predetermined or smaller value.

In the drying in the first stage, preferably, the drying temperature is 30° C. or more and less than 60° C., and the air rate for drying is 0.2 m/s or more and less than 7 m/s. In the drying in the second stage, preferably, the drying temperature is 60° C. or more and 120° C. or less, and the air rate for drying is 7 m/s or more and 50 m/s or less.

<<Anti-Reflection Layer>>

In the second embodiment, the anti-reflection layer is preferably located on the outermost surface of the first surface side.

In an embodiment, the structure of the anti-reflection layer, the method of forming layers constituting the anti-reflection layer such as the low-refractive index layer and the high-refractive index layer, and the materials for forming the low-refractive index layer and the high-refractive index layer are as described above, unless otherwise specified.

In an embodiment, the refractive index of the low-refractive index layer, the thickness of the low-refractive index layer, and the binder resin for the low-refractive index layer are as described above.

In the second embodiment, the binder resin for the low-refractive index layer may contain a thermoplastic resin. The binder resin, when containing a thermoplastic resin, can increase the viscosity of the coating solution for a low-refractive index layer, obstructing flowing down of the coating solution for a low-refractive index layer between projections of the anti-glare layer. For this reason, by the binder resin containing a thermoplastic resin, the Vvv can be readily controlled to a predetermined or greater value, and the Sal can be readily controlled to a predetermined or smaller value. Furthermore, because organic Si and fluorine can be left near the surface of the first surface, the elemental ratios represented by Expressions 2 to 4 can be readily satisfied. In contrast, when the viscosity of the coating solution for a low-refractive index layer is excessively increased, defects may be caused on the surface of the anti-glare layer during application of the coating solution for the anti-reflection layer in some cases.

For the above-mentioned action and coating strength, the content of the thermoplastic resin is preferably 0.1% by mass or more and 3.0% by mass or less, more preferably 0.2% by mass or more and 1.5% by mass or less, still more preferably 0.3% by mass or more and 0.7% by mass or less relative to the total amount of the binder resin.

In an embodiment, the type of the thermoplastic resin and the weight average molecular weight thereof are as described above.

In an embodiment, the low-refractive index particles such as hollow particles and solid particles are as described above, unless otherwise specified.

In an embodiment, the average primary particle diameters of the hollow particles and the solid particles and the contents of the hollow particles and the solid particles are as described above.

In the second embodiment, for the first surface to readily satisfy the elemental ratios represented by Expressions 2 to 4 above, the low-refractive index layer preferably contains a leveling agent containing organic Si and fluorine.

In an embodiment, the configuration of the leveling agent and the content of the leveling agent are as described above.

As described above, the high-refractive index layer is preferably disposed closer to the anti-glare layer than the low-refractive index layer is.

In an embodiment, the refractive index of the high-refractive index layer, the thickness of the high-refractive index layer, the binder resin of the high-refractive index layer, the high-refractive index particles, the average primary particle diameter of the high-refractive index particles, and the content of the high-refractive index particles are as described above.

When the anti-reflection layer such as the low-refractive index layer and the high-refractive index layer is formed by the wet process, preferably, the viscosity of the coating solution for the anti-reflection layer is increased. By increasing the viscosity of the coating solution for the anti-reflection layer, the coating solution for the anti-reflection layer is difficult to flow down between projections of the anti-glare layer. Thus, the surface profile of the anti-glare layer can be readily maintained even if the anti-reflection layer is formed on the anti-glare layer. For this reason, by appropriately increasing the viscosity of the coating solution for the anti-reflection layer, the Vvv can be readily controlled to a predetermined or greater value, and the Sal can be readily controlled to a predetermined or smaller value. Furthermore, because organic Si and fluorine can be left near the surface of the first surface, the elemental ratios represented by Expressions 2 to 4 can be readily satisfied. The viscosity of the coating solution for the anti-reflection layer can be increased, for example, by adding a thermoplastic resin as a binder resin, by increasing the proportion of the oligomer as the ionizing radiation curable-resin composition, or by selecting a solvent having high viscosity as the solvent.

In contrast, when the viscosity of the coating solution for the anti-reflection layer is excessively increased, defects may be caused on the surface of the anti-glare layer during application of the coating solution for the anti-reflection layer in some cases.

For this reason, the viscosity at 23° C. of the coating solution for the anti-reflection layer is preferably 0.1 mPa·s or more and 5.0 mPa·s or less.

Examples of solvents for the coating solution for the anti-reflection layer include the same solvents as those listed in the embodiment of solvents for the coating solution for the anti-glare layer.

When the anti-glare layer is formed from the anti-reflection layer coating solution, the drying conditions are preferably controlled.

The drying conditions can be controlled by the drying temperature and the air rate inside the dryer. Preferably, the drying temperature is 30° C. or more and 70° C. or less, and the air rate for drying is 10 m/s or more and 30 m/s or less. By setting the drying temperature at a low temperature, the viscosity of the coating solution for the anti-reflection layer can be readily increased. By increasing the air rate, the viscosity of the coating solution for the anti-reflection layer can be increased quickly. Accordingly, by drying the coating solution for the anti-reflection layer at a relatively low temperature and a high air rate, flowing down of the coating solution for the anti-reflection layer between projections of the anti-glare layer can be obstructed. In other words, by drying the coating solution for the anti-reflection layer at a relatively low temperature and a high air rate, the surface profile of the first surface such as the Vvv can be readily controlled to fall within the ranges above, and the relations represented by Expression 1 to 4 can be readily satisfied.

The irradiation with the ionizing radiation is suitably performed after the coating solution for the anti-reflection layer is dried.

Case of Multilayer Structure Such as Three—or Higher Layered Structure

In an embodiment, the laminate configuration of the anti-reflection layer having a three—or more layered structure and the thicknesses of each layers are as described above.

<Optical Properties>

The optical film according to the second embodiment preferably has a total luminous reflectance $R_{SCI}$ of 3.0% or less measured by the following method.

[Measurement of Total Luminous Reflectance ($R_{SCI}$)]

The method comprises: bonding a black plate to the second surface of the optical film with a transparent adhesive to prepare a sample; and measuring the total luminous reflectance ($R_{SCI}$) of the optical film side of the sample as a light incident surface.

By controlling $R_{SCI}$ to 3.0% or less, blackness of the black display unit can be readily enhanced under an environment where light with strong illuminance does not enter the first surface, and thus favorable contrast can be readily obtained. The $R_{SCI}$ of the optical film is more preferably 2.5% or less, still more preferably 2.0% or less. The lower limit of the $R_{SCI}$ of the optical film, although not particularly limited, is usually 0.1% or more.

Usually, when the $R_{SCI}$ is 3.0% or less, the difference between reflectance of portions having fingerprint components and that of portions without fingerprint components is likely to increase to significantly reduce the appearance of the optical film. However, because the optical film according to the present disclosure has favorable fingerprints wiping off properties with high drop contact angle, a reduction in appearance of the optical film can be readily suppressed even if the $R_{SCI}$ is 3.0% or less.

$R_{SCI}$ represents reflected light measured by radiating light from every direction to the surface of a sample using an integrating sphere, and closing a light trap corresponding to the regular reflection direction.

In an embodiment, the measurement apparatus for measuring the $R_{SCI}$ and the sample used in the measurement of the $R_{SCI}$ are as described above.

The total light transmittance of the optical film specified in JIS K7361-1:1997 is preferably within the range specified above. The haze of the optical film specified in JIS K7136: 2000 is preferably within the range specified above. The internal haze of the optical film is preferably within the range specified above.

For the transmissive image clarity of the optical film measured according to JIS K7374:2007, $C_{0.125}$, $C_{0.25}$, $C_{0.5}$, $C_{1.0}$, and $C_{2.0}$ are preferably within the ranges specified above. In the optical film, the total of $C_{0.125}$, $C_{0.5}$, $C_{1.0}$, and $C_{2.0}$ is preferably within the range specified above.

<Size, Shape, and the Like>

In an embodiment, the size of the optical film, the shape of the optical film, and the surface profile of the second surface of the optical film are as described above.

[Method of Producing Optical Film According to Second Embodiment]

The method of producing an optical film according to the second embodiment of the present disclosure is the above-mentioned method of producing an optical film according to the present disclosure, the method comprising a first step of forming an anti-glare layer on a substrate; and a second step of forming an anti-reflection layer on the anti-glare layer.

Examples of the method of forming the anti-glare layer on a substrate include (A) a method using an emboss roll, (B) an etching treatment, (C) molding using a mold, and (D) forming a coating by application, which are described above.

In the case of the method (A), for example, the anti-glare layer can be formed on the substrate by forming a resin layer on the substrate, followed by shaping from the resin layer side using an emboss roll.

In the case of the method (B), for example, the anti-glare layer can be formed on the substrate by forming a layer of a light curable resin on the substrate, followed by photo-etching.

In the case of the method (C), for example, the anti-glare layer can be formed on the substrate by casting a resin into a mold, extracting the molded resin from the mold, and placing the resin on the substrate.

In the case of the method (D), for example, the anti-glare layer can be formed on the substrate by forming a coating on the substrate by the above-mentioned method (d1) or (d2).

Examples of the method of forming the anti-reflection layer on the anti-glare layer include the above-mentioned wet and dry processes.

[Polarization Plate According to Second Embodiment]

The polarization plate according to the second embodiment of the present disclosure is a polarization plate comprising a polarizer, a first transparent protective plate disposed on one side of the polarizer, and a second transparent protective plate disposed on the other side of the polarizer, wherein at least one of the first transparent protective plate and the second transparent protective plate is the above-mentioned optical film according to the second embodiment of the present disclosure, and the second surface of the optical film is disposed facing the polarizer.

<Polarizer>

In an embodiment, the polarizer is as described above.

<Transparent Protective Plate>

A first transparent protective plate is disposed on one side of the polarizer, and a second transparent protective plate is disposed on the other side thereof. At least one of the first transparent protective plate and the second transparent protective plate is the above-mentioned optical film according to the second embodiment of the present disclosure.

In the polarization plate according to the present disclosure, one of the first transparent protective plate and the second transparent protective plate may be the optical film according to the second embodiment of the present disclosure, or both of the first transparent protective plate and the second transparent protective plate may be the optical film according to the second embodiment of the present disclosure.

A general-purpose plastic film or glass can be used as a transparent protective plate which is not the optical film according to the second embodiment of the present disclosure among the first transparent protective plate and the second transparent protective plate.

The polarizer is preferably bonded to the transparent protective plates with an adhesive. The adhesive to be used can be a general-purpose adhesive, and a PVA adhesive is preferred.

[Surface Plate for Image Display Device According to Second Embodiment]

The surface plate for an image display device according to second embodiment of the present disclosure is a surface plate for an image display device, comprising a protective film bonded onto a resin plate or a glass plate, wherein the protective film is the above-mentioned optical film according to the second embodiment of the present disclosure, and the second surface of the optical film is disposed facing the resin plate or the glass plate.

In an embodiment, the resin plate or the glass plate is as described above.

[Image Display Panel According to Second Embodiment]

The image display panel according to the second embodiment of the present disclosure is an image display panel comprising a display element, and an optical film disposed on a light-emitting surface side of the display element, wherein, as the optical film, the above-mentioned optical film according to the second embodiment of the present disclosure is included (see FIG. 5).

In the image display panel, the optical film according to the second embodiment of the present disclosure is preferably disposed such that the second surface thereof faces the display element side.

In the image display panel, the optical film according to the second embodiment of the present disclosure is preferably disposed on the outermost surface of the display element on the light-emitting surface side.

In an embodiment, the display element and the size of the image display panel are as described above. In an embodiment, the image display panel with a touch panel is as described above.

[Image Display Device According to Second Embodiment]

The image display device according to the second embodiment of the present disclosure comprises the image display panel according to the second embodiment of the present disclosure.

The image display device according to the second embodiment of the present disclosure is not particularly limited as long as it comprises the image display panel according to the second embodiment of the present disclosure. Preferably, the image display device according to the second embodiment of the present disclosure includes the image display panel according to the second embodiment of the present disclosure, a drive controller electrically connected to the image display panel, and a housing which accommodates these.

In an embodiment, the backlight and the size of the image display device are as described above.

[Method of Selecting Optical Film According to Second Embodiment]

In the method of selecting an optical film according to the second embodiment of the present disclosure, the optical film satisfying the selection conditions below is selected.

(Optical Film Selection Conditions)

The optical film has a first surface, and a second surface which is a surface opposite to the first surface, wherein the optical film comprises an anti-reflection layer and an anti-glare layer in this order from the first surface to the second surface, the first surface has a profile of depressions and projections, the first surface has a dale void volume Vvv of 0.005 ml/m$^2$ or more specified in ISO 25178-2:2012, and has a drop contact angle of 30.0 degrees or more measured by the following method:

<Measurement of Drop Contact Angle> dropping a droplet having a surface tension of 30 mN/m onto the first surface of the optical film from a height of 45 mm, where the droplet is dropped in a direction vertical to the first surface; and measuring a static contact angle by a θ/2 method after 10 seconds after the droplet has reached the first surface.

The image display panel according to the present disclosure is included.

The method of selecting an optical film according to the second embodiment of the present disclosure may have additional selection conditions. Examples of the additional selection conditions include those for the optical film according to the second embodiment as a suitable embodiment. Specifically, examples thereof include additional selection conditions A to D:

A: Vvv/Vvc is 0.10 or less;

B: the optical film comprises the anti-reflection layer, the anti-glare layer, and a substrate in this order from the first surface to the second surface;

C: the elemental ratios satisfy the relations represented by Expressions 2 to 4:

$$3.5 \le F/\text{inorganic } Si \le 10.0 \quad \text{(Expression 2)}$$

$$0.08 \le \text{organic } Si/\text{inorganic } Si \le 1.00 \quad \text{(Expression 3)}$$

$$5.0 \le F/\text{organic } Si \le 50.0 \quad \text{(Expression 4)}$$

D: the total luminous reflectance $R_{SCI}$ measured by the following method is 3.0% or less:

[Measurement of Total Luminous Reflectance ($R_{SCI}$)]

the method comprising: bonding a black plate to the second surface of the optical film with a transparent adhesive to prepare a sample; and measuring the total luminous reflectance ($R_{SCI}$) of the optical film side of the sample as a light incident surface.

The method of selecting an optical film according to the second embodiment of the present disclosure can efficiently select an optical film having high anti-glare properties and favorable fingerprints wiping off properties.

[Method of Evaluating Fingerprints Wiping Off Properties]

In the method of evaluating fingerprints wiping off properties according to the present disclosure, the value of the drop contact angle measured by the following measurement method is used as an evaluation index:

<Measurement of Drop Contact Angle> the measurement method comprising dropping a droplet having a surface tension of 30 mN/m onto a surface of a target object from a height of 45 mm, where the droplet is dropped in a direction vertical to the surface; and measuring a static contact angle by a θ/2 method after 10 seconds after the droplet has reached the surface.

The method of evaluating fingerprints wiping off properties according to the present disclosure can simply evaluate the fingerprints wiping off properties of the target object. Specifically, a smaller value of the drop contact angle can be evaluated as more favorable fingerprints wiping off properties.

The present disclosure comprises (1) to (34) below.

(1) An optical film having a first surface, and a second surface which is a surface opposite to the first surface, wherein the optical film comprises an anti-reflection layer and an anti-glare layer in this order from the first surface to the second surface, the first surface has a profile of depressions and projections, the first surface has an arithmetic mean height Sa of 0.05 µm or more specified in ISO 25178-2:2012, and the first surface satisfies the relation represented by the following Expression 1:

$$Sw \times Vmp \leq 2.00 \quad \text{(Expression 1)}$$

wherein "Sw" represents a tilt angle (degrees) of 30 µl pure water droplet flowing down on the first surface; and "Vmp" represents a value of a peak material volume (ml/m$^2$) of the first surface specified in ISO 25178-2:2012.

(2) The optical film according to (1), wherein the first surface has a Vmp of 0.005 ml/m$^2$ or more and 0.100 ml/m$^2$ or less.

(3) The optical film according to (1) or (2), wherein the first surface has a dale void volume Vvv of 0.005 ml/m$^2$ or more and 0.100 ml/m$^2$ or less, the dale void volume Vvv being specified in ISO 25178-2:2012 and being calculated where an areal material ratio that separates a core portion and a reduced dale is 80%.

(4) The optical film according to (3), wherein the first surface has a ratio of the Vvv to a Vvc (Vvv/Vvc) of 0.10 or less, the Vvc being a core void volume specified in ISO 25178-2:2012.

(5) The optical film according to any one of (1) to (4), wherein the first surface has a minimum autocorrelation length Sal of 4.0 µm or more and 12.0 µm or less specified in ISO 25178-2:2012.

(6) The optical film according to any one of (1) to (5), wherein the optical film comprises the anti-reflection layer, the anti-glare layer, and a substrate in this order from the first surface to the second surface.

(7) The optical film according to any one of (1) to (6), wherein the anti-glare layer contains a binder resin and particles.

(8) The optical film according to any one of (1) to (6), wherein the optical film has elemental ratios obtained by analysis of a surface region on the first surface side by X-ray photoelectron spectroscopy and satisfying the relations represented by the following Expressions 2 to 4:

$$3.5 \leq F/\text{inorganic } Si \leq 10.0 \quad \text{(Expression 2)}$$

$$0.08 \leq \text{organic} Si/\text{inorganic} Si \leq 1.00 \quad \text{(Expression 3)}$$

$$5.0 \leq F/\text{organic } Si \leq 50.0 \quad \text{(Expression 4)}$$

wherein "F" represents a ratio of a fluorine element, "inorganic Si" represents a ratio of a silicon element attributed to an inorganic silicon compound, and "organic Si" represents a ratio of a silicon element attributed to an organic silicon compound.

(9) The optical film according to (8), wherein a proportion of the inorganic Si relative to the total elements is 2 atomic percent or more and 20 atomic percent or less for the elemental ratios obtained by analysis by the X-ray photoelectron spectroscopy.

(10) The optical film according to any one of (1) to (9), wherein the optical film has a total luminous reflectance $R_{SCI}$ of 3.0% or less measured by the following method:

[Measurement of Total Luminous Reflectance ($R_{SCI}$)]

bonding a black plate to the second surface of the optical film with a transparent adhesive to prepare a sample; and measuring the total luminous reflectance ($R_{SCI}$) of the optical film side of the sample as a light incident surface.

(11) The optical film according to any one of (1) to (10), having a haze specified in JIS K7136:2000 of 20% or more and 75% or less.

(12) A polarization plate comprising a polarizer, a first transparent protective plate disposed on one side of the polarizer, and a second transparent protective plate disposed on the other side of the polarizer, wherein at least one of the first transparent protective plate and the second transparent protective plate is the optical film according to any one of (1) to (11), and the second surface of the optical film is disposed facing the polarizer.

(13) A surface plate for an image display device, comprising a protective film bonded onto a resin plate or a glass plate, wherein the protective film is the optical film according to any one of (1) to (11), and the second surface of the optical film is disposed facing the resin plate or the glass plate.

(14) An image display panel comprising a display element, and an optical film disposed on a light-emitting surface side of the display element, wherein, as the optical film, the optical film according to any one of (1) to (11) is included.

(15) An image display device comprising the image display panel according to (14).

(16) A method of producing the optical film according to any one of (1) to (11), the method comprising:

a first step of forming an anti-glare layer on a substrate; and a second step of forming an anti-reflection layer on the anti-glare layer.

(17) A method of selecting an optical film, the method comprising selecting an optical film satisfying the following selection conditions:

(Optical Film Selection Conditions)
wherein the optical film has a first surface, and a second surface which is a surface opposite to the first surface,
the optical film comprises an anti-reflection layer and an anti-glare layer in this order from the first surface to the second surface,
the first surface has a profile of depressions and projections,
the first surface has an arithmetic mean height Sa of 0.05 µm or more specified in ISO 25178-2:2012, and
the first surface satisfies the relation represented by the following Expression 1:

$$Sw \times Vmp \leq 2.00 \quad \text{(Expression 1)}$$

wherein "Sw" represents a tilt angle (degrees) of 30 µl pure water droplet flowing down on the first surface; and "Vmp" represents a value of a peak material volume (ml/m²) of the first surface specified in ISO 25178-2:2012.

(18) An optical film having a first surface, and a second surface which is a surface opposite to the first surface,
wherein the optical film comprises an anti-reflection layer and an anti-glare layer in this order from the first surface to the second surface,
the first surface has a profile of depressions and projections,
the first surface has a dale void volume Vvv of 0.005 ml/m² or more specified in ISO 25178-2:2012, and
has a drop contact angle of 30.0 degrees or more measured by the following method:
<Measurement of Drop Contact Angle>
dropping a droplet having a surface tension of 30 mN/m onto the first surface of the optical film from a height of 45 mm, where the droplet is dropped in a direction vertical to the first surface; and measuring a static contact angle by a θ/2 method after 10 seconds after the droplet has reached the first surface.

(19) The optical film according to (18), wherein the first surface has a ratio of the Vvv to a Vvc (Vvv/Vvc) of 0.10 or less, the Vvc being a core void volume specified in ISO 25178-2:2012.

(20) The optical film according to (18) or (19), wherein the first surface has a minimum autocorrelation length Sal of 4.0 µm or more and 12.0 µm or less specified in ISO 25178-2:2012.

(21) The optical film according to any one of (18) to (20), wherein the first surface has a peak extreme height Sxp of 0.15 µm or more and 2.00 µm or less, the peak extreme height being specified in ISO 25178-2:2012 and indicating a difference between a height at an areal material ratio of 2.5% and a height at an areal material ratio of 50%.

(22) The optical film according to any one of (18) to (21), wherein the optical film comprises the anti-reflection layer, the anti-glare layer, and a substrate in this order from the first surface to the second surface.

(23) The optical film according to any one of (18) to (22), wherein the anti-glare layer contains a binder resin and particles.

(24) The optical film according to any one of (18) to (23), wherein the optical film has elemental ratios obtained by analysis of a surface region on the first surface side by X-ray photoelectron spectroscopy and satisfying the relations represented by the following Expressions 2 to 4:

$$3.5 \leq F/\text{inorganic } Si \leq 10.0 \quad \text{(Expression 2)}$$

$$0.08 \leq \text{organic} Si/\text{inorganic} Si \leq 1.00 \quad \text{(Expression 3)}$$

$$5.0 \leq F/\text{organic } Si \leq 50.0 \quad \text{(Expression 4)}$$

wherein "F" represents a ratio of a fluorine element, "inorganic Si" represents a ratio of a silicon element attributed to an inorganic silicon compound, and "organic Si" represents a ratio of a silicon element attributed to an organic silicon compound.

(25) The optical film according to (24), wherein a proportion of the inorganic Si relative to the total elements is 2 atomic percent or more and 20 atomic percent or less for the elemental ratios obtained by analysis by the X-ray photoelectron spectroscopy.

(26) The optical film according to any one of (18) to (25), wherein the optical film has a total luminous reflectance $R_{SCI}$ of 3.0% or less measured by the following method:
[Measurement of Total Luminous Reflectance ($R_{SCI}$)]
bonding a black plate to the second surface of the optical film with a transparent adhesive to prepare a sample; and measuring the total luminous reflectance ($R_{SCI}$) of the optical film side of the sample as a light incident surface.

(27) The optical film according to any one of claim (18) to (26), having a haze specified in JIS K7136:2000 of 20% or more and 75% or less.

(28) A polarization plate comprising a polarizer, a first transparent protective plate disposed on one side of the polarizer, and a second transparent protective plate disposed on the other side of the polarizer,
wherein at least one of the first transparent protective plate and the second transparent protective plate is the optical film according to any one of (18) to (27), and the second surface of the optical film is disposed facing the polarizer.

(29) A surface plate for an image display device, comprising a protective film bonded onto a resin plate or a glass plate, wherein the protective film is the optical film according to any one of (18) to (27), and the second surface of the optical film is disposed facing the resin plate or the glass plate.

(30) An image display panel comprising a display element, and an optical film disposed on a light-emitting surface side of the display element, wherein, as the optical film, the optical film according to any one of (18) to (27) is included.

(31) An image display device comprising the image display panel according to (30).

(32) A method of producing the optical film according to (18), the method comprising:
a first step of forming an anti-glare layer on a substrate; and a second step of forming an anti-reflection layer on the anti-glare layer.

(33) A method of selecting an optical film, the method comprising selecting an optical film satisfying the following selection conditions:
(Optical Film Selection Conditions)
wherein the optical film has a first surface, and a second surface which is a surface opposite to the first surface,
the optical film comprises an anti-reflection layer and an anti-glare layer in this order from the first surface to the second surface,
the first surface has a profile of depressions and projections,
the first surface has a dale void volume Vvv of 0.005 ml/m² or more specified in ISO 25178-2:2012, and
has a drop contact angle of 30.0 degrees or more measured by the following method:
<Measurement of Drop Contact Angle>
dropping a droplet having a surface tension of 30 mN/m onto the first surface of the optical film from a height of 45 mm, where the droplet is dropped in a direction vertical to the first surface; and measuring a static contact angle by a θ/2 method after 10 seconds after the droplet has reached the first surface.

(34) A method of evaluating fingerprints wiping off properties, wherein a value of a drop contact angle measured by a measurement method below is used as an index for evaluation:
<Measurement of Drop Contact Angle>
the measurement method comprising dropping a droplet having a surface tension of 30 mN/m onto a surface of a target object from a height of 45 mm, where the droplet is dropped in a direction vertical to the surface; and measuring a static contact angle by a θ/2 method after 10 seconds after the droplet has reached the surface.

EXAMPLES

Next, the present disclosure will be described in more detail by way of Examples, but these examples should not be construed as limitations to the present disclosure. The terms "parts" and "%" are mass-based unless otherwise specified mass.

Examples and Comparative Examples According to First Embodiment

1. Measurements and evaluations

As described below, optical films in Examples and Comparative Examples were measured and evaluated. The atmosphere in the measurements and evaluations was set at a temperature of 23±5° C. and a relative humidity of 40% or more and 65% or less. Before each measurement and evaluation were started, the target samples were exposed to the atmosphere for 30 minutes or more and 60 minutes or less, followed by the measurement and the evaluation. The results are shown in Table 1 or 2.

1-1. Measurement of surface profile

Optical films in Examples and Comparative Examples were cut into a size of 10 cm×10 cm. The optical films were visually checked, and their cut portions were selected at random from portions without abnormalities such as dirt or scratches. The substrate side of each cut optical film was bonded to a glass plate (thickness: 2.0 mm) having a length of 10 cm× a width of 10 cm with an optical transparent adhesive sheet (trade name: PANACLEAN PD-S1, thickness: 25 μm) available from PANAC CO., LTD. to prepare a sample 1.

Using a confocal laser microscope (VK-X250 (controller) and VK-X260 (measurement section)), the sample 1 was set on the measurement stage to be fixed and tightly adhere to the stage, and thereafter the surface profile of the first surface of each sample was measured and analyzed on the measurement conditions 1, image processing conditions 1, and analysis conditions 1 below. Multi-file analysis application (version 1.3.1.120) was used as measurement and analysis software.

(Measurement Conditions 1)
Laser wavelength: 408 nm
Optical system for measurement: confocal optical system
Object lens: 150×
Zoom: 1×
Region for measurement: 93.95 μm×70.44 μm
The number of measurement points: 1024×768 points
Measurement conditions: surface profile of a transparent object/high precision/with double scan (Image Processing Conditions 1)
DCL/BCL: DCL=13000, BCL=65535, processing method: complement from surrounding pixels
Height cut level: strong (Analysis Conditions 1)
Region: the entire region
Filter type: Gaussian
S-filter: 0.25 μm
F-operation: plane tilt correction (region specified)
L-filter: none
End effect correction: ON
s during calculation of Sal: s=0.20
p, q during calculation of Sxp: p=2.5%, q=50.0%
Using the analysis software, "Sa", "Vmp", "Vvv", "Vvc", "Sal", and "Sxp" in each measured region were displayed, and were defined as measured values.

1-2. Contact Angles
<General Contact Angle>

Optical films in Examples and Comparative Examples each were cut into a 10 cm square. The substrate side of each cut optical film was bonded to a glass plate (a length of 10 cm×a width of 10 cm, thickness: 2.0 mm) with a transparent adhesive sheet to prepare a sample for measurement. The optical films were visually checked, and their cut portions were selected at random from portions of the optical films without abnormalities such as dirt or scratches. The optical film was bonded to the glass plate not to cause wrinkles in the optical film and not to cause air bubbles to invade between the optical film and the glass plate.

Using a contact angle meter (DM-300, Kyowa Interface Science Co, Ltd.), 1.0 μL of pure water was dropped onto the first surface of each sample, and the static contact angle after 10 seconds after the droplet had reached was measured by the θ/2 method. The pure water was dropped using a syringe having a needle portion coated with a fluorinated resin.

<Pure Water-Flowing Down Tilt Angle>

The samples were measured for the pure water-flowing down tilt angle Sw according to the procedures (1) to (3) described in DESCRIPTION. The measurement apparatus used was a contact angle meter (Product No. "DMo-701" of "DropMaster" series available from Kyowa Interface Science Co, Ltd. "SA-301" was used as an attachment).

1-3. Elemental Ratios

Test pieces for measurement were cut out from the optical films in Examples and Comparative Examples. Using an X-ray photoelectron spectroscope, X-ray photoelectron spectra of C1s orbital, O1s orbital, Si2p orbital, and F1s orbital of the surface region on the first surface side of each test piece for measurement were measured under the conditions shown below. The X-ray photoelectron spectra each were subjected to peak separation to determine the ratios of an F element and an Si element, and the like. From the X-ray photoelectron spectrum of the Si2p orbital, the proportions of an Si element (inorganic Si) attributed to an inorganic silicon compound and an Si element (organic Si) attributed to an organic silicon compound were determined.

<Measurement>
Apparatus: trade name "Kratos Nova" available from SHIMADZU Corporation
X-ray source: AlKα
X-ray output: 150 W
Emission current: 10 mA
Accelerating voltage: 15 kV
Region for measurement: 300×700 μm
Charge neutralization mechanism: ON
Pass energy (during measurement of a narrow spectrum): 40 eV 1-4. Total Luminous Reflectance ($R_{SCI}$)

Optical films in Examples and Comparative Examples were cut into a size of 10 cm×10 cm. The optical films were visually checked, and their cut portions were selected at random from portions without abnormalities such as dirt or scratches. The substrate side of each cut optical film was bonded to a black plate (available from Kuraray Co, Ltd., trade name: COMOGLAS DFA2CG 502K (black), thickness: 2 mm) having a length of 10 cm×a width of 10 cm with an optical transparent adhesive sheet (trade name: PANACLEAN PD-S1) available from PANAC CO., LTD. to prepare a sample 2.

Using an integrating sphere spectrophotometer (available from KONICA MINOLTA, INC., trade name: CM-2002), the total luminous reflectance ($R_{SCI}$) was measured from the first surface side of the sample 2. The light source of the integrating sphere spectrophotometer was D65, the light receiver was located in a position forming +8 degrees with the normal line of the sample, the aperture angle of the light receiver was 10 degrees, the light trap was located in a position forming −8 degrees with the normal line of the sample, and the view angle was 2 degrees.

1-5. Haze (Hz)

Optical films in Examples and Comparative Examples each were cut into a 10 cm square. The optical films were visually checked, and their cut portions were selected at random from portions without abnormalities such as dirt or scratches. Using a haze meter (HM-150, available from MURAKAMI COLOR RESEARCH LABORATORY), the samples were measured for haze specified in JIS K7136: 2000.

To stabilize the light source, the apparatus was on standby for 15 minutes or longer since the power supply switch was turned on. Calibration was performed without setting anything in the inlet opening. Subsequently, the sample to be measured was set in the inlet opening, and was measured. The light incident surface was the substrate side.

The optical films in Examples and Comparative Examples all had a total light transmittance of 90% or more.

1-6. Transmissive Image Clarity

Optical films in Examples and Comparative Examples each were cut into a 10 cm square. The optical films were visually checked, and their cut portions were selected at random from portions without abnormalities such as dirt or scratches. Using an image clarity meter (trade name: ICM-1T) available from Suga Test Instruments Co, Ltd., the samples were measured for transmissive image clarity according to JIS K7374:2007. Optical combs having five widths in total, i.e., 0.125 mm, 0.25 mm, 0.5 mm, 1.0 mm, and 2.0 mm were used. In the measurement, the light incident surface was the substrate side. The values of $C_{0.125}$, $C_{0.25}$, $C_{0.5}$, $C_{1.0}$, and $C_{2.0}$ and the total value of $C_{0.125}$, $C_{0.5}$, $C_{1.0}$, and $C_{2.0}$ are shown in Table 2.

1-7. Blackness

The samples 2 prepared in 1-4 were used as samples. The samples were observed in the same manner as in 1-4 except that the eye line of the observer was changed to around 160 cm from the floor.

Based on the evaluation points below, 20 subjects evaluated the samples. 20 subjects were constituted with age groups from 20's to 50's, each age group containing 5 subjects. The average point of the evaluations by the 20 subjects was calculated, and the sample was ranked according to the criteria below. A higher rank in the criteria indicates that the black display unit has more favorable blackness.

<Evaluation Points>
(1) It looks sufficiently black without any whiteness: 3 points
(2) It looks black but whiteness is slightly sensed: 2 points
(3) Whiteness is remarkably sensed: 1 point <Criteria for Evaluation>
A: The average is 2.5 or more.
B: The average is 2.0 or more and less than 2.5.
C: The average is 1.5 or more and less than 2.0.
D: The average is less than 1.5.

1-8. Anti-Glare Properties

Under an environment of a bright room, the samples 2 prepared in 1-4 were each placed on a horizontal stand at a height of 70 cm such that the surface with depressions and projections faced upward. At this time, the sample was arranged to be located substantially immediately under the illumination light. The sample was observed from the front (such that the observer did not block the illumination light), and reflection of the illumination light on the surface with depressions and projections was evaluated according to the criteria for evaluation below.

The illumination used was an Hf32 straight tube three-wavelength day white fluorescent lamp, and was located at a height of 2 m above from the horizontal stand in the vertical direction. The samples were evaluated in the region thereof where the illuminance on the surface with depressions and projections was within the range of 500 lux or more and 1000 lux or less. The eye line of the observer was set at around 120 cm from the floor. The observers were healthy people in 30's having a vision of 0.7 or higher.

<Criteria for Evaluation>
A: No outline of the illumination is observed, and its position is not sensed
B: The outline of the illumination is not observed, but its position is vaguely sensed
C: The outline and the position of the illumination are vaguely sensed
D: The outline of the illumination is observed less vaguely, and its position is clearly sensed 1-9. Fingerprints Wiping Off Properties A waste cloth was impregnated with 0.1 ml of artificial grime. The time for impregnation was 10 seconds. The waste cloth used was a trade name "Kimtowel wiper" available from NIPPON PAPER CRECIA Co., LTD.

The artificial grime impregnated into the waste cloth was transferred onto the surface of rubber under a load of 300 g/cm². The rubber was in a cylindrical shape having a diameter of 12 mm. The transfer time was 5 seconds. The artificial grime transferred onto the surface of the rubber was transferred onto the first surface of the sample 2 under a load of 300 g/cm². The transfer time was 5 seconds. Using a spectrocolorimeter (available from KONICA MINOLTA, INC., trade name: CM-600d), L', a', and b' values of total luminous reflection SCI in the portion to which the artificial grime was transferred were measured from the first surface side of the sample 2. The resulting L', a', and b' values were defined as L1, a1, and b1.

In the next step, the black plate side of the sample 2 to which the artificial grime was transferred was bonded to the stand of a color fastness rubbing tester (available from TESTER SANGYO CO,. LTD., trade name "AB-301"). A waste cloth was attached to the rubbing finger of the tester, and the artificial grime transferred onto the first surface of the sample 2 was wiped off under the following wiping conditions. The waste cloth used was a trade name "ASPURE PROPREA II" available from AS ONE Corporation. Using a spectrocolorimeter (available from KONICA MINOLTA, INC., trade name: CM-600d), L', a', and b* values of total luminous reflection SCI in the portion from which the artificial grime was wiped off were measured from the first surface side of the sample 2. The resulting L', a', and b' values were defined as L2, a2, and b2.

From the following expression, the color difference (ΔE) was calculated, and the sample was ranked based on the value of the color difference according to the following criteria. A higher rank in the criteria below indicates more favorable fingerprints wiping off properties.

$$\Delta E = \{(L1 - L2)^2 + (a1 - a2)^2 + (b1 - b2)^2\}^{1/2}$$

<Artificial Grime>

A liquid containing about 45% by mass of oleic acid, about 25% by mass of triolein, about 20% by mass of cholesterol oleate, about 4% of liquid paraffin, about 4% of squalene, and about 2% of cholesterol (artificial grime available from Isekyu Company (in accordance with the contaminated solution specified in JIS C9606:2007)).
<Wiping Conditions>
Moving rate: 100 mm/sec
Load: 150 g/cm$^2$
The number of times of wiping: one way one time
<Criteria for Evaluation>
A: A color difference of 2 or less
B: A color difference of more than 2 and 4 or less
C: A color difference of more than 4 and 7 or less
D: A color difference of more than 7

1-10. Evaluation with Total Rank

Based on the two evaluations of the anti-glare properties and the fingerprints wiping off properties, the samples were evaluated with the total rank according to the criteria below:
<Criteria for Evaluation>
A: The ranks in the two evaluations are all A.
B: Among the ranks of the two evaluations, one of them is A and the other is B.
C: The ranks in the two evaluations are all B.
D: Among the ranks of the two evaluations, at least one of them is C or D.

2. Preparation of Optical Film

Example 1-1

An anti-glare layer coating solution 1-1 described below was applied onto a substrate (triacetyl cellulose resin film having a thickness of 80 μm, FUJIFILM Corporation). In the next step, the applied coating solution was dried at 50° C. and an air rate of 2 m/s for 40 seconds, and was further dried at 70° C. and an air rate of 15 m/s for 45 seconds. The resulting coating was then irradiated with ultraviolet light under a nitrogen atmosphere having an oxygen concentration of 200 ppm or less with an accumulated light amount of 50 mJ/cm$^2$, thereby forming an anti-glare layer having a thickness of 5.5 μm.

A low-refractive index layer coating solution 1-1 described below was then applied onto the anti-glare layer. In the next step, the applied coating solution was dried at 40° C. and an air rate of 20 m/s for 15 seconds, and further was dried at 70° C. and an air rate of 15 m/s for 30 seconds. The resulting coating was then irradiated with ultraviolet light under a nitrogen atmosphere having an oxygen concentration of 200 ppm or less with an accumulated light amount of 150 mJ/cm$^2$, thereby forming a low-refractive index layer having a thickness of 0.10 μm. Thus, an optical film in Example 1-1 was prepared. The refractive index of the low-refractive index layer was 1.31.
<Anti-Glare Layer Coating Solution 1-1>
urethane acrylate A 50 parts
(Shin Nakamura Chemical Co, Ltd., trade name: U-1100H, molecular weight: 800, the number of functional groups: 6)
urethane acrylate B 10 parts
(Shin Nakamura Chemical Co, Ltd., trade name: U-15HA, molecular weight: 2,300, the number of functional groups: 15)
pentaerythritol triacrylate 40 parts
(TOAGOSEI CO., LTD., trade name: M-305)
silica particles 23 parts
(surface-treated amorphous silica, d10: 1.2 μm, d50: 3.8 μm, d90: 6.5 μm)
organic particles B 8 parts
(spherical polyacrylic-styrene copolymer, average particle size: 1.5 μm, refractive index: 1.595)
photopolymerization initiator 5.0 parts
(IGM Resins B.V., trade name: Omnirad 184)
photopolymerization initiator 1.0 part
(IGM Resins B.V., trade name: Omnirad 907)
silicone leveling agent 0.1 parts
(Momentive Performance Materials Inc., trade name: TSF4460)
solvent (toluene) 195 parts
solvent (cyclohexanone) 5 parts
solvent (methyl isobutyl ketone) 15 parts
<Low-Refractive Index Layer Coating Solution 1-1>
polyfunctional acrylate 100 parts
(available from TOAGOSEI CO., LTD., trade name "ARONIX M-400")
acrylic polymer 0.5 parts (weight average molecular weight: 40,000)
hollow silica particles 180 parts
(average primary particle diameter: 75 nm, particles surface-treated with a silane coupling agent having a methacryloyl group)
fluorinated silicone leveling agent having a reactive functional group 600 parts
(Shin-Etsu Chemical Co, Ltd., trade name "KY1203", solid content: 20%, solvent: methyl isobutyl ketone)
photopolymerization initiator 5.0 parts
(IGM Resins Company, trade name "Omnirad 127")
solvent (methyl isobutyl ketone) 11,000 parts
solvent (1-methoxy-2-propyl acetate) 1,300 parts Examples 1-2, 1-3, 1-5, and 1-6

Optical films in Examples 1-2, 1-3, 1-5, and 1-6 were prepared in the same manner as in Example 1-1 except that the anti-glare layer coating solution 1-1 was replaced by anti-glare layer coating solutions 1-2 to 1-5 described below.

Example 1-4

An optical film in Example 1-4 was prepared in the same manner as in Example 1-1 except that the anti-glare layer coating solution 1-1 was replaced by an anti-glare layer coating solution 1-2 described below and the low-refractive index layer coating solution 1-1 was replaced by a low-refractive index layer coating solution 1-2 described below.

Example 1-7

An optical film in Example 1-7 was prepared in the same manner as in Example 1-1 except that the anti-glare layer coating solution 1-1 was replaced by an anti-glare layer coating solution 1-6 described below and the thickness of the anti-glare layer was 4.8 μm.

Example 1-8

An optical film in Example 1-8 was prepared in the same manner as in Example 1-1 except that the anti-glare layer coating solution 1-1 was replaced by an anti-glare layer coating solution 1-2 described below and the low-refractive index layer coating solution 1-1 was replaced by a low-refractive index layer coating solution 1-3 described below. The refractive index of the low-refractive index layer was 1.36.

Comparative Example 1-1

An optical film in Comparative Example 1-1 was prepared in the same manner as in Example 1-1 except that the low-refractive index layer coating solution 1-1 was replaced by a low-refractive index layer coating solution 1-4 described below.

Comparative Examples 1-2 to 1-3

Optical films in Comparative Examples 1-2 to 1-3 were prepared in the same manner as in Comparative Example 1-1 except that the anti-glare layer coating solution 1-1 was replaced by anti-glare layer coating solutions 1-2 to 1-3 described below.

Comparative Example 1-4

An optical film in Comparative Example 1-4 was prepared in the same manner as in Example 1-1 except that the anti-glare layer coating solution 1-1 was replaced by an anti-glare layer coating solution 1-7 described below and the thickness of the anti-glare layer was 5.0 μm.

<Anti-Glare Layer Coating Solution 1-2>
  urethane acrylate A 50 parts
    (Shin Nakamura Chemical Co, Ltd., trade name: U-1100H, molecular weight: 800, the number of functional groups: 6)
  urethane acrylate B 10 parts
    (Shin Nakamura Chemical Co, Ltd., trade name: U-15HA, molecular weight: 2,300, the number of functional groups: 15)
  pentaerythritol triacrylate 40 parts
    (TOAGOSEI CO., LTD., trade name: M-305)
  silica particles 21 parts
    (surface-treated amorphous silica, d10: 1.2 μm, d50: 3.8 μm, d90: 6.5 μm)
  organic particles B 10 parts
    (spherical polyacrylic-styrene copolymer, average particle size: 1.5 μm, refractive index: 1.595)
  photopolymerization initiator 5.0 parts
    (IGM Resins B.V., trade name: Omnirad 184)
  photopolymerization initiator 1.0 part
    (IGM Resins B.V., trade name: Omnirad 907)
  silicone leveling agent 0.1 parts
    (Momentive Performance Materials Inc., trade name: TSF4460)
  solvent (toluene) 185 parts
  solvent (cyclohexanone) 15 parts
  solvent (methyl isobutyl ketone) 15 parts <Anti-Glare Layer Coating Solution 1-3>
  urethane acrylate A 50 parts
    (Shin Nakamura Chemical Co, Ltd., trade name: U-1100H, molecular weight: 800, the number of functional groups: 6)
  urethane acrylate B 10 parts
    (Shin Nakamura Chemical Co, Ltd., trade name: U-15HA, molecular weight: 2,300, the number of functional groups: 15)
  pentaerythritol triacrylate 40 parts
    (TOAGOSEI CO., LTD., trade name: M-305)
  silica particles 19 parts
    (surface-treated amorphous silica, d10: 1.2 μm, d50: 3.8 μm, d90: 6.5 μm)
  organic particles A 3 parts
    (spherical polyacrylic-styrene copolymer, average particle size: 1.5 μm, refractive index: 1.515)
  organic particles B 5 parts
    (spherical polyacrylic-styrene copolymer, average particle size: 1.5 μm, refractive index: 1.595)
  photopolymerization initiator 5.0 parts
    (IGM Resins B.V., trade name: Omnirad 184)
  photopolymerization initiator 1.0 part
    (IGM Resins B.V., trade name: Omnirad 907)
  silicone leveling agent 0.1 parts
    (Momentive Performance Materials Inc., trade name: TSF4460)
  solvent (toluene) 165 parts
  solvent (cyclohexanone) 20 parts
  solvent (methyl isobutyl ketone) 30 parts <Anti-Glare Layer Coating Solution 1-4>
  urethane acrylate A 50 parts
    (Shin Nakamura Chemical Co, Ltd., trade name: U-1100H, molecular weight: 800, the number of functional groups: 6)
  urethane acrylate B 10 parts
    (Shin Nakamura Chemical Co, Ltd., trade name: U-15HA, molecular weight: 2,300, the number of functional groups: 15)
  pentaerythritol triacrylate 40 parts
    (TOAGOSEI CO., LTD., trade name: M-305)
  silica particles 20 parts
    (surface-treated amorphous silica, d10: 1.2 μm, d50: 3.8 μm, d90: 6.5 μm)
  organic particles A 8 parts
    (spherical polyacrylic-styrene copolymer, average particle size: 1.5 μm, refractive index: 1.515)
  organic particles B 2 parts
    (spherical polyacrylic-styrene copolymer, average particle size: 1.5 μm, refractive index: 1.595)
  photopolymerization initiator 5.0 parts
    (IGM Resins B.V., trade name: Omnirad 184)
  photopolymerization initiator 1.0 part
    (IGM Resins B.V., trade name: Omnirad 907)
  silicone leveling agent 0.1 parts
    (Momentive Performance Materials Inc., trade name: TSF4460)
  solvent (toluene) 190 parts
  solvent (cyclohexanone) 10 parts
  solvent (methyl isobutyl ketone) 15 parts <Anti-Glare Layer Coating Solution 1-5>
  urethane acrylate A 50 parts
    (Shin Nakamura Chemical Co, Ltd., trade name: U-1100H, molecular weight: 800, the number of functional groups: 6)
  urethane acrylate B 10 parts
    (Shin Nakamura Chemical Co, Ltd., trade name: U-15HA, molecular weight: 2,300, the number of functional groups: 15)

pentaerythritol triacrylate 40 parts
  (TOAGOSEI CO., LTD., trade name: M-305)
silica particles 10 parts
  (surface-treated amorphous silica, d10: 1.0 μm, d50: 3.0 μm, d90: 4.8 μm)
organic particles A 5 parts
  (spherical polyacrylic-styrene copolymer, average particle size: 1.5 μm, refractive index: 1.515)
organic particles B 5 parts
  (spherical polyacrylic-styrene copolymer, average particle size: 1.5 μm, refractive index: 1.595)
photopolymerization initiator 5.0 parts
  (IGM Resins B.V., trade name: Omnirad 184)
photopolymerization initiator 1.0 part
  (IGM Resins B.V., trade name: Omnirad 907)
silicone leveling agent 0.1 parts
  (Momentive Performance Materials Inc., trade name: TSF4460)
solvent (toluene) 170 parts
solvent (cyclohexanone) 40 parts
solvent (methyl isobutyl ketone) 5 parts
<Anti-Glare Layer Coating Solution 1-6>
urethane acrylate C 50 parts
  (Mitsubishi Chemical Corporation, trade name: U-1700B, molecular weight: 2,000, the number of functional groups: 10)
pentaerythritol triacrylate 50 parts
  (TOAGOSEI CO., LTD., trade name: M-305)
organic particles C 11 parts
  (spherical polyacrylic-styrene copolymer, average particle size: 3.0 μm, refractive index: 1.595)
inorganic ultrafine particles 70 parts
  (silica having a reactive functional group introduced into the surface thereof, solvent: MIBK, solid content: 30%)
  (average primary particle diameter: 12 nm)
photopolymerization initiator 5.0 parts
  (IGM Resins B.V., trade name: Omnirad 184)
photopolymerization initiator 1.0 part
  (IGM Resins B.V., trade name: Omnirad 907)
silicone leveling agent 0.1 parts
  (Momentive Performance Materials Inc., trade name: TSF4460)
solvent (toluene) 170 parts
solvent (cyclohexanone) 25 parts
<Anti-Glare Layer Coating Solution 1-7>
urethane acrylate A 30 parts
  (Mitsubishi Chemical Corporation, trade name: U-1700B, molecular weight: 2,000, the number of functional groups: 10)
urethane acrylate B 10 parts
  (Shin Nakamura Chemical Co, Ltd., trade name: U-15HA, molecular weight: 2,300, the number of functional groups: 15)
pentaerythritol triacrylate 60 parts
  (TOAGOSEI CO., LTD., trade name: M-305)
silica particles 3 parts
  (surface-treated amorphous silica, d10: 1.0 μm, d50: 3.0 μm, d90: 4.8 μm)
organic particles B 0.5 parts
  (spherical polyacrylic-styrene copolymer, average particle size: 1.5 μm, refractive index: 1.595)
photopolymerization initiator 5.0 parts
  (IGM Resins B.V., trade name: Omnirad 184)
photopolymerization initiator 1.0 part
  (IGM Resins B.V., trade name: Omnirad 907)
silicone leveling agent 0.1 parts
  (Momentive Performance Materials Inc., trade name: TSF4460)
solvent (toluene) 180 parts
solvent (cyclohexanone) 5 parts
solvent (methyl isobutyl ketone) 25 parts
<Low-Refractive Index Layer Coating Solution 1-2>
polyfunctional acrylate 180 parts
  (available from TOAGOSEI CO., LTD., trade name "ARONIX M-400")
hollow silica particles 100 parts
  (average primary particle diameter: 75 nm, particles surface-treated with a silane coupling agent having a methacryloyl group)
fluorinated silicone leveling agent having a reactive functional group 600 parts
  (Shin-Etsu Chemical Co, Ltd., trade name "KY1203", solid content: 20%, solvent: methyl isobutyl ketone)
photopolymerization initiator 5 parts
  (IGM Resins Company, trade name "Omnirad 127")
solvent (methyl isobutyl ketone) 11,000 parts
solvent (1-methoxy-2-propyl acetate)
  (available from TOAGOSEI CO., LTD., trade name "ARONIX M-400")
hollow silica particles 100 parts
  (average primary particle diameter: 75 nm, particles surface-treated with a silane coupling agent having a methacryloyl group)
acrylic polymer 0.5 parts (weight average molecular weight: 40,000)
fluorinated silicone leveling agent having a reactive functional group 250 parts
  (Shin-Etsu Chemical Co, Ltd., trade name "KY1203", solid content: 20%, solvent: methyl isobutyl ketone)
photopolymerization initiator 5 parts
  (IGM Resins Company, trade name "Omnirad 127")
solvent (methyl isobutyl ketone) 11,000 parts
solvent (1-methoxy-2-propyl acetate) 1,300 parts
<Low-Refractive Index Layer Coating Solution 1-4>
polyfunctional acrylate 100 parts
  (available from TOAGOSEI CO., LTD., trade name "ARONIX M-400")
acrylic polymer 0.5 parts (weight average molecular weight: 40,000)
hollow silica particles 180 parts
  (average primary particle diameter: 75 nm, particles surface-treated with a silane coupling agent having a methacryloyl group)
fluorinated silicone leveling agent having a reactive functional group 150 parts
  (Shin-Etsu Chemical Co, Ltd., trade name "KY1203", solid content: 20%, solvent: methyl isobutyl ketone)
photopolymerization initiator 5.0 parts
  (IGM Resins Company, trade name "Omnirad 127")
solvent (methyl isobutyl ketone) 11,000 parts
solvent (1-methoxy-2-propyl acetate) 1,300 parts

TABLE 1

|  | General contact angle (degrees) | Pure water-flowing down tilt angle Sw (degrees) | Vmp (ml/m²) | Sw × Vmp | Sa (um) | Vvv (ml/m²) | Sal (um) | Vvc (ml/m²) |
|---|---|---|---|---|---|---|---|---|
| Example 1-1 | 112.3 | 20.3 | 0.044 | 0.893 | 0.39 | 0.04 | 7.12 | 0.714 |
| Example 1-2 | 110.5 | 18.8 | 0.034 | 0.639 | 0.41 | 0.033 | 8.27 | 0.647 |
| Example 1-3 | 111.1 | 22 | 0.045 | 0.990 | 0.38 | 0.047 | 11.21 | 0.675 |
| Example 1-4 | 115.7 | 43.1 | 0.031 | 1.336 | 0.039 | 0.035 | 9.11 | 0.683 |
| Example 1-5 | 111.6 | 62.1 | 0.024 | 1.490 | 0.44 | 0.042 | 7.62 | 0.494 |
| Example 1-6 | 112.6 | 23.8 | 0.010 | 0.238 | 0.16 | 0.01 | 9.69 | 0.133 |
| Example 1-7 | 111.5 | 24.4 | 0.007 | 0.171 | 0.07 | 0.007 | 11.43 | 0.134 |
| Example 1-8 | 111.1 | 40.1 | 0.033 | 1.323 | 0.38 | 0.032 | 9.84 | 0.691 |
| Comparative Example 1-1 | 111 | 74.7 | 0.040 | 2.988 | 0.38 | 0.046 | 6.69 | 0.739 |
| Comparative Example 1-2 | 112.3 | 68.6 | 0.033 | 2.264 | 0.42 | 0.033 | 8.02 | 0.684 |
| Comparative Example 1-3 | 111.5 | 71.2 | 0.040 | 2.848 | 0.35 | 0.04 | 12.38 | 0.646 |
| Comparative Example 1-4 | 111.1 | 41.3 | 0.002 | 0.083 | 0.04 | 0.002 | 17.97 | 0.031 |

|  | $R_{SCI}$ (%) | Elemental ratios (XPS) F/inorganic Si | Elemental ratios (XPS) Organic Si/inorganic Si | Elemental ratios (XPS) F/organic Si | Blackness | Anti-glare properties | Fingerprints wiping off properties | Total rank |
|---|---|---|---|---|---|---|---|---|
| Example 1-1 | 1.79 | 5.54 | 0.246 | 22.5 | A | A | A | A |
| Example 1-2 | 1.82 | 8.22 | 0.297 | 27.7 | A | A | A | A |
| Example 1-3 | 1.68 | 6.88 | 0.268 | 25.7 | A | A | A | A |
| Example 1-4 | 1.85 | 3.86 | 0.089 | 43.4 | A | A | B | B |
| Example 1-5 | 1.8 | 4.03 | 0.081 | 49.8 | A | A | B | B |
| Example 1-6 | 1.87 | 4.89 | 0.209 | 23.4 | A | B | A | B |
| Example 1-7 | 1.66 | 5.31 | 0.25 | 21.2 | A | B | A | B |
| Example 1-8 | 2.83 | 4.16 | 0.087 | 47.8 | B | A | A | A |
| Comparative Example 1-1 | 1.95 | 2.79 | 0.056 | 50.7 | A | A | D | D |
| Comparative Example 1-2 | 1.69 | 3.02 | 0.06 | 50.3 | A | A | C | D |
| Comparative Example 1-3 | 1.88 | 3.05 | 0.057 | 53.5 | A | A | D | D |
| Comparative Example 1-4 | 1.77 | 4.51 | 0.21 | 21.5 | A | D | A | D |

TABLE 2

|  | Anti-glare layer coating solution | Low-retractive index layer coating solution | Haze (%) | Transmissive image clarity (%) $C_{0.125}$ | $C_{0.25}$ | $C_{0.5}$ | $C_{1.0}$ | $C_{2.0}$ |
|---|---|---|---|---|---|---|---|---|
| Example 1-1 | 1-1 | 1-1 | 63 | 2.3 | 1.8 | 1.8 | 3.0 | 10.3 |
| Example 1-2 | 1-2 | 1-1 | 54 | 2.5 | 1.3 | 1.5 | 1.7 | 10.8 |
| Example 1-3 | 1-3 | 1-1 | 44 | 3.6 | 4.5 | 5.3 | 6.1 | 14.4 |
| Example 1-4 | 1-2 | 1-2 | 51 | 2.9 | 11.9 | 2.2 | 2.6 | 12.1 |
| Example 1-5 | 1-4 | 1-1 | 60 | 10.5 | 9.7 | 10.3 | 11.7 | 17.1 |
| Example 1-6 | 1-5 | 1-1 | 29 | 30.3 | 31.1 | 32.2 | 33.0 | 43.7 |
| Example 1-7 | 1-6 | 1-1 | 44 | 12.0 | 11.2 | 10.7 | 11.6 | 31.8 |
| Example 1-8 | 1-2 | 1-3 | 51 | 2.1 | 1.4 | 1.5 | 2.0 | 9.8 |
| Comparative Example 1-1 | 1-1 | 1-4 | 65 | 2.2 | 1.3 | 1.5 | 2.6 | 13.2 |
| Comparative Example 1-2 | 1-2 | 1-4 | 50 | 2.1 | 1.1 | 1.4 | 1.8 | 9.9 |
| Comparative Example 1-3 | 1-3 | 1-4 | 43 | 3.0 | 3.2 | 3.3 | 4.0 | 12.0 |
| Comparative Example 1-4 | 1-7 | 1-1 | 3 | 61.7 | 61.2 | 65.0 | 72.1 | 78.5 |

From the results in Table 1, it is verified that the optical films in Examples according to the first embodiment had favorable anti-glare properties and favorable fingerprints wiping off properties.

Examples and Comparative Examples According to Second Embodiment

3. Measurements and Evaluations

As described below, optical films in Examples and Comparative Examples were measured and evaluated. The atmosphere in the measurements and evaluations was set at a temperature of 23±5° C. and a relative humidity of 40% or more and 65% or less. Before each measurement and evaluation were started, the target samples were exposed to the atmosphere for 30 minutes or more and 60 minutes or less, followed by the measurement and the evaluation. The results are shown in Table 3 or 4.

3-1. Measurement of Surface Profile

The surface profiles of the optical films in Examples and Comparative Examples were measured by the same method as that in 1-1 above.

3-2. Contact Angles

<General Contact Angle>

The optical films in Examples and Comparative Examples were measured for general contact angle by the same method as that in 1-2 above.

<Drop Contact Angle>

Droplets having a surface tension of 30 mN/m were placed into a syringe having a needle portion coated with a fluorinated resin. For the samples, a droplet having a surface tension of 30 mN/m was caused to spontaneously drop onto the first surface of each sample from a height of 45 mm. The amount of the droplet which dropped was 5.0 µl. The liquid used had the following composition. The droplet was caused to drop in the vertical direction to the first surface. The static contact angle after 10 seconds after the droplet had reached was measured by the θ/2 method. The measurement apparatus used was a contact angle meter (Product No.: DM-300, Kyowa Interface Science Co, Ltd.).

<Composition of Liquid>

A liquid containing 100% by mass of ethylene glycol monoethyl ether (FUJIFILM Wako Pure Chemical Corporation, Product No.: mixed solution for wetting tension test No. 30)

3-3. Elemental Ratios

The optical films in Examples and Comparative Examples were measured for elemental ratios in the surface region on the first surface side by the same method as that in 1-3 above.

3-4. Total Luminous Reflectance ($R_{SCI}$)

For the optical films in Examples and Comparative Examples, the total luminous reflectance ($R_{SCI}$) was measured by the same method as that in 1-4 above.

3-5. Haze (Hz)

The optical films in Examples and Comparative Examples were measured for haze by the same method as that in 1-5 above.

The optical films in Examples and Comparative Examples all had a total light transmittance of 90% or more.

3-6. Transmissive Image Clarity

The optical films in Examples and Comparative Examples were measured for transmissive image clarity by the same method as that in 1-6 above.

3-7. Blackness

The optical films in Examples and Comparative Examples were measured for blackness by the same method as that in 1-7 above.

3-8. Anti-Glare Properties

The optical films in Examples and Comparative Examples were measured for anti-glare properties by the same method as that in 1-8 above.

3-9. Fingerprints Wiping Off Properties

The optical films in Examples and Comparative Examples were measured for fingerprints wiping off properties by the same method as that in 1-9 above.

3-10. Evaluation with Total Rank

The optical films in Examples and Comparative Examples were evaluated based on the total rank according to the same criteria as those in 1-10 above.

4. Preparation of Optical Film

Example 2-1

An anti-glare layer coating solution 2-1 was applied onto a substrate (triacetyl cellulose resin film having a thickness of 80 µm, FUJIFILM Corporation). In the next step, the applied coating solution was dried at 50° C. and an air rate of 2 m/s for 40 seconds, and further was dried at 70° C. and an air rate of 15 m/s for 45 seconds. The resulting coating was then irradiated with ultraviolet light under a nitrogen atmosphere having an oxygen concentration of 200 ppm or less with an accumulated light amount of 50 mJ/cm², thereby forming an anti-glare layer having a thickness of 5.5 µm.

A low-refractive index layer coating solution 2-1 was the applied onto the anti-glare layer. In the next step, the applied coating solution was dried at 40° C. and an air rate of 20 m/s for 15 seconds, and further was dried at 70° C. and an air rate of 15 m/s for 30 seconds. The resulting coating was then irradiated with ultraviolet light under a nitrogen atmosphere having an oxygen concentration of 200 ppm or less with an accumulated light amount of 150 mJ/cm², thereby forming a low-refractive index layer having a thickness of 0.10 µm. Thus, an optical film in Example 2-1 was prepared. The refractive index of the low-refractive index layer was 1.31.

<Anti-Glare Layer Coating Solution 2-1>

| | |
|---|---|
| urethane acrylate A (Mitsubishi Chemical Corporation, trade name: U-1700B, molecular weight: 2,000, the number of functional groups: 10) | 30 parts |
| urethane acrylate B (Shin Nakamura Chemical Co., Ltd., trade name: U-15HA, molecular weight: 2,300, the number of functional groups: 15) | 10 parts |
| pentaerythritol triacrylate (TOAGOSEI CO., LTD., trade name: M-305) | 60 parts |
| silica particles (surface-treated amorphous silica, d10: 1.2 µm, d50: 3.7 µm, d90: 6.2 µm) | 23 parts |
| organic particles B (spherical polyacrylic-styrene copolymer, average particle size: 1.5 µm, refractive index: 1.595) | 8 parts |
| photopolymerization initiator (IGM Resins B.V., trade name: Omnirad 184) | 5.0 parts |
| photopolymerization initiator (IGM Resins B.V., trade name: Omnirad 907) | 1.0 part |
| silicone leveling agent (Momentive Performance Materials Inc., trade name: TSF4460) | 0.1 parts |

-continued

| | |
|---|---|
| solvent (toluene) | 190 parts |
| solvent (cyclohexanone) | 5 parts |
| solvent (methyl isobutyl ketone) | 20 parts |

<Low-Refractive Index Layer Coating Solution 2-1>

| | |
|---|---|
| polyfunctional acrylate (available from TOAGOSEI CO., LTD., trade name "ARONIX M-400") | 100 parts |
| acrylic polymer (weight average molecular weight: 40,000) | 0.5 parts |
| hollow silica particles (average primary particle diameter: 75 nm, particles surface-treated with a silane coupling agent having a methacryloyl group) | 180 parts |
| fluorinated silicone leveling agent having a reactive functional group (Shin-Etsu Chemical Co., Ltd., trade name "KY1203", solid content: 20%, solvent: methyl isobutyl ketone) | 600 parts |
| photopolymerization initiator (IGM Resins Company, trade name "Omnirad 127") | 5.0 parts |
| solvent (methyl isobutyl ketone) | 11,000 parts |
| solvent (1-methoxy-2-propyl acetate) | 1,300 parts |

Examples 2-2, 2-3, 2-5, and 2-6

Optical films in Examples 2-2, 2-3, 2-5, and 2-6 were prepared in the same manner as in Example 2-1 except that the anti-glare layer coating solution 2-1 was replaced by anti-glare layer coating solutions 2-2 to 2-5 described below.

Example 2-4

An optical film in Example 2-4 was prepared in the same manner as in Example 2-1 except that the anti-glare layer coating solution 2-1 was replaced by an anti-glare layer coating solution 2-2 below and the low-refractive index layer coating solution 2-1 was replaced by a low-refractive index layer coating solution 2-2 below.

Example 2-7

An optical film in Example 2-7 was prepared in the same manner as in Example 2-1 except that the anti-glare layer coating solution 2-1 was replaced by an anti-glare layer coating solution 2-6 below and the thickness of the anti-glare layer was 4.8 μm.

Example 2-8

An optical film in Example 2-8 was prepared in the same manner as in Example 2-1 except that the anti-glare layer coating solution 2-1 was replaced by an anti-glare layer coating solution 2-2 below and the low-refractive index layer coating solution 2-1 was replaced by a low-refractive index layer coating solution 2-3 below. The refractive index of the low-refractive index layer was 1.36.

Comparative Example 2-1

An optical film in Comparative Example 2-1 was prepared in the same manner as in Example 2-1 except that the low-refractive index layer coating solution 2-1 was replaced by a low-refractive index layer coating solution 2-4 below.

Comparative Examples 2-2 to 2-3

Optical films in Comparative Examples 2-2 to 2-3 were prepared in the same manner as in Comparative Example 2-1 except that the anti-glare layer coating solution 2-1 was replaced by anti-glare layer coating solutions 2-2 to 2-3.

Comparative Example 2-4

An optical film in Comparative Example 2-4 was prepared in the same manner as in Example 2-1 except that the anti-glare layer coating solution 2-1 was replaced by an anti-glare layer coating solution 2-7 below and the thickness of the anti-glare layer was 5.0 μm.

<Anti-Glare Layer Coating Solution 2-2>

| | |
|---|---|
| urethane acrylate A (Mitsubishi Chemical Corporation, trade name: U-1700B, molecular weight: 2,000, the number of functional groups: 10) | 30 parts |
| urethane acrylate B (Shin Nakamura Chemical Co., Ltd., trade name: U-15HA, molecular weight: 2,300, the number of functional groups: 15) | 10 parts |
| pentaerythritol triacrylate (TOAGOSEI CO., LTD., trade name: M-305) | 60 parts |
| silica particles (surface-treated amorphous silica, d10: 1.2 μm, d50: 3.7 μm, d90: 6.2 μm) | 21 parts |
| organic particles B (spherical polyacrylic-styrene copolymer, average particle size: 1.5 μm, refractive index: 1.595) | 10 parts |
| photopolymerization initiator (IGM Resins B.V., trade name: Omnirad 184) | 5.0 parts |
| photopolymerization initiator (IGM Resins B.V., trade name: Omnirad 907) | 1.0 part |
| silicone leveling agent (Momentive Performance Materials Inc., trade name: TSF4460) | 0.1 parts |
| solvent (toluene) | 180 parts |
| solvent (cyclohexanone) | 15 parts |
| solvent (methyl isobutyl ketone) | 20 parts |

<Anti-Glare Layer Coating Solution 2-3>

| | |
|---|---|
| urethane acrylate A (Mitsubishi Chemical Corporation, trade name: U-1700B, molecular weight: 2,000, the number of functional groups: 10) | 30 parts |
| urethane acrylate B (Shin Nakamura Chemical Co., Ltd., trade name: U-15HA, molecular weight: 2,300, the number of functional groups: 15) | 10 parts |
| pentaerythritol triacrylate (TOAGOSEI CO., LTD., trade name: M-305) | 60 parts |
| silica particles (surface-treated amorphous silica, d10: 1.2 μm, d50: 3.7 μm, d90: 6.2 μm) | 19 parts |
| organic particles A (spherical polyacrylic-styrene copolymer, average particle size: 1.5 μm, refractive index: 1.515) | 3 parts |
| organic particles B (spherical polyacrylic-styrene copolymer, average particle size: 1.5 μm, refractive index: 1.595) | 5 parts |
| photopolymerization initiator (IGM Resins B.V., trade name: Omnirad 184) | 5.0 parts |
| photopolymerization initiator (IGM Resins B.V., trade name: Omnirad 907) | 1.0 part |
| silicone leveling agent (Momentive Performance Materials Inc., trade name: TSF4460) | 0.1 parts |

-continued

| | |
|---|---|
| solvent (toluene) | 175 parts |
| solvent (cyclohexanone) | 15 parts |
| solvent (methyl isobutyl ketone) | 25 parts |

<Anti-Glare Layer Coating Solution 2-4>

| | |
|---|---|
| urethane acrylate A (Mitsubishi Chemical Corporation, trade name: U-1700B, molecular weight: 2,000, the number of functional groups: 10) | 30 parts |
| urethane acrylate B (Shin Nakamura Chemical Co., Ltd., trade name: U-15HA, molecular weight: 2,300, the number of functional groups: 15) | 10 parts |
| pentaerythritol triacrylate (TOAGOSEI CO., LTD., trade name: M-305) | 60 parts |
| silica particles (surface-treated amorphous silica, d50: 3.5 μm) | 20 parts |
| organic particles A (spherical polyacrylic-styrene copolymer, average particle size: 1.5 μm, refractive index: 1.515) | 8 parts |
| organic particles B (spherical polyacrylic-styrene copolymer, average particle size: 1.5 μm, refractive index: 1.595) | 2 parts |
| photopolymerization initiator (IGM Resins B.V., trade name: Omnirad 184) | 5.0 parts |
| photopolymerization initiator (IGM Resins B.V., trade name: Omnirad 907) | 1.0 part |
| silicone leveling agent (Momentive Performance Materials Inc., trade name: TSF4460) | 0.1 parts |
| solvent (toluene) | 200 parts |
| solvent (cyclohexanone) | 5 parts |
| solvent (methyl isobutyl ketone) | 10 parts |

<Anti-Glare Layer Coating Solution 2-5>

| | |
|---|---|
| urethane acrylate A (Mitsubishi Chemical Corporation, trade name: U-1700B, molecular weight: 2,000, the number of functional groups: 10) | 30 parts |
| urethane acrylate B (Shin Nakamura Chemical Co., Ltd., trade name: U-15HA, molecular weight: 2,300, the number of functional groups: 15) | 10 parts |
| pentaerythritol triacrylate (TOAGOSEI CO., LTD., trade name: M-305) | 60 parts |
| silica particles (surface-treated amorphous silica, d10: 0.08, d50: 2.8 μm, d90: 4.5 μm) | 10 parts |
| organic particles A (spherical polyacrylic-styrene copolymer, average particle size: 1.5 μm, refractive index: 1.515) | 5 parts |
| organic particles B (spherical polyacrylic-styrene copolymer, average particle size: 1.5 μm, refractive index: 1.595) | 5 parts |
| photopolymerization initiator (IGM Resins B.V., trade name: Omnirad 184) | 5.0 parts |
| photopolymerization initiator (IGM Resins B.V., trade name: Omnirad 907) | 1.0 part |
| silicone leveling agent (Momentive Performance Materials Inc., trade name: TSF4460) | 0.1 parts |
| solvent (toluene) | 180 parts |
| solvent (cyclohexanone) | 30 parts |
| solvent (methyl isobutyl ketone) | 5 parts |

<Anti-Glare Layer Coating Solution 2-6>

| | |
|---|---|
| urethane acrylate C (Shin Nakamura Chemical Co., Ltd., trade name: U-1100H, molecular weight: 800, the number of functional groups: 6) | 60 parts |
| pentaerythritol triacrylate (TOAGOSEI CO., LTD., trade name: M-305) | 40 parts |
| organic particles C (spherical polyacrylic-styrene copolymer, average particle size: 3.0 μm, refractive index: 1.595) | 11 parts |
| inorganic ultrafine particles (silica having a reactive functional group introduced into the surface thereof, solvent: MIBK, solid content; 30%) (average primary particle diameter: 12 nm) | 70 parts |
| photopolymerization initiator (IGM Resins B.V., trade name: Omnirad 184) | 5.0 parts |
| photopolymerization initiator (IGM Resins B.V., trade name: Omnirad 907) | 1.0 part |
| silicone leveling agent (Momentive Performance Materials Inc., trade name: TSF4460) | 0.1 parts |
| solvent (toluene) | 180 parts |
| solvent (cyclohexanone) | 15 parts |

<Anti-Glare Layer Coating Solution 2-7>

| | |
|---|---|
| urethane acrylate A (Mitsubishi Chemical Corporation, trade name: U-1700B, molecular weight: 2,000, the number of functional groups: 10) | 30 parts |
| urethane acrylate B (Shin Nakamura Chemical Co., Ltd., trade name: U-15HA, molecular weight: 2,300, the number of functional groups: 15) | 10 parts |
| pentaerythritol triacrylate (TOAGOSEI CO., LTD., trade name: M-305) | 60 parts |
| silica particles (surface-treated amorphous silica, d10: 0.08, d50: 2.8 μm, d90: 4.5 μm) | 3 parts |
| organic particles B (spherical polyacrylic-styrene copolymer, average particle size: 1.5 μm, refractive index: 1.595) | 0.5 parts |
| photopolymerization initiator (IGM Resins B.V., trade name: Omnirad 184) | 5.0 parts |
| photopolymerization initiator (IGM Resins B.V., trade name: Omnirad 907) | 1.0 part |
| silicone leveling agent (Momentive Performance Materials Inc., trade name: TSF4460) | 0.1 parts |
| solvent (toluene) | 180 parts |
| solvent (cyclohexanone) | 5 parts |
| solvent (methyl isobutyl ketone) | 25 parts |

<Low-Refractive Index Layer Coating Solution 2-2>

| | |
|---|---|
| polyfunctional acrylate (available from TOAGOSEI CO., LTD., trade name "ARONIX M-400") | 180 parts |
| hollow silica particles (average primary particle diameter: 75 nm, particles surface-treated with a silane coupling agent having a methacryloyl group) | 100 parts |
| fluorinated silicone leveling agent having a reactive functional group (Shin-Etsu Chemical Co., Ltd., trade name "KY1203", solid content: 20%, solvent: methyl isobutyl ketone) | 600 parts |

-continued

| photopolymerization initiator (IGM Resins Company, trade name "Omnirad 127") | 5 parts |
| solvent (methyl isobutyl ketone) | 11,000 parts |
| solvent (1-methoxy-2-propyl acetate) | 1,300 parts |

<Low-Refractive Index Layer Coating Solution 2-3>

| polyfunctional acrylate (available from TOAGOSEI CO., LTD., trade name "ARONIX M-400") | 100 parts |
| acrylic polymer (weight average molecular weight: 40,000) | 0.5 parts |
| hollow silica particles (average primary particle diameter: 75 nm, particles surface-treated with a silane coupling agent having a methacryloyl group) | 100 parts |
| fluorinated silicone leveling agent having a reactive functional group (Shin-Etsu Chemical Co., Ltd., trade name "KY1203", solid content: 20%, solvent: methyl isobutyl ketone) | 250 parts |
| photopolymerization initiator (IGM Resins Company, trade name "Omnirad 127") | 5 parts |
| solvent (methyl isobutyl ketone) | 11,000 parts |
| solvent (1-methoxy-2-propyl acetate) | 1,300 parts |

<Low-Refractive Index Layer Coating Solution 2-4>

| polyfunctional acrylate (available from TOAGOSEI CO., LTD., trade name "ARONIX M-400") | 100 parts |
| acrylic polymer (weight average molecular weight: 40,000) | 0.5 parts |
| hollow silica particles (average primary particle diameter: 75 nm, particles surface-treated with a silane coupling agent having a methacryloyl group) | 180 parts |
| fluorinated silicone leveling agent having a reactive functional group (Shin-Etsu Chemical Co., Ltd., trade name "KY1203", solid content: 20%, solvent: methyl isobutyl ketone) | 150 parts |
| photopolymerization initiator (IGM Resins Company, trade name "Omnirad 127") | 5.0 parts |
| solvent (methyl isobutyl ketone) | 11,000 parts |
| solvent (1-methoxy-2-propyl acetate) | 1,300 parts |

TABLE 3

| | General contact angle (degrees) | Drop contact angle (degrees) | Vvv (ml/m$^2$) | Vvc (ml/m$^2$) | Vvv/Vvc | Vmp (ml/m$^2$) | Sxp (um) | Sal (um) |
|---|---|---|---|---|---|---|---|---|
| Example 2-1 | 112.3 | 49.8 | 0.041 | 0.707 | 0.058 | 0.044 | 1.390 | 6.86 |
| Example 2-2 | 110.5 | 55.0 | 0.032 | 0.640 | 0.050 | 0.032 | 1.220 | 8.12 |
| Example 2-3 | 111.1 | 51.2 | 0.042 | 0.600 | 0.070 | 0.037 | 1.180 | 11 |
| Example 2-4 | 116.2 | 34.2 | 0.030 | 0.610 | 0.049 | 0.029 | 1.190 | 9.26 |
| Example 2-5 | 111.6 | 42.5 | 0.043 | 0.467 | 0.092 | 0.044 | 0.700 | 4.6 |
| Example 2-6 | 112.6 | 50.3 | 0.009 | 0.132 | 0.068 | 0.019 | 0.240 | 10.5 |
| Example 2-7 | 111.5 | 51.6 | 0.007 | 0.123 | 0.057 | 0.006 | 0.210 | 11.1 |
| Example 2-8 | 111.1 | 35.6 | 0.031 | 0.620 | 0.050 | 0.030 | 1.250 | 8.91 |
| Comparative Example 2-1 | 111.0 | 17.1 | 0.042 | 0.656 | 0.064 | 0.046 | 1.370 | 6.76 |
| Comparative Example 2-2 | 112.3 | 21.9 | 0.030 | 0.612 | 0.049 | 0.033 | 1.250 | 8.31 |
| Comparative Example 2-3 | 111.5 | 15.5 | 0.038 | 0.585 | 0.065 | 0.035 | 1.160 | 10.8 |
| Comparative Example 2-4 | 111.1 | 46.2 | 0.002 | 0.031 | 0.064 | 0.003 | 0.110 | 15.6 |

| | | Elemental ratios (XPS) | | | | | | |
|---|---|---|---|---|---|---|---|---|
| | $R_{SCI}$ (%) | F/inorganic Si | Organic Si/inorganic Si | F/organic Si | Blackness | Anti-glare properties | Fingerprints wiping off properties | Total rank |
| Example 2-1 | 1.95 | 5.66 | 0.246 | 23 | A | A | A | A |
| Example 2-2 | 1.74 | 7.53 | 0.312 | 24.1 | A | A | A | A |
| Example 2-3 | 1.7 | 6.11 | 0.253 | 24.2 | A | A | A | A |
| Example 2-4 | 1.86 | 3.76 | 0.082 | 45.9 | A | A | B | B |
| Example 2-5 | 1.86 | 4.09 | 0.084 | 48.7 | A | A | B | B |
| Example 2-6 | 1.68 | 4.9 | 0.212 | 23.1 | A | B | A | B |
| Example 2-7 | 1.65 | 5.34 | 0.231 | 23.1 | A | B | A | B |
| Example 2-8 | 2.86 | 4.23 | 0.093 | 45.5 | B | A | A | A |
| Comparative Example 2-1 | 1.99 | 2.85 | 0.054 | 52.8 | A | A | D | D |
| Comparative Example 2-2 | 1.71 | 3.21 | 0.061 | 52.6 | A | A | C | D |
| Comparative Example 2-3 | 1.74 | 2.98 | 0.06 | 49.7 | A | A | D | D |
| Comparative Example 2-4 | 1.71 | 4.61 | 0.213 | 21.6 | A | D | B | D |

TABLE 4

|  | Anti-glare layer coating solution | Low-retractive index layer coating solution | Haze (%) | Transmissive image clarity (%) | | | | |
|---|---|---|---|---|---|---|---|---|
|  |  |  |  | $C_{0.125}$ | $C_{0.25}$ | $C_{0.5}$ | $C_{1.0}$ | $C_{2.0}$ |
| Example 2-1 | 2-1 | 2-1 | 61 | 2.5 | 1.9 | 1.9 | 3.2 | 11.2 |
| Example 2-2 | 2-2 | 2-1 | 52 | 2.5 | 1.3 | 1.5 | 1.7 | 10.9 |
| Example 2-3 | 2-3 | 2-1 | 41 | 3.3 | 4.1 | 4.9 | 5.6 | 13.2 |
| Example 2-4 | 2-2 | 2-2 | 49 | 2.7 | 1.6 | 1.8 | 1.9 | 11.7 |
| Example 2-5 | 2-4 | 2-1 | 70 | 11.1 | 10.3 | 10.9 | 12.4 | 18.2 |
| Example 2-6 | 2-5 | 2-1 | 25 | 28.6 | 29.3 | 30.3 | 31.1 | 41.2 |
| Example 2-7 | 2-6 | 2-1 | 42 | 12.4 | 11.6 | 11.1 | 12.0 | 32.9 |
| Example 2-8 | 2-2 | 2-3 | 50 | 2.3 | 1.5 | 1.6 | 2.1 | 10.5 |
| Comparative Example 2-1 | 2-1 | 2-4 | 60 | 2.2 | 1.3 | 1.5 | 2.6 | 13.2 |
| Comparative Example 2-2 | 2-2 | 2-4 | 51 | 2.3 | 1.2 | 1.5 | 2.0 | 10.9 |
| Comparative Example 2-3 | 2-3 | 2-4 | 41 | 3.1 | 3.3 | 3.5 | 4.2 | 12.5 |
| Comparative Example 2-4 | 2-7 | 2-1 | 3 | 69.0 | 68.5 | 72.7 | 80.6 | 87.8 |

From the results in Table 3, it is verified that the optical films in Examples according to the second embodiment had favorable anti-glare properties and favorable fingerprints wiping off properties.

REFERENCE SIGNS LIST

10: substrate
20: anti-glare layer
30: anti-reflection layer
100: optical film
110: display element
120: image display panel
200: horizontal plane
300: flat surface of the stand
400: droplet

The invention claimed is:

1. An optical film having a first surface, and a second surface which is a surface opposite to the first surface,
   wherein the optical film comprises an anti-reflection layer and an anti-glare layer in this order from the first surface to the second surface,
   the first surface has a profile of depressions and projections,
   the first surface has an arithmetic mean height Sa of 0.05 μm or more specified in ISO 25178-2:2012,
   the first surface has a minimum autocorrelation length Sal of 4.0 μm or more and 12.0 μm or less specified in ISO 25178-2:2012, and
   the first surface satisfies the relation represented by the following Expression 1:

$$Sw \times Vmp \leq 2.00 \quad \text{(Expression 1),}$$

wherein "Sw" represents a tilt angle (degrees) of 30 μl pure water droplet flowing down on the first surface; and "Vmp" represents a value of a peak material volume (ml/m²) of the first surface specified in ISO 25178-2:2012.

2. The optical film according to claim 1, wherein the first surface has a Vmp of 0.005 ml/m² or more and 0.100 ml/m² or less.

3. The optical film according to claim 1, wherein the first surface has a dale void volume Vvv of 0.005 ml/m² or more and 0.100 ml/m² or less, the dale void volume Vvv being specified in ISO 25178-2:2012 and being calculated where an areal material ratio that separates a core portion and a reduced dale is 80%.

4. The optical film according to claim 3, wherein the first surface has a ratio of the Vvv to a Vvc (Vvv/Vvc) of 0.10 or less, the Vvc being a core void volume specified in ISO 25178-2:2012.

5. The optical film according to claim 1, wherein the first surface has a minimum autocorrelation length Sal of 4.0 μm or more and 11.21 μm or less specified in ISO 25178-2:2012.

6. The optical film according to claim 1, wherein the optical film further comprises a substrate, and comprises the anti-reflection layer, the anti-glare layer, and the substrate in this order from the first surface to the second surface.

7. The optical film according to claim 1, wherein the anti-glare layer contains a binder resin and particles.

8. The optical film according to claim 1, wherein the optical film has elemental ratios obtained by analysis of a surface region on the first surface side by X-ray photoelectron spectroscopy and satisfying the relations represented by the following Expressions 2 to 4:

$$3.5 \leq F/\text{inorganic } Si \leq 10.0 \quad \text{(Expression 2),}$$

$$0.08 \leq \text{organic } Si/\text{inorganic } Si \leq 1.00 \quad \text{(Expression 3), and}$$

$$5.0 \leq F/\text{organic } Si \leq 50.0 \quad \text{(Expression 4),}$$

wherein "F" represents a content of a fluorine element in atomic percent, "inorganic Si" represents a content of a silicon element attributed to an inorganic silicon compound in atomic percent, and "organic Si" represents a content of a silicon element attributed to an organic silicon compound in atomic percent, and the surface region extends from a surface of the first surface side to a depth of 10 nm.

9. The optical film according to claim 8, wherein a proportion of the inorganic Si relative to the total elements is 2 atomic percent or more and 20 atomic percent or less for the elemental ratios obtained by analysis by the X-ray photoelectron spectroscopy.

10. The optical film according to claim 1, wherein the optical film has a total luminous reflectance $R_{SCI}$ of 3.0% or less measured by the following method:
   bonding a black plate to the second surface of the optical film with a transparent adhesive to prepare a sample; and measuring the total luminous reflectance ($R_{SCI}$) of the optical film side of the sample as a light incident surface.

11. The optical film according to claim 1, having a haze specified in JIS K7136: 2000 of 20% or more and 75% or less.

12. A polarization plate comprising a polarizer, a first transparent protective plate disposed on one side of the polarizer, and a second transparent protective plate disposed on the other side of the polarizer,
wherein at least one of the first transparent protective plate and the second transparent protective plate is the optical film according to claim 1, and the second surface of the optical film is disposed facing the polarizer.

13. A surface plate for an image display device, comprising a protective film bonded onto a resin plate or a glass plate, wherein the protective film is the optical film according to claim 1, and the second surface of the optical film is disposed facing the resin plate or the glass plate.

14. An image display panel comprising a display element, and an optical film disposed on a light-emitting surface side of the display element, wherein, as the optical film, the optical film according to claim 1 is included.

15. An image display device comprising the image display panel according to claim 14.

16. A method of producing the optical film according to claim 1, the method comprising:

a first step of forming an anti-glare layer on a substrate; and a second step of forming an anti-reflection layer on the anti-glare layer.

17. A method of selecting an optical film, the method comprising selecting an optical film satisfying the following selection conditions:
the optical film has a first surface, and a second surface which is a surface opposite to the first surface,
the optical film comprises an anti-reflection layer and an anti-glare layer in this order from the first surface to the second surface,
the first surface has a profile of depressions and projections,
the first surface has an arithmetic mean height Sa of 0.05 μm or more specified in ISO 25178-2:2012,
the first surface has a minimum autocorrelation length Sal of 4.0 μm or more and 12.0 μm or less specified in ISO 25178-2:2012, and
the first surface satisfies the relation represented by the following Expression 1:

$$Sw \times Vmp \leq 2.00 \quad \text{(Expression 1)},$$

wherein "Sw" represents a tilt angle (degrees) of 30 μl pure water droplet flowing down on the first surface; and "Vmp" represents a value of a peak material volume (ml/m$^2$) of the first surface specified in ISO 25178-2:2012.

* * * * *